(12) United States Patent
Komai et al.

(10) Patent No.: US 12,230,662 B2
(45) Date of Patent: Feb. 18, 2025

(54) BACKSIDE-ILLUMINATION SOLID-STATE IMAGE PICKUP APPARATUS, IMAGE PICKUP APPARATUS, AND ELECTRONIC EQUIPMENT INCLUDING EMBEDMENT MEMBERS

(71) Applicant: Sony Semiconductor Solutions Corporation, Kanagawa (JP)

(72) Inventors: Naoki Komai, Kanagawa (JP); Hirotaka Yoshioka, Kanagawa (JP); Satoru Wakiyama, Kanagawa (JP); Yuichi Yamamoto, Kanagawa (JP); Taizo Takachi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 586 days.

(21) Appl. No.: 17/413,023

(22) PCT Filed: Dec. 6, 2019

(86) PCT No.: PCT/JP2019/047762
§ 371 (c)(1),
(2) Date: Jun. 11, 2021

(87) PCT Pub. No.: WO2020/129686
PCT Pub. Date: Jun. 25, 2020

(65) Prior Publication Data
US 2022/0037382 A1 Feb. 3, 2022

(30) Foreign Application Priority Data

Dec. 20, 2018 (JP) ................................ 2018-238191

(51) Int. Cl.
*H01L 27/14* (2006.01)
*H01L 27/146* (2006.01)
(Continued)

(52) U.S. Cl.
CPC .... *H01L 27/1464* (2013.01); *H01L 27/14621* (2013.01); *H01L 27/14636* (2013.01);
(Continued)

(58) Field of Classification Search
CPC ........... H01L 27/1464; H01L 27/14621; H01L 27/14636; H01L 27/14689;
(Continued)

(56) References Cited

U.S. PATENT DOCUMENTS 11,152,416 B2 * 10/2021 Kim .................. H01L 27/14618
2007/0164418 A1 * 7/2007 Brunnbauer ........... H05K 1/181
438/106

(Continued)

FOREIGN PATENT DOCUMENTS

CN 104662662 A 5/2015
CN 107278328 A 10/2017
(Continued)

OTHER PUBLICATIONS

International Search Report issued in International Patent Application No. PCT/JP2019/047762 on Feb. 25, 2020 and English translation of same. 8 pages.

(Continued)

*Primary Examiner* — Ida M Soward
(74) *Attorney, Agent, or Firm* — K&L Gates LLP

(57) ABSTRACT

A backside-illumination solid-state image pickup apparatus and a backside-illumination solid-state image-pickup-apparatus manufacturing method, an image pickup apparatus, and electronic equipment that are configured to make it possible to reduce manufacturing costs. A diced memory circuit and logic circuit are laid out in a horizontal direction, are embedded and flattened by using an oxide film, and are stacked so as to be enclosed in a plane direction under a (Continued)

solid-state image pickup element. The present disclosure can be applied to an image pickup apparatus.

32 Claims, 64 Drawing Sheets

(51) Int. Cl.
*H01L 25/065* (2023.01)
*H01L 25/07* (2006.01)
*H01L 25/11* (2006.01)

(52) U.S. Cl.
CPC .... *H01L 27/14689* (2013.01); *H01L 25/0652* (2013.01); *H01L 25/071* (2013.01); *H01L 25/112* (2013.01)

(58) Field of Classification Search
CPC ......... H01L 27/14627; H01L 27/14634; H01L 27/14632; H01L 25/0652; H01L 25/071; H01L 25/112; H04N 25/71; H04N 25/79
See application file for complete search history.

(56) References Cited

U.S. PATENT DOCUMENTS

| | | | | |
|---|---|---|---|---|
| 2012/0267777 A1* | 10/2012 | Haba | ...................... | H01L 23/02 257/737 |
| 2015/0108661 A1* | 4/2015 | Vincent | ................... | H01L 24/25 257/777 |
| 2016/0379959 A1* | 12/2016 | We | ...................... | H01L 23/3114 257/773 |
| 2017/0033079 A1* | 2/2017 | Lin | ......................... | H01L 25/50 |
| 2017/0084576 A1* | 3/2017 | Yu | ............................ | H01L 21/56 |
| 2017/0092680 A1 | 3/2017 | Kwon | | |
| 2018/0122773 A1* | 5/2018 | Nagai | ................. | H01L 25/0652 |
| 2018/0301443 A1* | 10/2018 | Kim | ...................... | H01L 23/367 |

FOREIGN PATENT DOCUMENTS

| | | | | |
|---|---|---|---|---|
| CN | 111247638 A | | 6/2020 | |
| EP | 2571056 A2 * | | 3/2013 | ....... H01L 27/14605 |
| JP | H01-218042 A | | 8/1989 | |
| JP | 2007013089 A | | 1/2007 | |
| JP | 2012094720 A * | | 5/2012 | ....... H01L 21/76898 |
| JP | 2012178496 A * | | 9/2012 | ....... H01L 27/14618 |
| JP | 2014-099582 A | | 5/2014 | |
| JP | 2015106671 A | | 6/2015 | |
| JP | 2016-171297 A | | 9/2016 | |
| JP | 2017-195300 A | | 10/2017 | |
| JP | 2018-101699 A | | 6/2018 | |
| KR | 20170124538 A | | 11/2017 | |
| TW | 201633524 A | | 9/2016 | |
| WO | WO2006/129762 A1 | | 12/2006 | |
| WO | WO-2016143288 A1 * | | 9/2016 | ......... H01L 21/6835 |
| WO | WO-2017149983 A1 | | 9/2017 | |
| WO | WO-2017169480 A1 | | 10/2017 | |
| WO | WO-2018047635 A1 * | | 3/2018 | ............. H01L 23/12 |
| WO | WO-2018186192 A1 * | | 10/2018 | ............. H01L 21/02 |
| WO | WO2019/087764 A1 | | 5/2019 | |
| WO | WO-2020184478 A1 | | 9/2020 | |

OTHER PUBLICATIONS

Written Opinion issued in International Patent Application No. PCT/JP2019/047762 on Feb. 25, 2020. 5 pages.
Notice of Decision to Grant issued in related Korean Patent Application No. 10-2021-7015738 issued Oct. 8, 2024 and English translation of same. 8 pages.

* cited by examiner

FIG.18
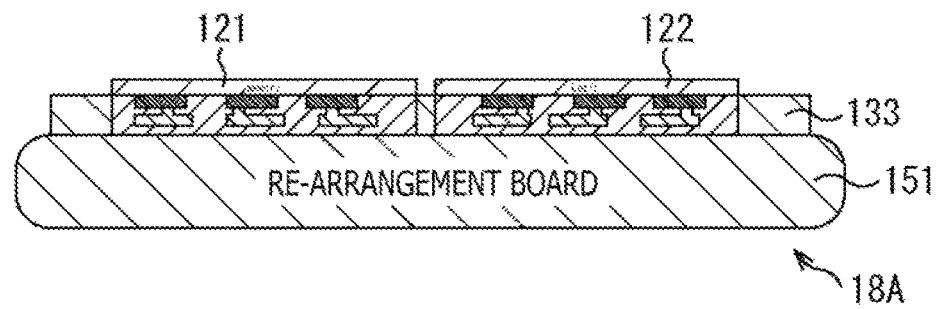
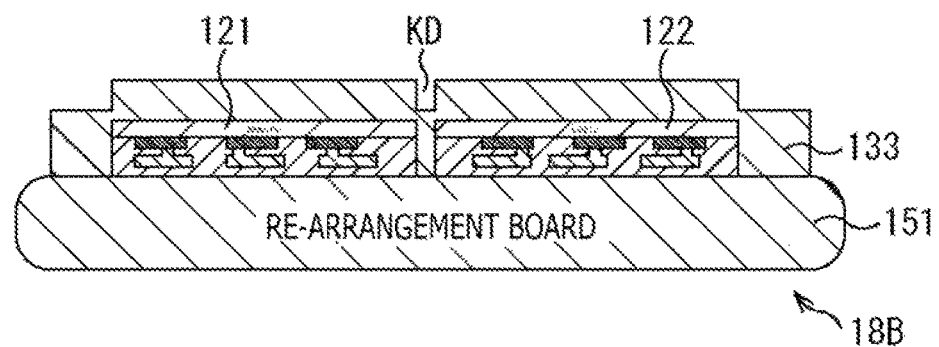
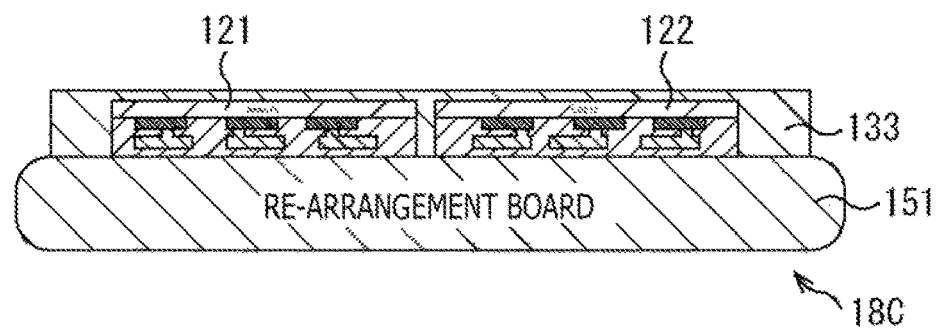

FIG.19
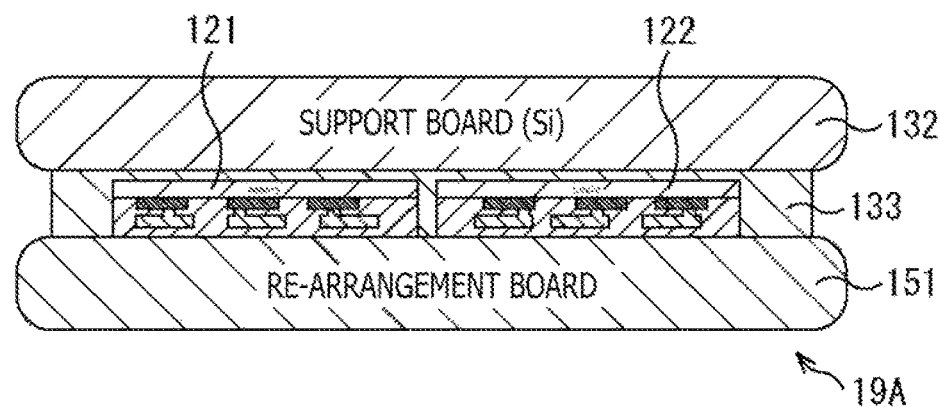
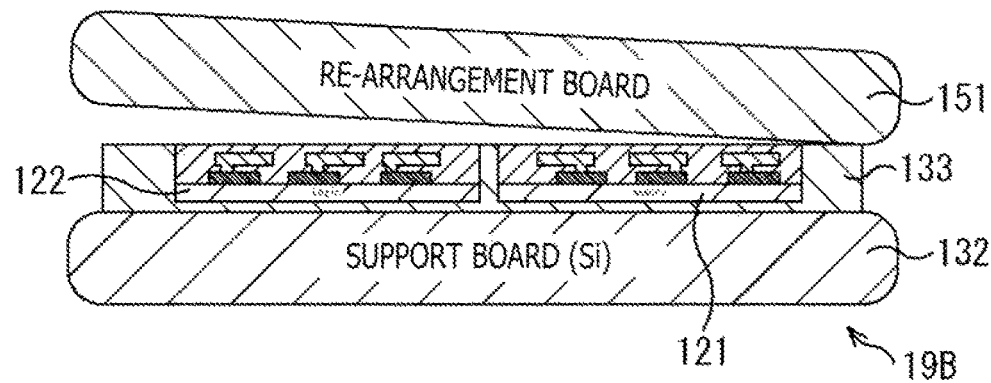

FIG.29
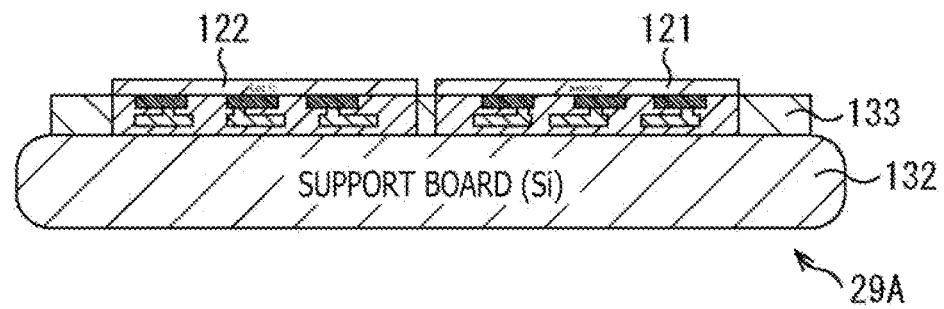
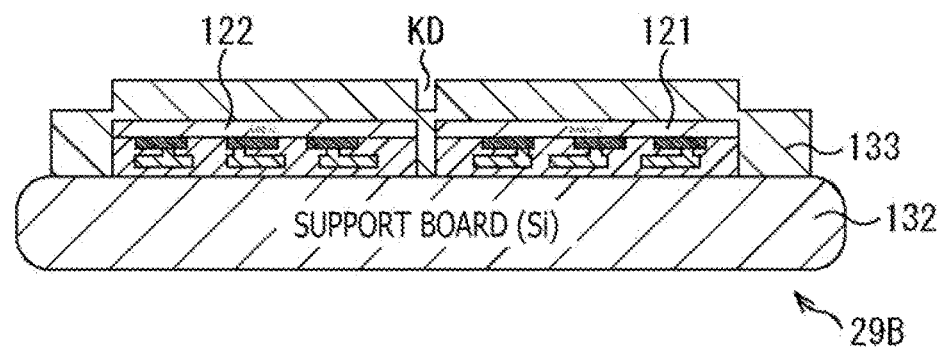
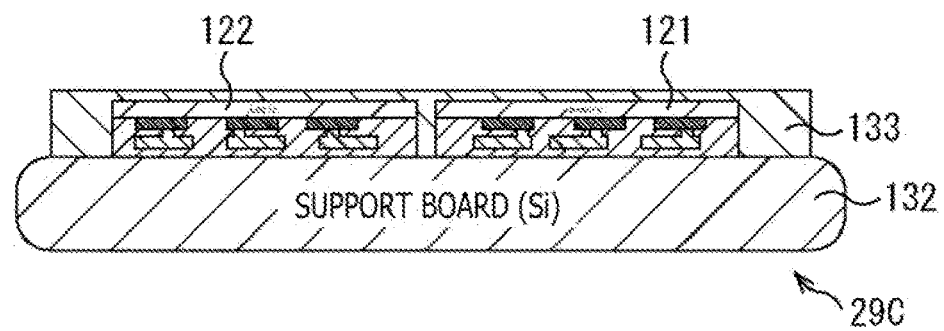

FIG.41
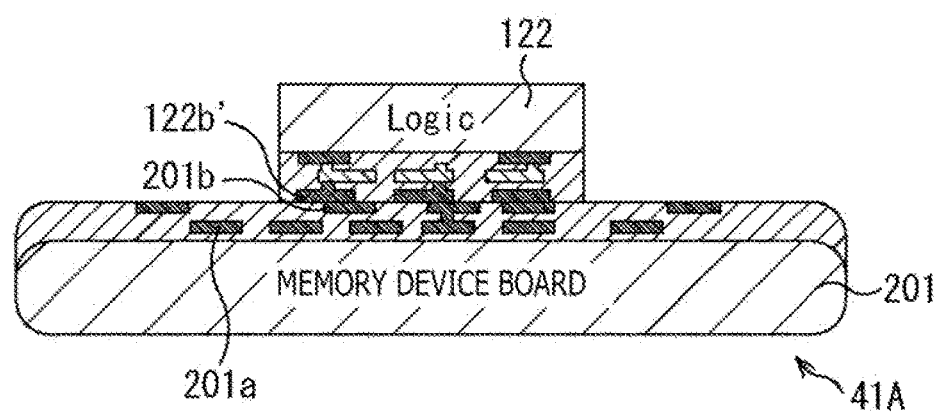
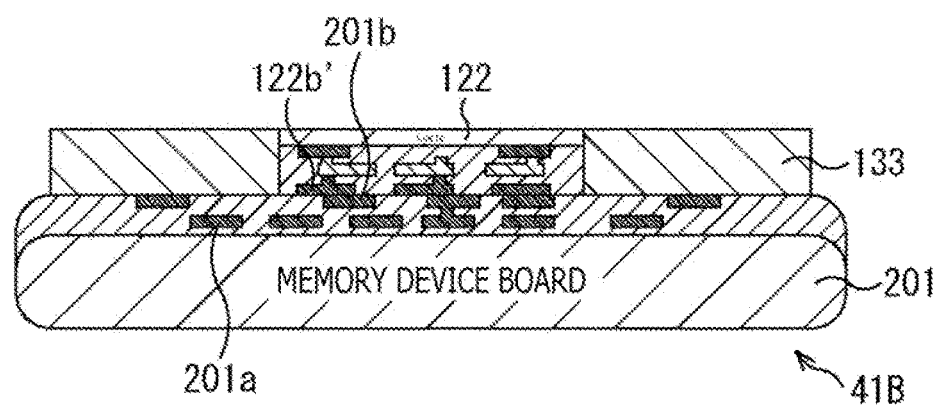

FIG.42
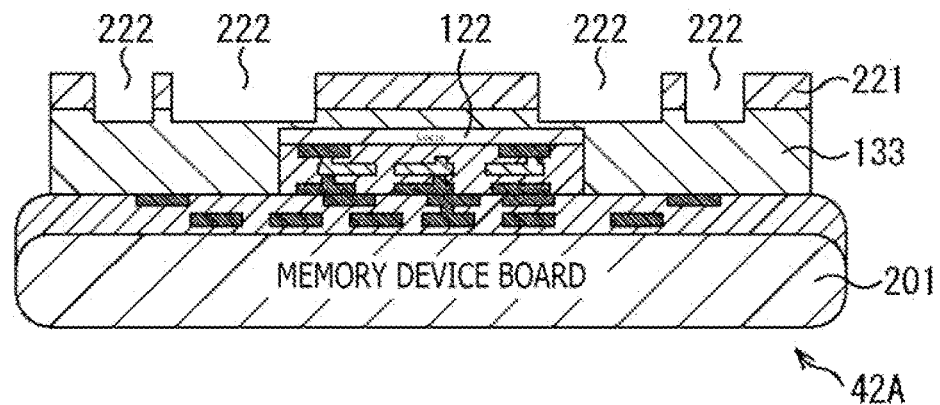
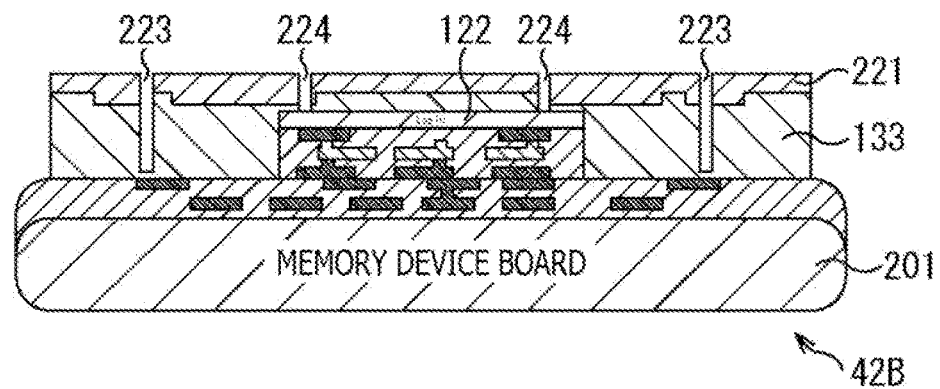
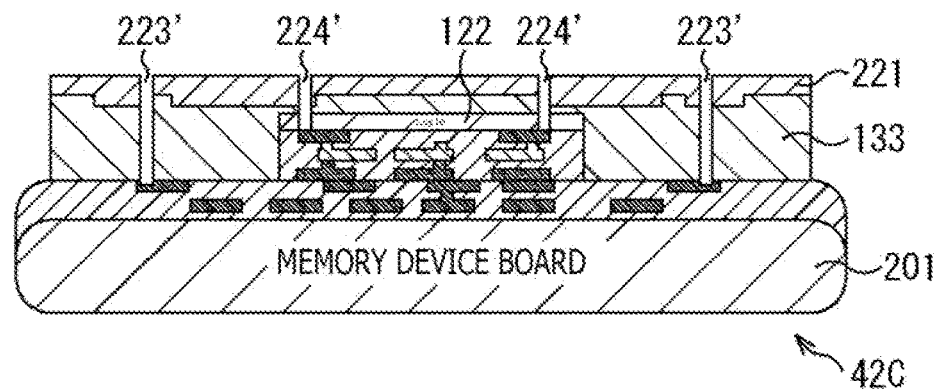

FIG.44
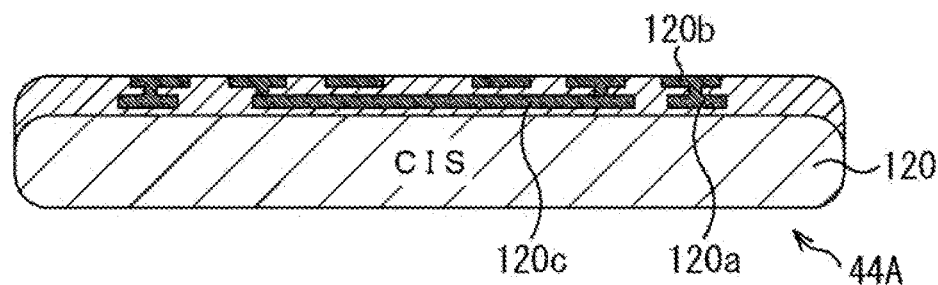
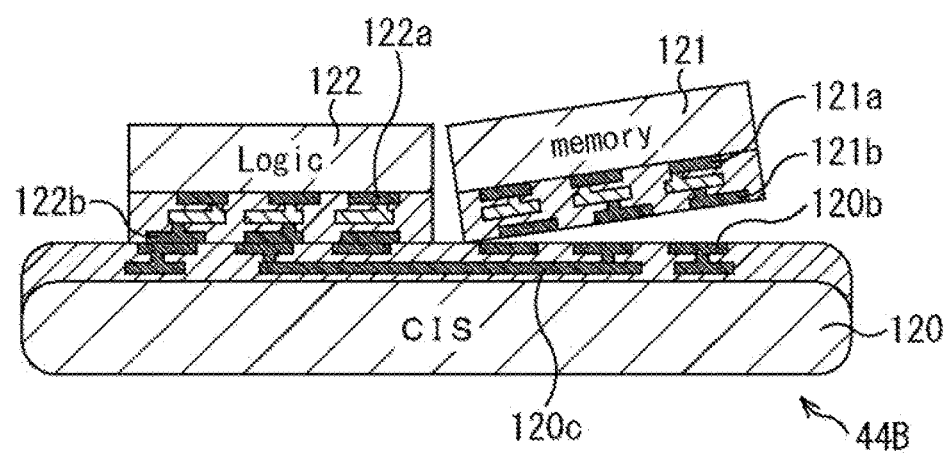
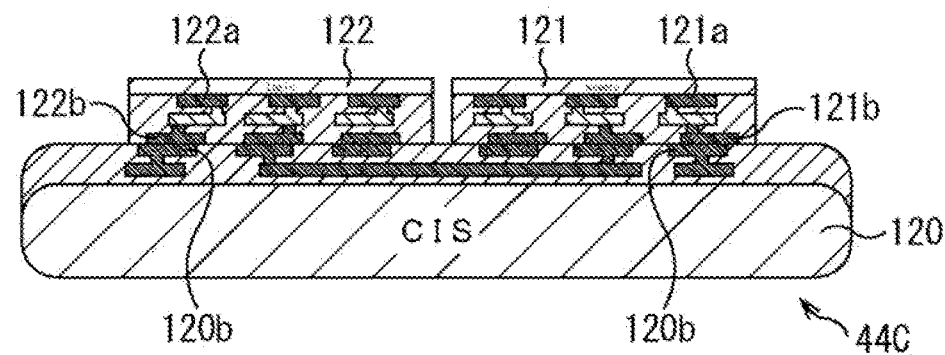

FIG. 46
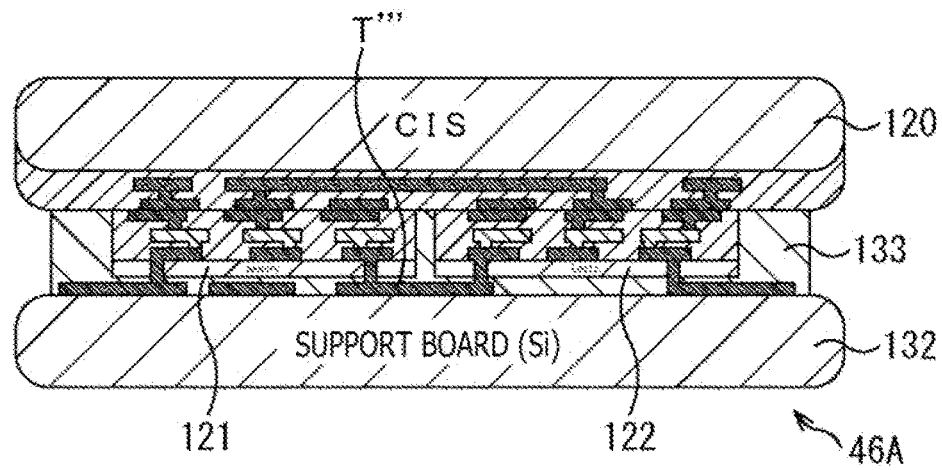
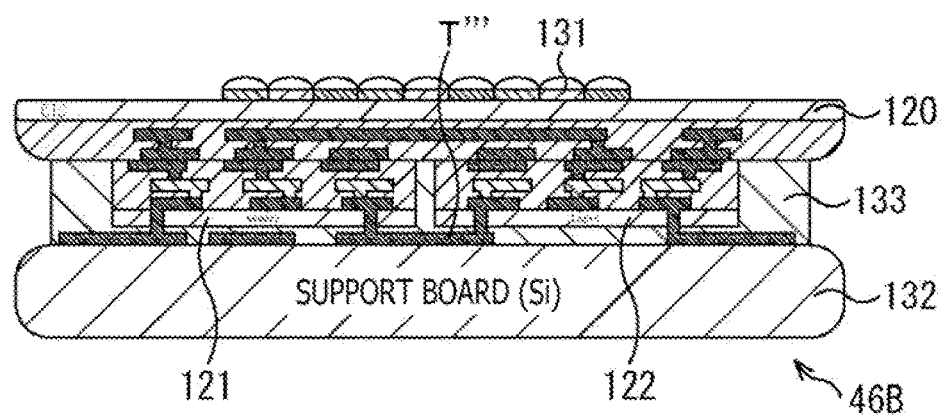
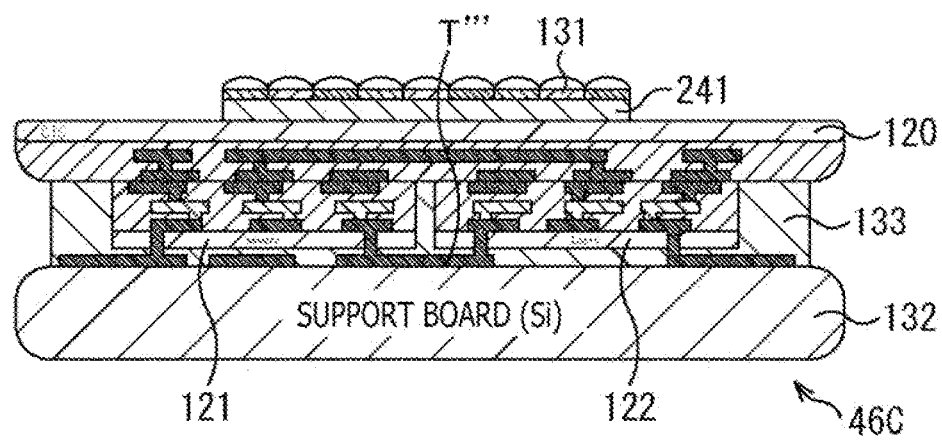

FIG.56
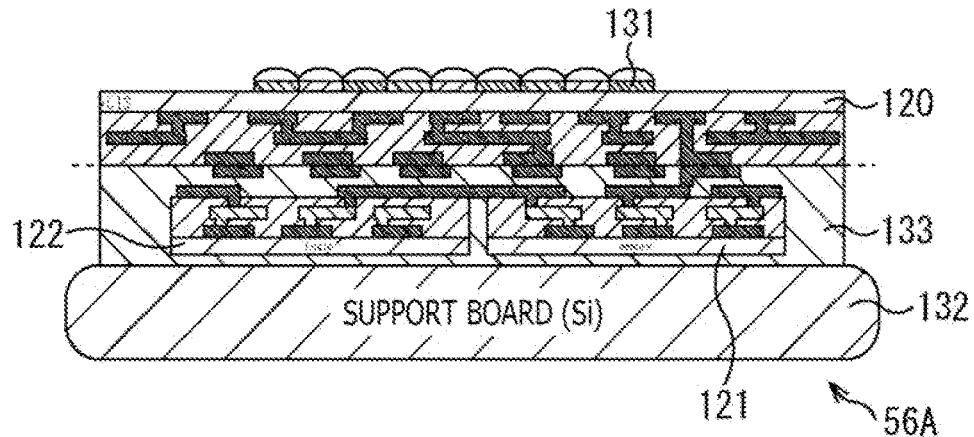
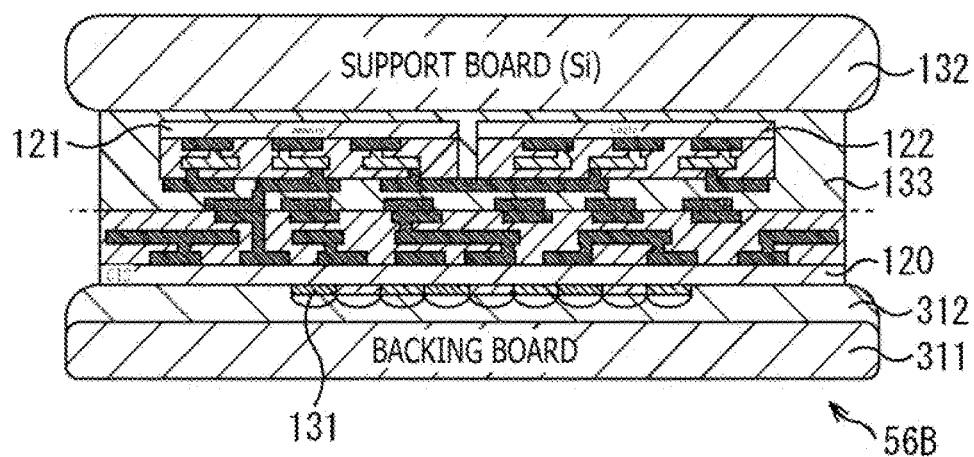
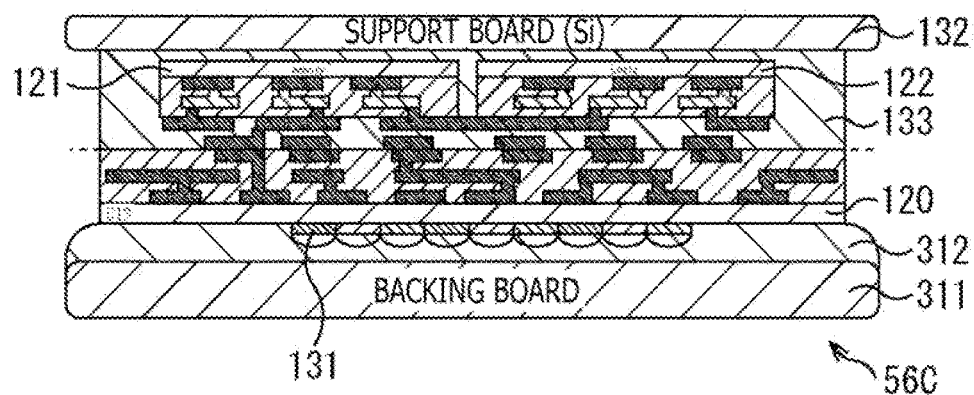

BACKSIDE-ILLUMINATION SOLID-STATE IMAGE PICKUP APPARATUS, IMAGE PICKUP APPARATUS, AND ELECTRONIC EQUIPMENT INCLUDING EMBEDMENT MEMBERS

TECHNICAL FIELD

The present disclosure relates to a backside-illumination solid-state image pickup apparatus and a backside-illumination solid-state image-pickup-apparatus manufacturing method, an image pickup apparatus, and electronic equipment, and in particular relates to a backside-illumination solid-state image pickup apparatus and a backside-illumination solid-state image-pickup-apparatus manufacturing method, an image pickup apparatus, and electronic equipment that are configured to make it possible to reduce manufacturing costs.

BACKGROUND ART

Solid-state image pickup apparatuses have attained higher image quality in the form such as a hi-vision, 4 k×2 k super hi-vision or further a super slow-motion function. Along with this, solid-state image pickup apparatuses have a larger number of pixels, a higher frame rate and more gradations.

Transfer rates are determined by (number of pixels)×(frame rate)×(gradations), and so, in a case where the number of pixels is 4 k×2 k=8M, the frame rate is 240 f/s, and the gradations are 14-bit gradations, for example, the transfer rate is 8M×240 f/s×14 bit=26 Gbps.

After signal processing at a latter stage of a solid-state image pickup element, the output is RGB in color coordinates, and so the transfer rate becomes 26 G×3=78 Gbps, which means that a still faster transfer is necessary.

If a fast transfer is performed with a small number of connection terminals, the signal rate per connection terminal increases. It becomes more difficult to achieve impedance matching of fast transfer paths, additionally the clock frequency becomes high, and the loss increases also. Accordingly, the power consumption increases.

In order to avoid this, the number of connection terminals may be increased to divide a transfer, and slow signal rates. However, increasing the number of connection terminals undesirably enlarges the package of each circuit as it means arranging terminals necessary for connection between solid-state image pickup elements, and latter-stage signal processing circuits, memory circuits and the like.

In addition, because boards of electric wires necessary for the latter-stage signal processing circuits and memory circuits also need to be finer ones having stacked wires at high wire densities, further the lengths of wiring paths become longer, and accordingly the power consumption increases.

If the package of each circuit becomes larger, a board itself on which the circuit is implemented becomes larger. The configuration of an image pickup apparatus itself on which the solid-state image pickup elements are eventually mounted becomes large undesirably.

In view of this, as a technology of reducing the size of the configuration of an image pickup apparatus, there has been a technology proposed in which a solid-state image pickup element, and a circuit such as a signal processing circuit or a memory circuit are stacked by using WoW (Wafer on Wafer) in which they are joined in the states of wafers (see PTL 1).

By using the stacking technology using WoW, semiconductors can be connected through many very thin wires, and so the transfer speed per wire becomes low, and the power consumption can be suppressed.

CITATION LIST

Patent Literature

[PTL 1]
JP 2014-099582A

SUMMARY

Technical Problems

However, in the case of WoW, there is no problem if chips on a wafer to be stacked have the same size, but if the sizes of chips included on a wafer are different, sizes have to be determined on the basis of the largest chip size, the theoretical yield of each circuit worsens, and the cost increases.

In addition, regarding the yield of each wafer to be stacked, the occurrence of bad chips on each wafer results in treating chips on another wafer stacked thereon as bad chips, and the yield of the wafers of the entire stack equals the product of (multiplication by) the yield of each wafer. Accordingly, the yield worsens, and the cost increases undesirably.

In addition, there has also been a technology proposed in which chips with different chip sizes are connected by forming small-sized bumps. Because chips with different sizes selected as good chips are connected via bumps in this case, the theoretical yield of each wafer, and the yield of each chip have less significant influences.

However, it is difficult to form small-sized bumps, and also the connection pitch is limited undesirably. Accordingly, the number of connection terminals cannot be made larger than that in WoW. In addition, because connections are formed in an implementation process, increasing the number of connection terminals increases costs because of the deterioration of the yield due to the connections. In addition, because the connections are joined individually in the implementation process, it takes a longer time to form the connections, and the process cost increases.

The present disclosure has been made in view of such a situation, and is, in particular, to make it possible to reduce the manufacturing cost of solid-state image pickup apparatuses.

Solution to Problems

A backside-illumination solid-state image pickup apparatus, an image pickup apparatus, and electronic equipment according to a first aspect of the present disclosure are a backside-illumination solid-state image pickup apparatus, an image pickup apparatus, and electronic equipment including: a first semiconductor element having an image pickup element that generates a pixel signal of each pixel; a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and a communication wire that electrically connects the second semiconductor element and the third semiconductor element.

In the first aspect of the present disclosure, a first semiconductor element having an image pickup element that generates a pixel signal of each pixel; a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and a communication wire that electrically connects the second semiconductor element and the third semiconductor element are included.

A backside-illumination solid-state image-pickup-apparatus manufacturing method according to a second aspect of the present disclosure is a method of manufacturing a backside-illumination solid-state image pickup apparatus including: a first semiconductor element having an image pickup element that generates a pixel signal of each pixel; a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and a communication wire that electrically connects the second semiconductor element and the third semiconductor element. The second semiconductor element and the third semiconductor element with the signal processing circuits that are included in the second semiconductor element and the third semiconductor element formed by a semiconductor process, and are determined as good elements by an electrical inspection are re-arranged on a wafer having the image pickup element formed by a semiconductor process, and embedded by using the embedment members, a communication wire that electrically connects the second semiconductor element and the third semiconductor element is formed, and the first semiconductor element, the second semiconductor element, and the third semiconductor element are stacked by oxide-film joining such that wires are electrically connected between the first semiconductor element, and the second semiconductor element and the third semiconductor element, and then are diced.

In the second aspect of the present disclosure, in a method of manufacturing a backside-illumination solid-state image pickup apparatus including: a first semiconductor element having an image pickup element that generates a pixel signal of each pixel; a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and a communication wire that electrically connects the second semiconductor element and the third semiconductor element. The second semiconductor element and the third semiconductor element with the signal processing circuits that are included in the second semiconductor element and the third semiconductor element formed by a semiconductor process, and are determined as good elements by an electrical inspection are re-arranged on a wafer having the image pickup element formed by a semiconductor process, and embedded by using the embedment members, a communication wire that electrically connects the second semiconductor element and the third semiconductor element is formed, and the first semiconductor element, the second semiconductor element, and the third semiconductor element are stacked by oxide-film joining such that wires are electrically connected between the first semiconductor element, and the second semiconductor element and the third semiconductor element, and then are diced.

A backside-illumination solid-state image pickup apparatus according to a third aspect of the present disclosure is a backside-illumination solid-state image pickup apparatus including: a first semiconductor element layer having an image pickup element that generates a pixel signal of each pixel; a second semiconductor element layer having a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and a support board. The second semiconductor element layer is provided between the first semiconductor element layer and the support board, and the first semiconductor element layer and the second semiconductor element layer are joined by direct joining.

In the third aspect of the present disclosure, a first semiconductor element layer having an image pickup element that generates a pixel signal of each pixel; a second semiconductor element layer having a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and a support board are provided. The second semiconductor element layer is provided between the first semiconductor element layer and the support board, and the first semiconductor element layer and the second semiconductor element layer are joined by direct joining.

BRIEF DESCRIPTION OF DRAWINGS

FIG. 18 is another figure for explaining the method of manufacturing the solid-state image pickup apparatus in FIG. 12.

FIG. 19 is another figure for explaining the method of manufacturing the solid-state image pickup apparatus in FIG. 12.

FIG. 29 is another figure for explaining the method of manufacturing the solid-state image pickup apparatus in FIG. 26.

FIG. 41 is a figure for explaining the method of manufacturing the solid-state image pickup apparatus in FIG. 39.

FIG. 42 is another figure for explaining the method of manufacturing the solid-state image pickup apparatus in FIG. 39.

FIG. 44 is a figure for explaining a method of manufacturing the solid-state image pickup apparatus according to a seventh embodiment of the present disclosure.

FIG. 46 is another figure for explaining the method of manufacturing the solid-state image pickup apparatus according to the seventh embodiment of the present disclosure.

FIG. 56 is a figure for explaining a method of manufacturing the solid-state image pickup apparatus in FIG. 55.

DESCRIPTION OF EMBODIMENTS

Hereinafter, suitable embodiments of the present disclosure are explained in detail with reference to the attached drawings. Note that constituent elements that have substantially the same functional configurations are given the same reference signs in the present specification and the drawings, and overlapping explanations are omitted thereby.

In addition, explanations are given in the following order.
1. Overview of Present Disclosure
2. First Embodiment
3. Second Embodiment
4. Application Example of Second Embodiment
5. Third Embodiment
6. Fourth Embodiment
7. Fifth Embodiment
8. Sixth Embodiment
9. Seventh Embodiment
10. Eighth Embodiment
11. Ninth Embodiment
12. Application Example of Ninth Embodiment
13. Tenth Embodiment
14. First Application Example of Tenth Embodiment
15. Second Application Example of Tenth Embodiment
16. Examples of Application to Electronic Equipment
17. Use Examples of Solid-State Image Pickup Apparatus
18. Examples of Application to Endoscopic Surgery System
19. Examples of Application to Mobile Body

1. Overview of Present Disclosure

The present disclosure is to reduce the manufacturing cost of solid-state image pickup apparatuses.

Here, before an explanation of the present disclosure, WoW (Wafer on Wafer) disclosed in PTL 1 is explained.

Figure 1:
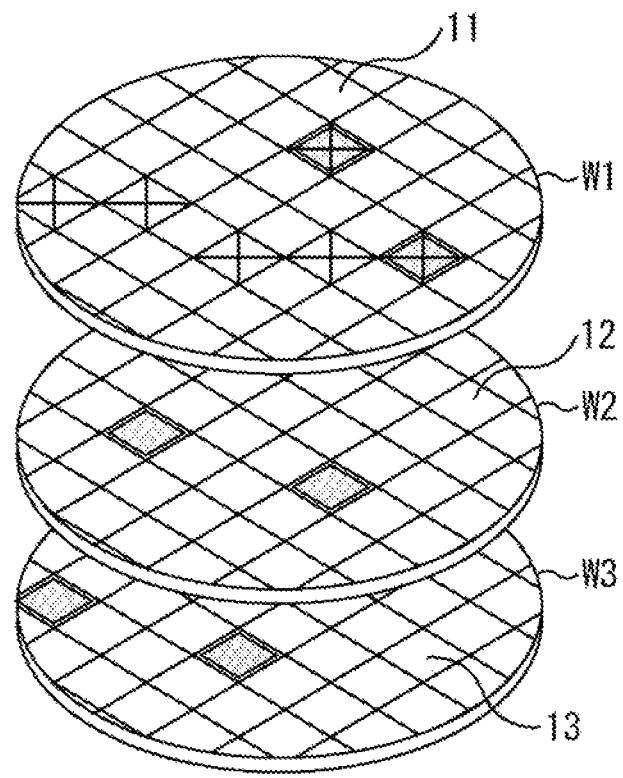
FIG. 1 is a figure for explaining a yield.

WoW is a technology of joining and stacking a solid-state image pickup apparatus, and a circuit including an IC such as a signal processing circuit or a memory circuit in the states of wafers, as depicted in FIG. 1, for example.

FIG. 1 schematically represents WoW in which a wafer W1 having plural solid-state image pickup elements 11 formed thereon, a wafer W2 having plural memory circuits 12 formed thereon, and a wafer W3 having plural logic circuits 13 formed thereon are joined and stacked in a state in which the wafer W1, the wafer W2, and the wafer W3 are finely aligned.

Figure 2:
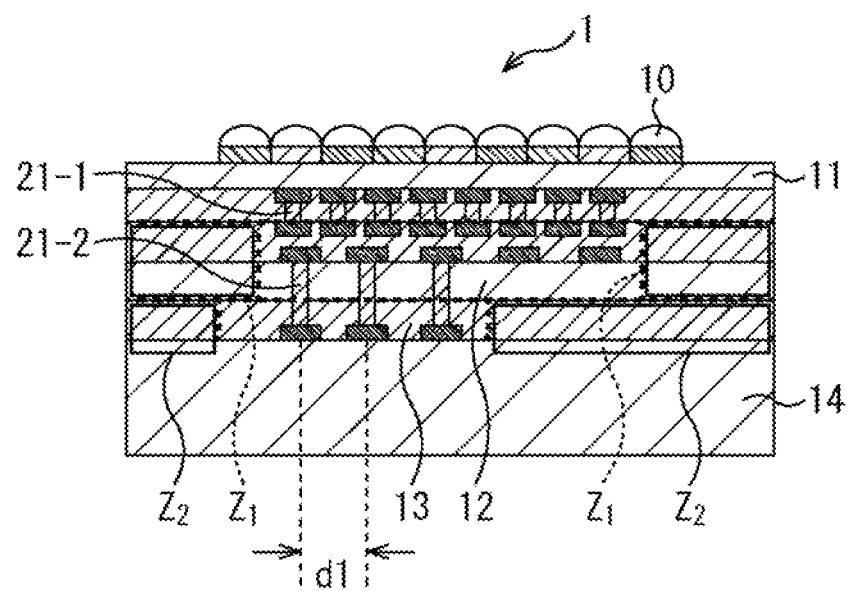
FIG. 2 is a figure for explaining deterioration of a theoretical yield.

By dicing the thus-stacked configuration, a solid-state image pickup apparatus like the one depicted in FIG. 2 is formed, for example.

A solid-state image pickup apparatus 1 in FIG. 2 includes pixels 131 (e.g., on-chip lenses 10 and on-chip color filters), a solid-state image pickup element 11, a memory circuit 12, a logic circuit 13, and a support board 14 that are stacked in this order from above.

Here, by applying the WoW technology, wires 21-1 that electrically connect the solid-state image pickup element 11 and the memory circuit 12, and wires 21-2 that electrically connect the memory circuit 12 and the logic circuit 13 can form connections at fine pitches.

As a result, the number of wires can be increased. Accordingly, the transfer speed of each signal line can be reduced, and so it becomes possible to attempt to save electric power.

However, because the area sizes considered to be required for the stacked solid-state image pickup element 11, the memory circuit 12, and the logic circuit 13 are different from each other, spaces Z1 where none of circuits and wires is formed occur on the left and right, in the figure, of the memory circuit 12 having an area size smaller than the largest solid-state image pickup element 11. In addition, spaces Z2 where none of circuits and wires is formed occur on the left and right, in the figure, of the logic circuit 13 having an area size smaller than the memory circuit 12.

That is, the spaces Z1 and Z2 occur because the area sizes considered to be required for the solid-state image pickup element 11, the memory circuit 12, and the logic circuit 13 are different from each other, and occur because the stack is formed with the solid-state image pickup element 11 considered to be required to have the largest area size as the reference element in FIG. 2.

Thereby, the theoretical yield related to the manufacturing of the solid-state image pickup apparatus 1 decreases; as a result, the costs related to the manufacturing increases.

In addition, in FIG. 1, configurations that are in the solid-state image pickup elements 11, the memory circuits 12, and the logic circuits 13 formed on the wafers W1 to W3, and are to be bad elements are represented by colored squares. That is, it is depicted in FIG. 1 that two bad elements have occurred in each of the wafers W1 to W3.

Bad elements that are generated in the solid-state image pickup elements 11, the memory circuits 12, and the logic circuits 13 formed on the wafers W1 to W3, respectively, do not necessarily occur at the same positions, as depicted in FIG. 1. Because of this, as depicted in FIG. 1, as solid-state image pickup apparatuses 1 are formed by stacking, six bad solid-state image pickup apparatuses 1 occur as indicated by crosses on the wafer W1 of the solid-state image pickup elements 11.

Thereby, despite the fact that at least two parts in three parts, which are a solid-state image pickup element 11, a memory circuit 12, and a logic circuit 13, are not bad elements in each of the six bad solid-state image pickup apparatuses 1, the six solid-state image pickup apparatuses 1 are treated as being bad, and the yield of each part becomes six, which corresponds to the product of multiplication by the number of wafers, while otherwise the yield really could be two.

As a result, the yield of solid-state image pickup apparatuses 1 is lowered, and the manufacturing cost increases.

Figure 3:
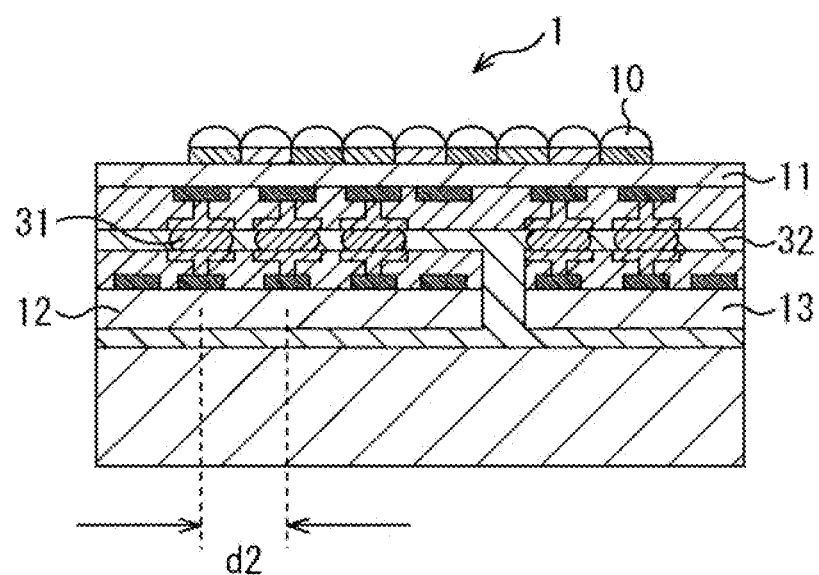
FIG. 3 is a figure for explaining connections using bumps.

In addition, as depicted in FIG. 3, as one possible solution, after solid-state image pickup elements 11, memory circuits 12, and logic circuits 13 with different chip sizes are diced, only good elements are arranged selectively, and are connected by forming small-sized bumps.

In the solid-state image pickup apparatus 1 in FIG. 3, the on-chip lenses and on-chip color filters 10, and the solid-state image pickup element 11 are stacked from above, the memory circuit 12 and the logic circuit 13 are stacked thereunder on a single layer, and the support board 14 is provided and stacked thereunder. In addition, the solid-state image pickup element 11, and the memory circuit 12 and logic circuit 13 arranged on the single layer are electrically connected via small-sized bumps 31.

In the solid-state image pickup apparatus 1 in FIG. 3, chips with different sizes that are selected as good chips are connected via the bumps 31, and additionally the influences of the theoretical yield of each wafer, and the yield of each chip are reduced.

However, it is difficult to form the small-sized bumps 31, and, as depicted in FIG. 3, there is a limitation on the size-reduction of a connection pitch d2, which make it impossible to make the connection pitch d2 smaller than a connection pitch d1 in FIG. 2 depicting the case that WoW is used.

Because of this, the solid-state image pickup apparatus 1 in FIG. 3, which is a stack formed by using bumps, cannot have a large number of connection terminals compared with the solid-state image pickup apparatus 1 in FIG. 2, which is a stack formed by using WoW. In addition, if the number of connection terminals increases in the case of the connection by using bumps as in the solid-state image pickup apparatus 1 in FIG. 3, the connection terminals are joined in an implementation process, and so deterioration of the yield related to the joining occurs, undesirably increasing the cost. Further, the connection of the bumps in the implementation process requires work which is performed for each bump. Accordingly, each process takes a long time, and the process cost also increases.

On the basis of the above, an image pickup element of the present disclosure is to reduce costs related to manufacturing, in terms of theoretical yield, implementation cost and process cost.

2. First Embodiment

Figure 4:
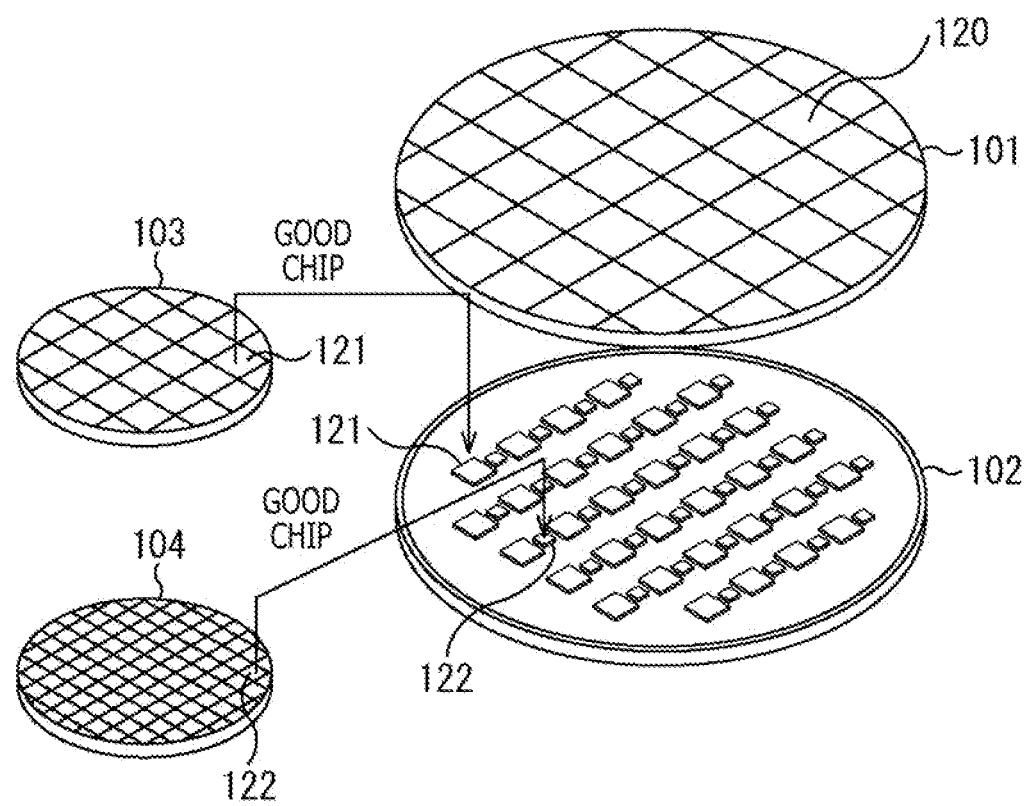
FIG. 4 is a figure for explaining an overview of a method of manufacturing a solid-state image pickup apparatus according to a first embodiment of the present disclosure.

FIG. 4 is a figure for explaining a structure that is to be applied at the time of the manufacturing of a solid-state image pickup apparatus of the present disclosure, and is a stack of plural wafers formed by using a combination of the CoW (Chip on Wafer) technology and the WoW technology.

In the manufacturing of the solid-state image pickup apparatus of the present disclosure, two wafers are stacked in a state in which wires are finely aligned. One of the two wafers is a wafer 101 in which plural solid-state image pickup elements (CMOS (Complementary Metal Oxide Semiconductor) image sensors or CCDs (Charge Coupled Devices) 120 are formed, and the other of the two wafers is a wafer 102 in which memory circuits 121 and logic circuits 122 are re-arranged. Note that, in explanations hereinafter, solid-state image pickup elements 120 are represented as being CMOS image sensors (CMOS Image Sensors) in figures, and are also referred to as CIS 120 simply.

The wafer 101 has plural solid-state image pickup elements 120 formed therein by a semiconductor process.

The wafer 102 has plural memory circuits 121 re-arranged therein. The plural memory circuits 121 are formed on a wafer 103 by a semiconductor process, and diced, and thereafter are each subjected to an electrical inspection, and confirmed to be good chips.

In addition, the wafer 102 has plural logic circuits 122 re-arranged therein. The plural logic circuits 122 are formed on a wafer 104 by a semiconductor process, and diced, and thereafter are each subjected to an electrical inspection, and confirmed to be good chips.

<Configuration Example of Solid-State Image Pickup Apparatus Formed with Wafers Stacked by Using WoW Technology in FIG. 4>

After plural wafers are stacked by using the WoW technology as depicted in FIG. 4, the plural wafers are diced, and thereby a solid-state image pickup apparatus 111 (FIG. 5) of the present disclosure is formed.

Figure 5:
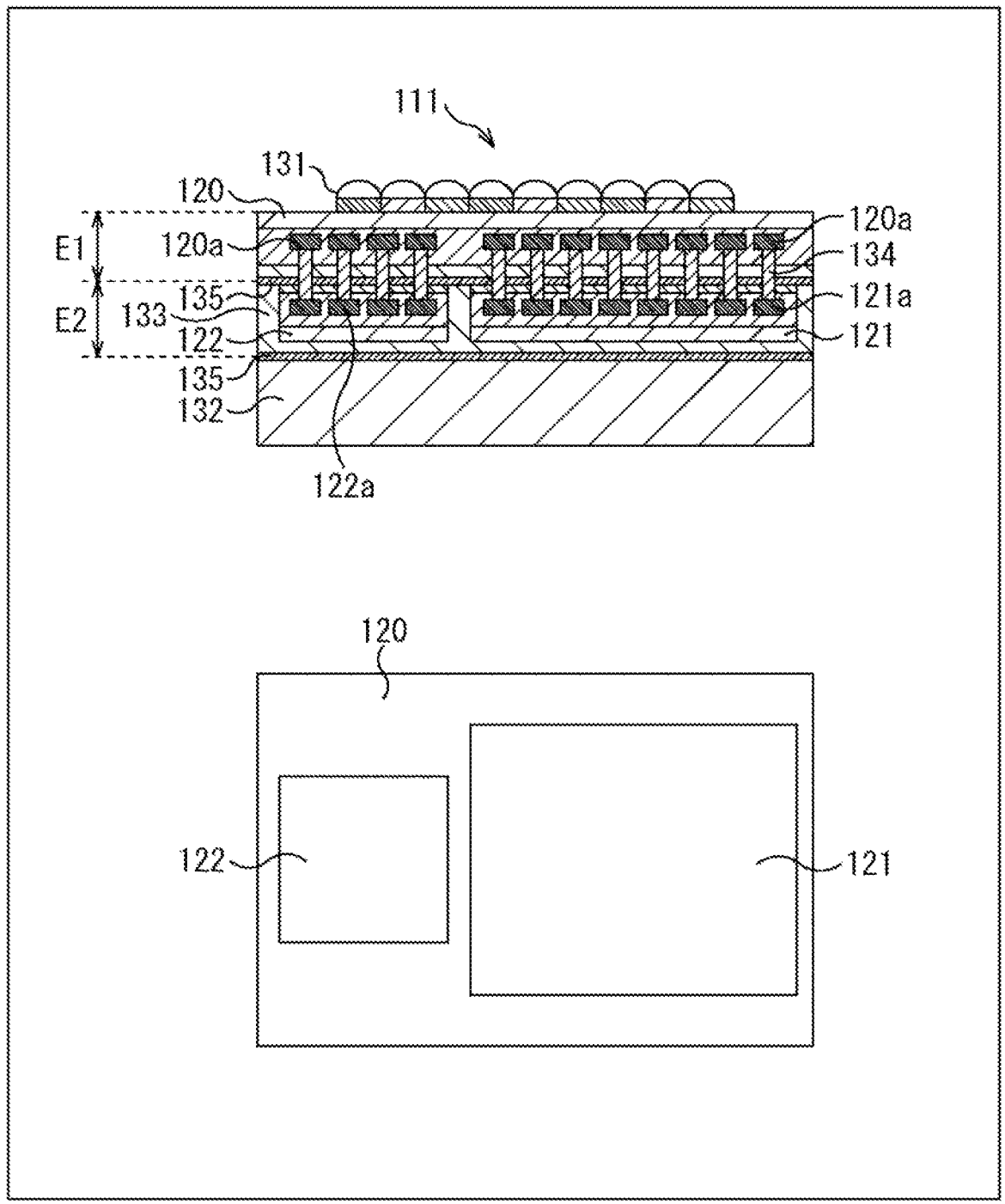
FIG. 5 is a figure for explaining a configuration example of the solid-state image pickup apparatus according to the first embodiment of the present disclosure.

The solid-state image pickup apparatus of the present disclosure has a configuration as depicted in FIG. 5, for example. Note that FIG. 5 includes a side cross-sectional view on the upper half, and a figure, on the lower half, depicting a horizontal arrangement relation among a solid-state image pickup element 120, a memory circuit 121, and a logic circuit 122 as seen from above.

In the solid-state image pickup apparatus 111 on the upper half of FIG. 5, color filters and on-chip lenses pixels 131, and the solid-state image pickup element 120 are stacked from above in the figure. Thereunder, the memory circuit 121 and the logic circuit 122 are stacked being arranged on the left and right on a single layer. Thereunder, a support board 132 is formed. That is, as depicted on the upper half of FIG. 5, the solid-state image pickup apparatus 111 in FIG. 5 includes a semiconductor element layer E1 including the solid-state image pickup element 120 formed on the wafer 101, and a semiconductor element layer E2 including the memory circuit 121 and the logic circuit 122 formed on the wafer 102.

Wires 120a that are in wires 120a of the solid-state image pickup element 120, and are on the memory circuit 121 are electrically connected with wires 121a of the memory circuit 121 by wires 134 connected by CuCu-connection.

In addition, wires 120a that are in the wires 120a of the solid-state image pickup element 120, and are on the logic circuit 122 are electrically connected with wires 122a of the logic circuit 122 by wires 134 connected by CuCu-connection.

The space that is in the semiconductor element layer E2 on which the memory circuit 121 and the logic circuit 122 are formed, and surrounds the memory circuit 121 and the logic circuit 122 becomes filled with an oxide film 133. Thereby, in the semiconductor element layer E2, the memory circuit 121 and the logic circuit 122 become embedded in the oxide film 133.

If the oxide film 133 is an inorganic film, it is desirably a Si-based oxide film such as a SiO2 film, a SiO film, or a SRO film in terms of heat resistance and the warp amount after film formation. In addition, it is also possible to replace the oxide film 133 with an organic film. The organic film in that case is preferably a polyimide-based (PI, PBO, etc.) film, a polyamide-based film or the like that can easily ensure high heat resistance.

In addition, the semiconductor element layer E1 on which the solid-state image pickup element 120 is formed, and the semiconductor element layer E2 on which the memory circuit 121 and the logic circuit 122 are formed are joined at their boundary by an oxide film junction layer 135 formed by oxide-film joining. Further, the semiconductor element layer E2 including the memory circuit 121 and the logic circuit 122, and the support board 132 are joined by an oxide film junction layer 135 formed by oxide-film joining.

In addition, as depicted on the lower half of FIG. 5, when seen from above, the memory circuit 121 and the logic circuit 122 are arranged to be enclosed in an area where the solid-state image pickup element 120 is on the uppermost layer. With such an arrangement, the empty space not occupied by the memory circuit 121 and the logic circuit 122 decreases on the layer including the memory circuit 121 and the logic circuit 122, and so it becomes possible to enhance the theoretical yield.

On the wafer 102 in FIG. 4, memory circuits 121 and logic circuits 122 are re-arranged being adjusted finely such that, when individual solid-state image pickup apparatuses 111 are formed by dicing, the memory circuits 121 and the logic circuits 122 are arranged in areas of solid-state image pickup elements 120 when seen from above.

<Method of Manufacturing Solid-State Image Pickup Apparatus in FIG. 5>

Next, a method of manufacturing the solid-state image pickup apparatus 111 in FIG. 5 is explained with reference to FIG. 6 to FIG. 9. Note that side cross-sectional views 6A to 6L in FIG. 6 to FIG. 9 depict side cross-sectional views of the solid-state image pickup apparatus 111.

Figure 6:
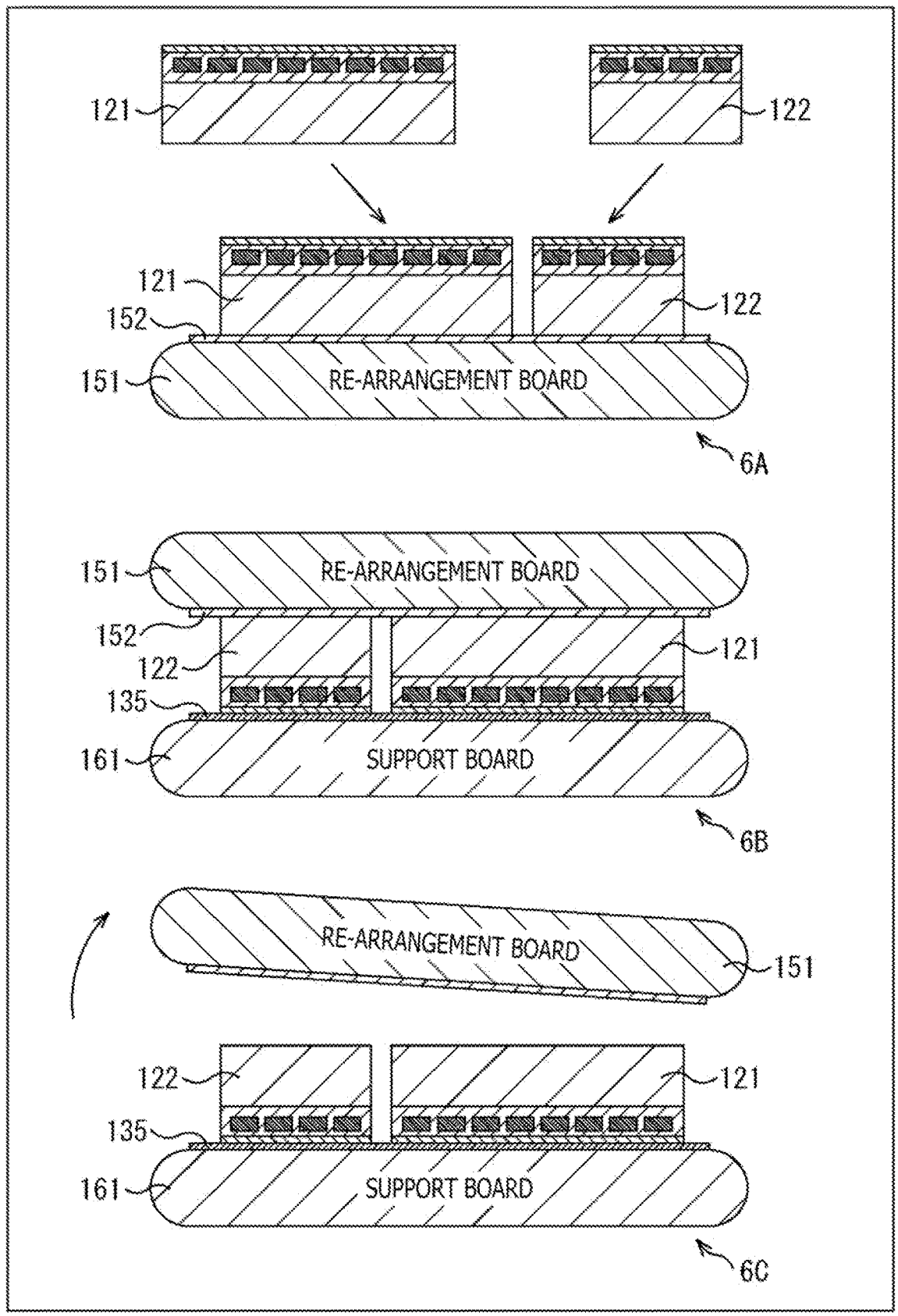
FIG. 6 is a figure for explaining a method of manufacturing the solid-state image pickup apparatus in FIG. 5.

In a first process, as depicted in the side cross-sectional view 6A in FIG. 6, the memory circuit 121 and the logic circuit 122 confirmed to be good elements after an electrical inspection is performed are re-arranged on a re-arrangement board 151 in the layout as depicted on the lower half of FIG. 5. An adhesive 152 is applied onto the re-arrangement board 151, and the memory circuit 121 and the logic circuit 122 re-arranged on the re-arrangement board 151, and fixed by the adhesive 152.

In a second process, as depicted in the side cross-sectional view 6B in FIG. 6, the memory circuit 121 and the logic circuit 122 are reversed such that their top surfaces depicted in the side cross-sectional view 6A become the lower surfaces, an oxide film is formed, and oxide-film joining is performed by forming the oxide film junction layer 135 on a flattened support board 161.

In a third process, as depicted in the side cross-sectional view 6C in FIG. 6, the re-arrangement board 151 is debonded together with the adhesive 152, and peeled and eliminated.

Figure 7:
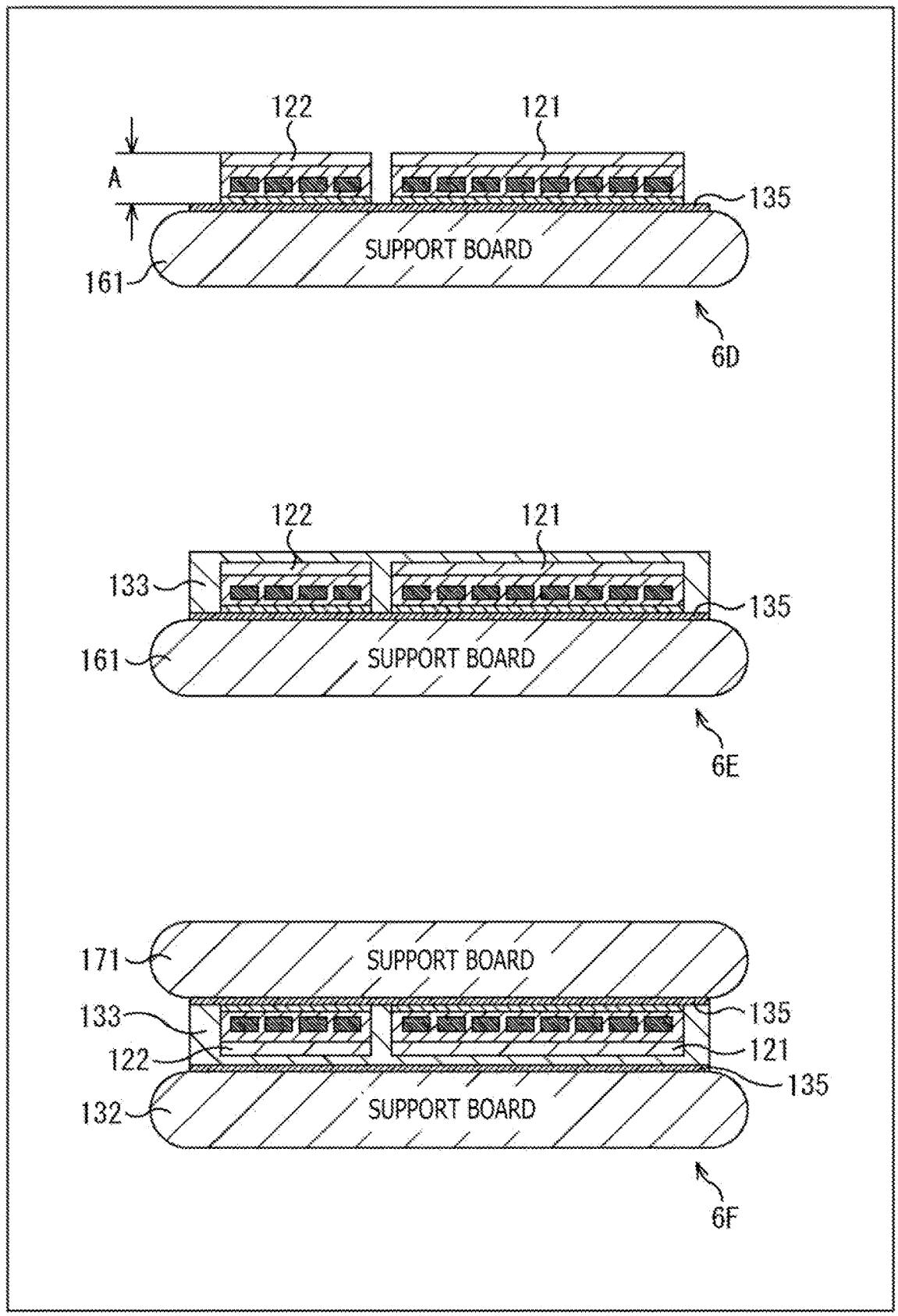
FIG. 7 is another figure for explaining the method of manufacturing the solid-state image pickup apparatus in FIG. 5.

In a fourth process, as depicted in the side cross-sectional view 6D in FIG. 7, silicon layers at top surface sections, in the figure, of the memory circuit 121 and the logic circuit 122 are made thin such the height of the memory circuit 121 and the logic circuit 122 becomes a height A which does not influence the characteristics of the device.

In a fifth process, as depicted in the side cross-sectional view 6E in FIG. 7, the oxide film 133 to function as an insulating film is formed, and a chip including the re-arranged memory circuit 121 and logic circuit 122 is embedded therein. At this time, the surface of the oxide film 133 is flattened at the height corresponding to the height of the memory circuit 121 and the logic circuit 122.

In a sixth process, as depicted in the side cross-sectional view 6F in FIG. 7, a support board 171 is joined on the flattened oxide film 133 by the oxide film junction layer 135 formed by oxide-film joining.

Figure 8:
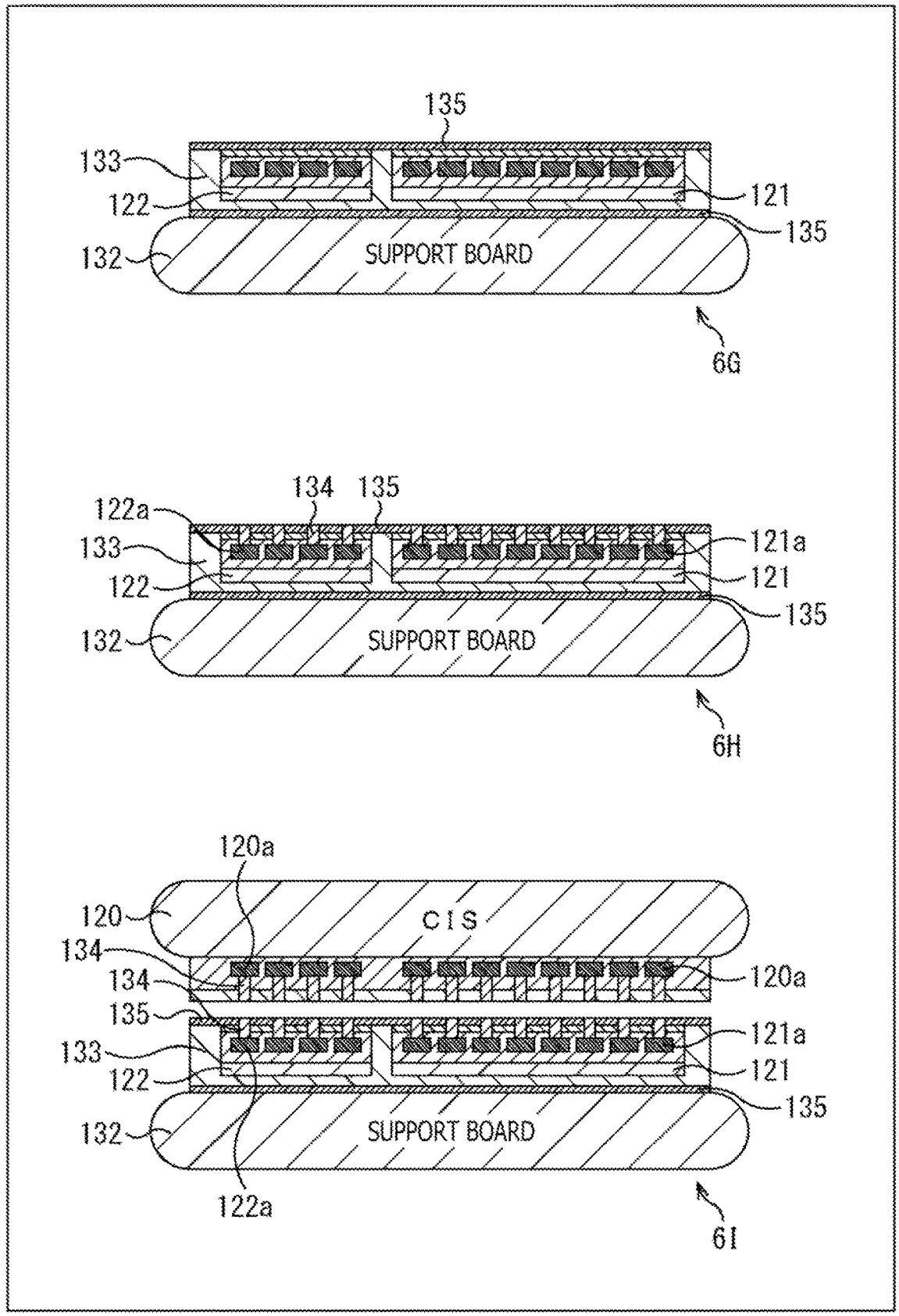
FIG. 8 is another figure for explaining the method of manufacturing the solid-state image pickup apparatus in FIG. 5.

In a seventh process, as depicted in the side cross-sectional view 6G in FIG. 8, the support board 171 is eliminated by being debonded or by being etched. By the processes from the first process to the seventh process, the memory circuit 121 and the logic circuit 122 are re-arranged in the layout depicted on the lower half of FIG. 5, and are embedded in the insulating film including the oxide film 133, and in this state the wafer 102 having the oxide film junction layer 135 formed on the flattened uppermost surface becomes completed state.

In an eighth process, as depicted in the side cross-sectional view 6H in FIG. 8, wires 134 are formed for the wires 121a of the memory circuit 121, and the wires 122a of the logic circuit 122 for electrical connection with the solid-state image pickup element 120.

In a ninth process, as depicted in the side cross-sectional view 6I in FIG. 8, the wires 134 from the wires 121a of the memory circuit 121, and the wires 122a of the logic circuit 122 on the wafer 102, and the wires 134 from the wires 120a of the solid-state image pickup element (CIS) 120 on the wafer 101 are aligned such that they are at appropriately facing positions.

Figure 9:
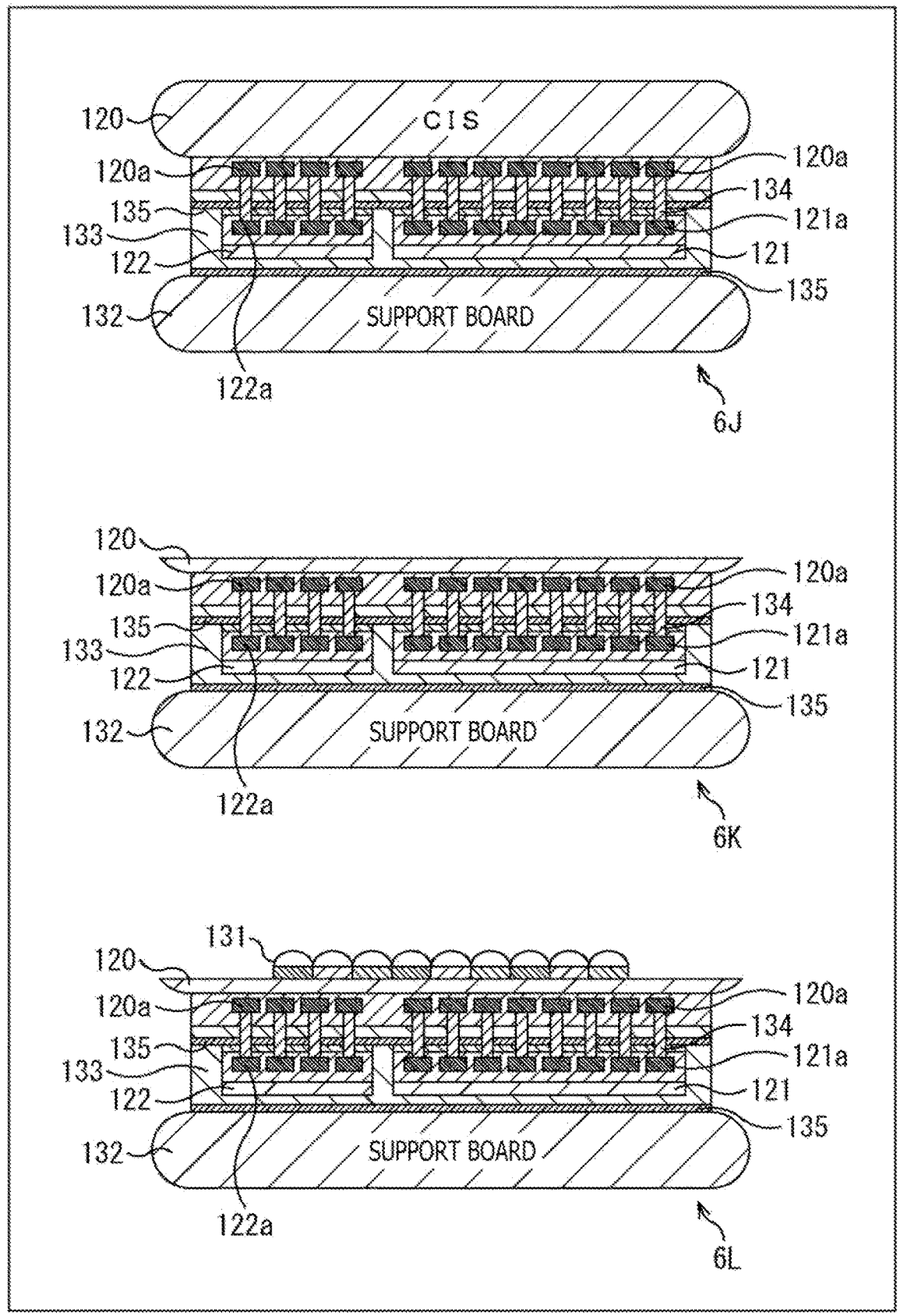
FIG. 9 is another figure for explaining the method of manufacturing the solid-state image pickup apparatus in FIG. 5.

In a tenth process, as depicted in the side cross-sectional view 6J in FIG. 9, the wafers 101 and 102 are bonded by WoW such that the wires 134 from the wires 121a of the memory circuit 121, and the wires 122a of the logic circuit 122 on the wafer 102, and the wires 134 from the wires 120a of the solid-state image pickup element 120 on the wafer 101 are connected by CuCu-joining. By this process, each of the memory circuit 121 and the logic circuit 122 on the wafer 102 becomes electrically connected with each solid-state image pickup element 120 on the wafer 101.

In an eleventh process, as depicted in the side cross-sectional view 6K in FIG. 9, a silicon layer which is an upper layer, in the figure, of the solid-state image pickup element 120 is made thin.

In a twelfth process, as depicted in the side cross-sectional view 6L in FIG. 9, the color filters and on-chip lenses pixels 131 are provided on the solid-state image pickup element 120, and diced. Thereby, the solid-state image pickup apparatus 111 is completed.

With processes like the ones above, the solid-state image pickup apparatus 111 including a first layer on which the solid-state image pickup element 120 is formed, and a second layer on which the memory circuit 121 and the logic circuit 122 are formed is manufactured.

With such a configuration, the inter-circuit connection between the solid-state image pickup element 120, and the memory circuit 121 and the logic circuit 122 can be formed by forming terminals at a wire density of very thin wires by the semiconductor lithography technology as in WoW. Accordingly, the number of connection terminals can be increased, the signal processing speed at each wire can be reduced, and so it becomes possible to attempt to reduce the power consumption.

In addition, only those confirmed to be good chips are connected as the memory circuit 121 and the logic circuit 122. Accordingly, bad chips of each wafer, which is a drawback of WoW, decrease, and so the occurrence of yield loss can be reduced.

Further, unlike WoW, the memory circuit 121 and the logic circuit 122 to be connected can be arranged in an independent island-like manner as depicted on the lower half of FIG. 5 by reducing their sizes as much as possible regardless of the chip size of the solid-state image pickup element 120. Accordingly, it becomes possible to enhance the theoretical yield of the memory circuit 121 and the logic circuit 122 to be connected.

This means that the solid-state image pickup element 120 requires a minimum necessary pixel size for reacting to optical light, and so the process cost can be reduced because the process of manufacturing the solid-state image pickup element 120 does not necessarily require fine wiring processes. In addition, it becomes possible to reduce the power consumption by using a state-of-the-art fine wiring process for the process of manufacturing the logic circuit 122. Further, it becomes possible to enhance the theoretical yield of the memory circuit 121 and the logic circuit 122. As a result, it becomes possible to reduce the cost related to the manufacturing of the solid-state image pickup apparatus 111.

In addition, because it is a structure in which chips can be re-arrayed and joined on a wafer, it becomes possible to stack on one chip even in the case of processes involving different types in which case it is difficult to fabricate, in the same wafer, an analog circuit such as a power supply IC or a clock, and a logic circuit 122 which are configured by totally different processes, or even in a case where there are differences of wafer sizes.

In addition, while the memory circuit 121 and the logic circuit 122 are used as circuits to be connected to the solid-state image pickup element 120 in the example explained above, circuits that are used may be other than the memory circuit 121 and the logic circuit 122, like circuits related to the control of the solid-state image pickup element 120, circuits related to the processing of pixel signals generated by image-capturing, and the like as long as those circuits are signal processing circuits considered to be required for the operation of the solid-state image pickup element 120. Examples of the signal processing circuits considered to be required for the operation of the solid-state image pickup element 120 may include, for example, a power supply circuit, an image signal compression circuit, a clock circuit, an optical communication conversion circuit and the like.

3. Second Embodiment

The solid-state image pickup apparatus 111 explained above has a two-layer configuration including stacked layers, which are layer on which the solid-state image pickup element 120 is formed, and a layer on which the memory circuit 121 and the logic circuit 122 are re-arranged.

However, in a CoC (Chip On Chip) in which plural chips are mounted on one chip (a CoC on which two chips, which are the memory circuit 121 and the logic circuit 122, are mounted on a chip of the one solid-state image pickup element 120) as mentioned above, as depicted in FIG. 10, it is necessary to form, on a surface of a semiconductor element (solid-state image pickup element 120) with a large size, wires (hereinafter, also referred to as communication wires) for connecting two chips, which are the memory circuit 121 and the logic circuit 122, that are arranged being arrayed on a plane.

Figure 10:
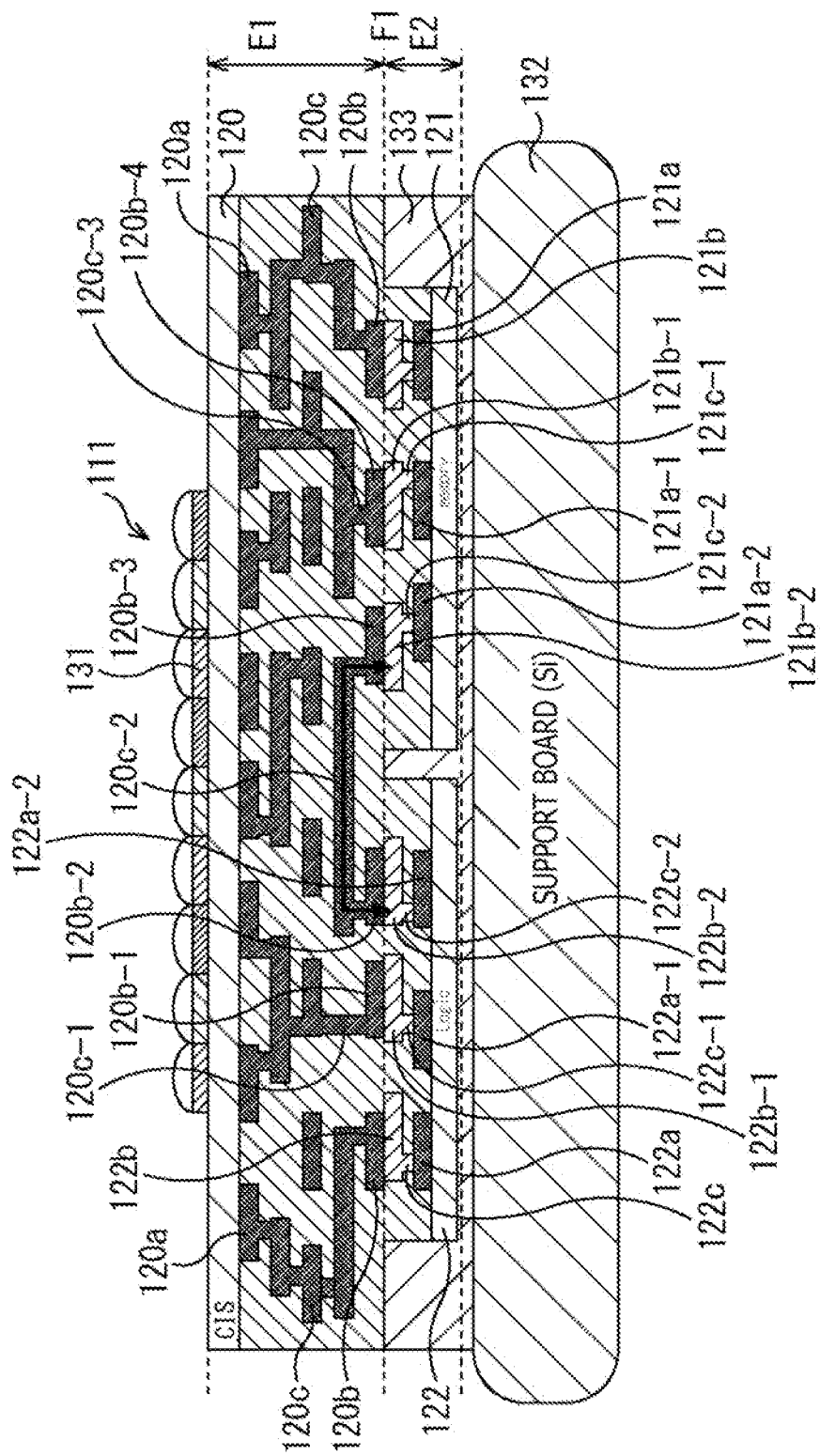
FIG. 10 is a figure for explaining a configuration example of a communication wire between a memory circuit and a logic circuit in the solid-state image pickup apparatus according to the first embodiment of the present disclosure.

FIG. 10 is a side cross-sectional view of the solid-state image pickup apparatus 111 more specifically representing internal terminals and wires of each of the solid-state image pickup element (CIS) 120, the memory circuit 121 and the logic circuit 122 included in the solid-state image pickup apparatus 111 depicted in FIG. 5. Note that hereinafter, for convenience of explanations, the oxide film junction layer 135 is omitted from illustrations, but is present.

As depicted in FIG. 10, along a junction surface F1 on which the solid-state image pickup element 120 and the memory circuit 121 face each other, pads 120*b* and 121*b* electrically connected with the wires 120*a* and 121*a*, respectively, are mutually CuCu-joined. Similarly, along the junction surface F1 on which the solid-state image pickup element 120 and the logic circuit 122 face each other, pads 120*b* and 122*b* electrically connected with wires 120*a* and 122*a*, respectively, are mutually CuCu-connected.

In addition, each pad 120*b* of the solid-state image pickup element 120 is connected to various types of circuit, a wire 120*a* or another pad 120*b* via a wire 120*c*. In addition, each pad 121*b* of the memory circuit 121 is connected to a wire 121*a* via a wire 121*c*. Further, each pad 122*b* of the logic circuit 122 is connected to a wire 122*a* via a wire 122*c*.

Note that each wire 134 in FIG. 5 has a configuration which is an aggregation of wires 120*c*, pads 120*b* and 121*b*, and wires 121*c*.

In addition, configurations that are in each of the wires 120*a*, 121*a*, and 122*a*, the pads 120*b*, 121*b*, and 122*b* and the wires 120*c*, 121*c*, and 122*c*, and need to be particularly distinguished from one another are given separate reference signs each with "-" at the end of its reference character.

That is, pads 122*b*-1 and 122*b*-2 of the logic circuit 122 are CuCu-joined with pads 120*b*-1 and 120*b*-2 of the solid-state image pickup element 120, and pads 121*b*-2 and 121*b*-1 of the memory circuit 121 are CuCu-joined with pads 120*b*-3 and 120*b*-4 of the solid-state image pickup element 120.

In addition, the pad 120*b*-1 of the solid-state image pickup element 120 is connected with a wire 120*c*-1. In addition, the pads 120*b*-2 and 120*b*-3 are interconnected via a wire 120*c*-2. Further, a pad 120*c*-4 is connected with a wire 120*c*-3.

With such a configuration, the solid-state image pickup element 120 and the memory circuit 121 are electrically connected via the wire 120*c*-2.

The memory circuit 121 and the logic circuit 122 are connected via the wire 120*c*-2 in the solid-state image pickup element 120 with the largest chip area size.

That is, in FIG. 10, the wire 120*c*-2 functions as a communication wire between the memory circuit 121 and the logic circuit 122.

Figure 11:
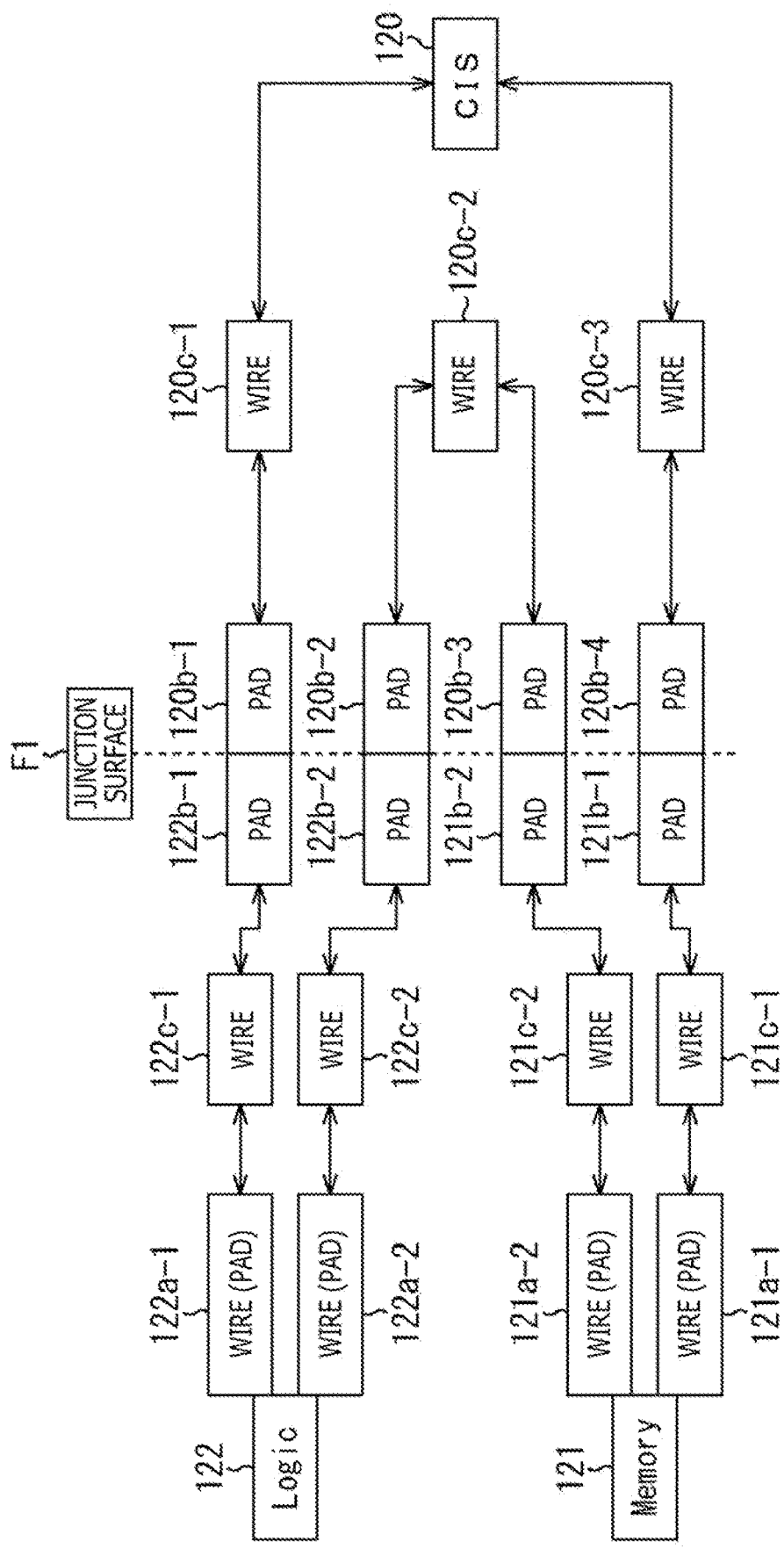
FIG. 11 is a figure for explaining a configuration around the communication wire between the memory circuit and the logic circuit in the solid-state image pickup apparatus in FIG. 10.

Here, with reference to FIG. 11, the configuration of wires is explained by referring to a configuration which has the wire 120*c*-2 to be the communication wire as the center of the configuration, and includes selected pads and wires which are the pad 120*b*-1 to 120*b*-4 and the wires 120*c*-1 to 120*c*-3 of the solid-state image pickup element 120, the wires 121*a*-1 and 121*a*-2, the pads 121*b*-1 and 121*b*-2, and the wires 121*c*-1 and 121*c*-2 of the memory circuit 121, and the wires 122*a*-1 and 122*a*-2, the pads 122*b*-1 and 122*b*-2, and the wires 122*c*-1 and 122*c*-2 of the logic circuit 122.

As depicted in FIG. 11, in a case where the wire 120*c*-2 functions as the communication wire of the memory circuit 121 and the logic circuit 122, the memory circuit 121 and the logic circuit 122 are electrically connected via the wire (pad) 121*a*-2, the wire 121*c*-2, the pads 121*b*-2 and 120*b*-3, the wire 120*c*-2, the pads 120*b*-2 and 122*b*-2, the wire 122*c*-2, and the wire (pad) 122*a*-2.

If such a wire configuration is adopted, processes for forming the communication wire increase in a process of manufacturing the solid-state image pickup element 120, the yield loss according to the process increase occurs. In addition, because the memory circuit 121 and the logic circuit 122 are connected via the wire 120*c*-2 of the solid-state image pickup element 120, the signal line distance increases due to restrictions in terms of layout, or the power consumption increases by forming aggregated wires.

Figure 12:
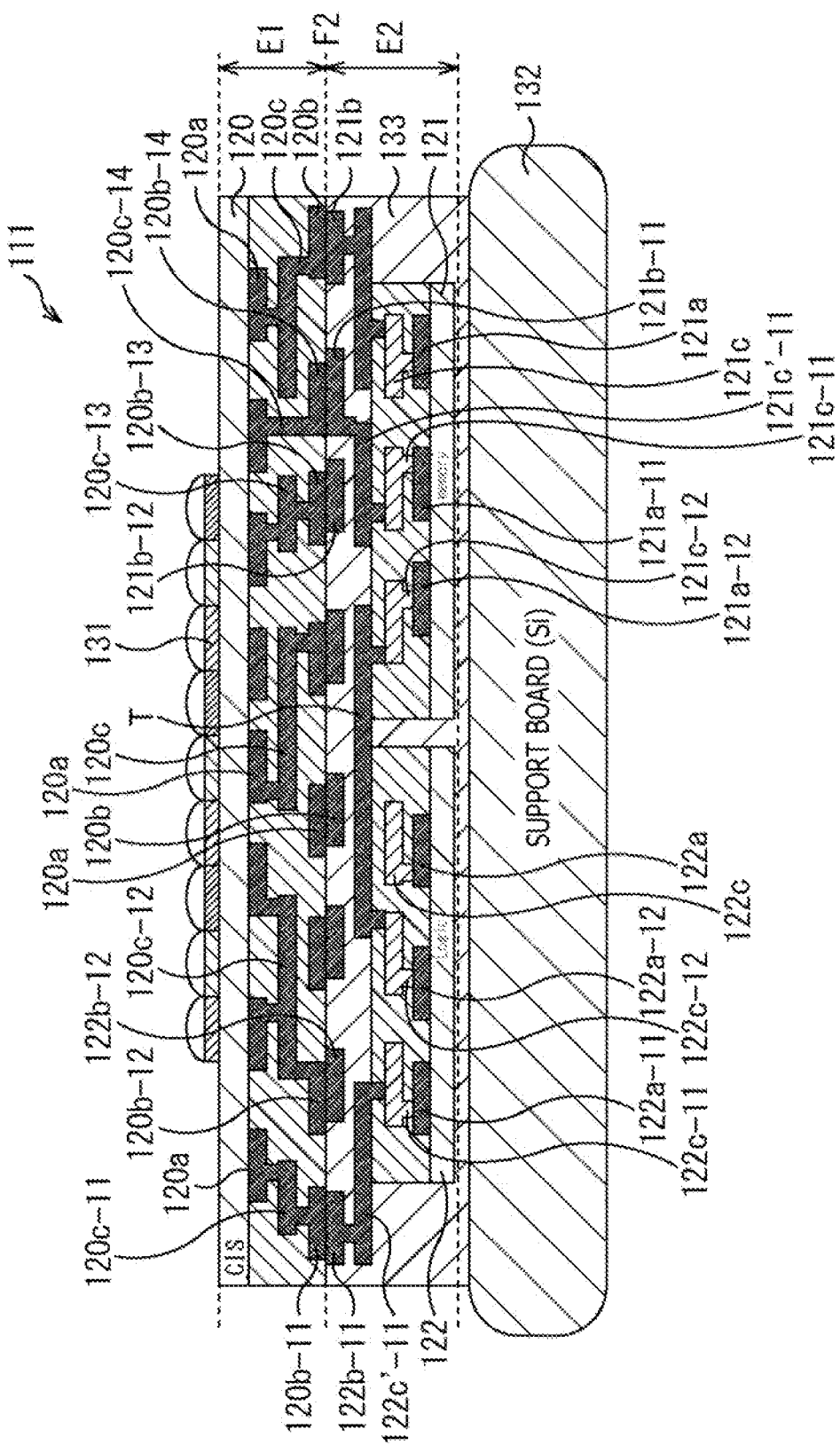
FIG. 12 is a figure for explaining a configuration example of the solid-state image pickup apparatus according to a second embodiment of the present disclosure.

In view of this, in the solid-state image pickup apparatus 111 in a configuration example of a second embodiment of the present disclosure, as depicted in FIG. 12, a communication wire connecting the memory circuit 121 and the logic circuit 122 is formed in the semiconductor element layer E2 on which the memory circuit 121 and the logic circuit 122 are formed, and the pads 121b and 122b are mutually electrically connected.

That is, the solid-state image pickup apparatus 111 in FIG. 12 is different from the solid-state image pickup apparatus 111 in FIG. 10 in terms of the configuration of the semiconductor element layer E2.

It should be noted however that pads 120b-11 to 120b-14 and wires 120c-11 and 120c-14 of the solid-state image pickup element 120 in the configuration in FIG. 12 correspond to the pads 120b-1 to 120b-4 and the wires 120c-1 and 120c-3 of the solid-state image pickup element 120 in FIG. 10, respectively.

In addition, wires 121a-11 and 121a-12, pads 121b-11 and 121b-12, and wires 121c-11 and 121c-12 of the memory circuit 121 in FIG. 12 correspond to the wires 121a-1 and 121a-2, the pads 121b-1 and 121b-2, and the wires 121c-1 and 121c-2 of the memory circuit 121 in FIG. 10, respectively.

Further, wires 122a-11 and 122a-12, pads 122b-11 and 122b-12, and wires 122c-11 and 122c-12 of the logic circuit 122 in FIG. 12 correspond to the wires 122a-1 and 122a-2, the pads 122b-1 and 122b-2, and the wires 122c-1 and 122c-2 of the logic circuit 122 in FIG. 10, respectively.

That is, in the semiconductor element layer E2 in FIG. 12, a wiring layer is formed between the memory circuit 121 and the logic circuit 122, and the pads 121b and 122b, and wires 121c'-1 and 122c'-1 which are extensions of the wires 121c and 122c are formed.

Further, in the same wiring layer where the wires 121c'-1 and 122c'-1 are formed, a communication wire T that connects a wire 121c-12 of the memory circuit 121, and a wire 122c-12 of the logic circuit 122 is formed.

Figure 13:
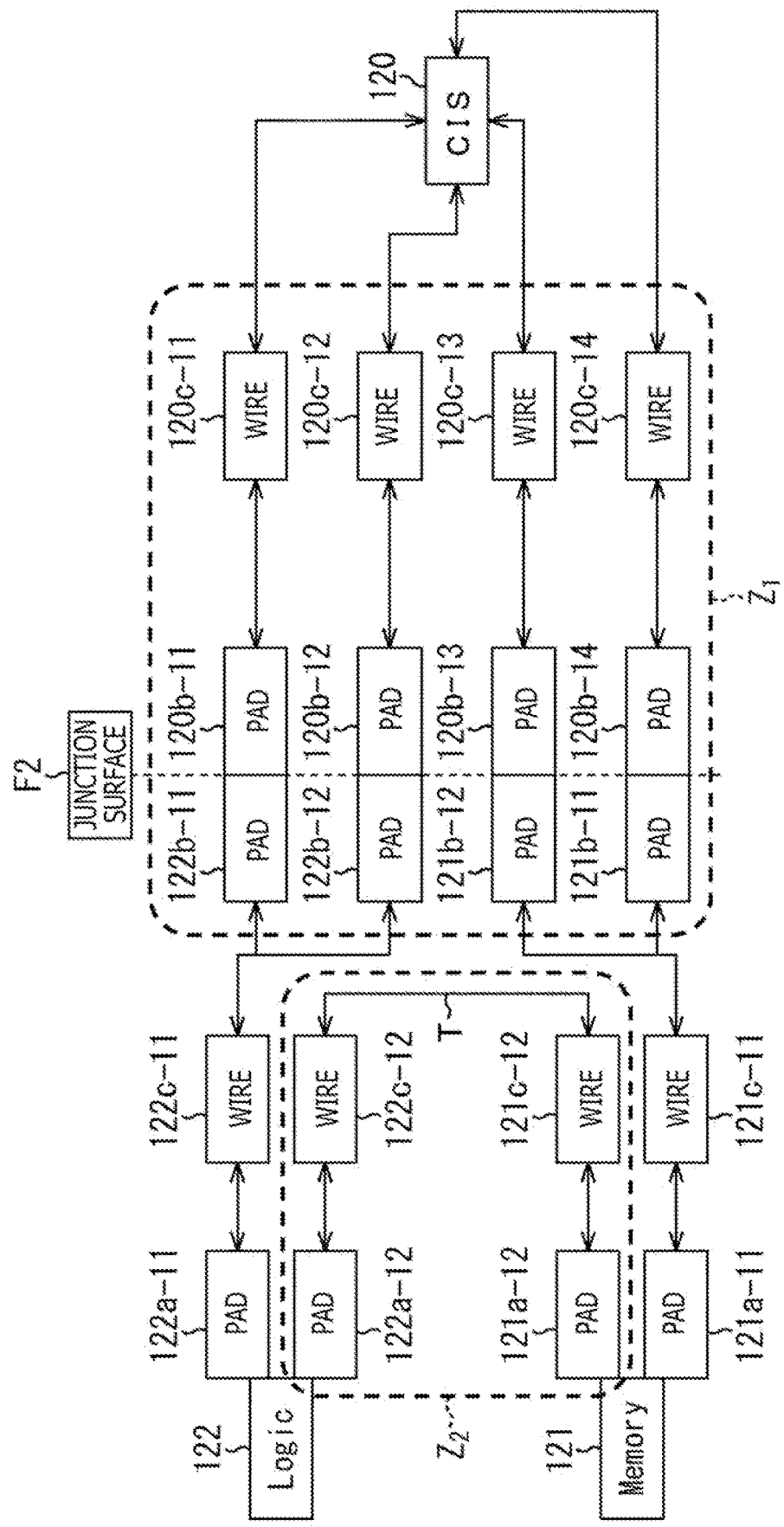
FIG. 13 is a figure for explaining a configuration around the communication wire between the memory circuit and the logic circuit in the solid-state image pickup apparatus in FIG. 12.

In addition, as depicted in FIG. 13, it becomes possible to electrically connect the memory circuit 121 and the logic circuit 122 directly by the communication wire T, without connecting them via the wires 120c of the solid-state image pickup element 120.

That is, as depicted in an area Z1 indicated by a dotted line in FIG. 13, it becomes unnecessary to form a communication wire or aggregate other wires for forming a communication wire in the solid-state image pickup element 120. Accordingly, it becomes possible to suppress a process increase of the solid-state image pickup element 120, and it becomes possible to enhance the yield.

In addition, because it is possible to suppress an increase of the distances of wiring paths, it becomes possible to suppress an increase of power consumption.

Further, the total area size of the memory circuit 121 and the logic circuit 122 is smaller than that of the solid-state image pickup element 120, and so it becomes possible to expand the wire pitch of 121c'-1 and 122c'-1 to the extent as allowed by the area size of the solid-state image pickup element 120 as depicted in FIG. 12, for example, by using unoccupied areas.

Thereby, by expanding the wire pitch in an area Z2 indicated by a dotted line in FIG. 13, the influence of defects is reduced. Accordingly, it becomes possible to enhance the yield, and it becomes possible to reduce the power consumption.

<Method of Manufacturing Solid-State Image Pickup Apparatus in FIG. 12>

Next, a method of manufacturing the solid-state image pickup apparatus 111 in FIG. 12 is explained with reference to a flowchart in FIG. 14, and side cross-sectional views in FIG. 15 to FIG. 22.

First, a method of manufacturing a logic circuit 122 is explained.

In a process in Step S11 (Logic_FEOL), a wiring pattern is formed on a board of each logic circuit 122 by FEOL (Front-End-Of-Line: board process) on the wafer 104 in FIG. 4, for example.

In a process in Step S12 (Logic_BEOL), wires are formed with a metal such as AL or Cu along the wiring pattern on the board of the logic circuit 122 by BEOL (Back-End-Of-Line: wiring process).

Figure 15:
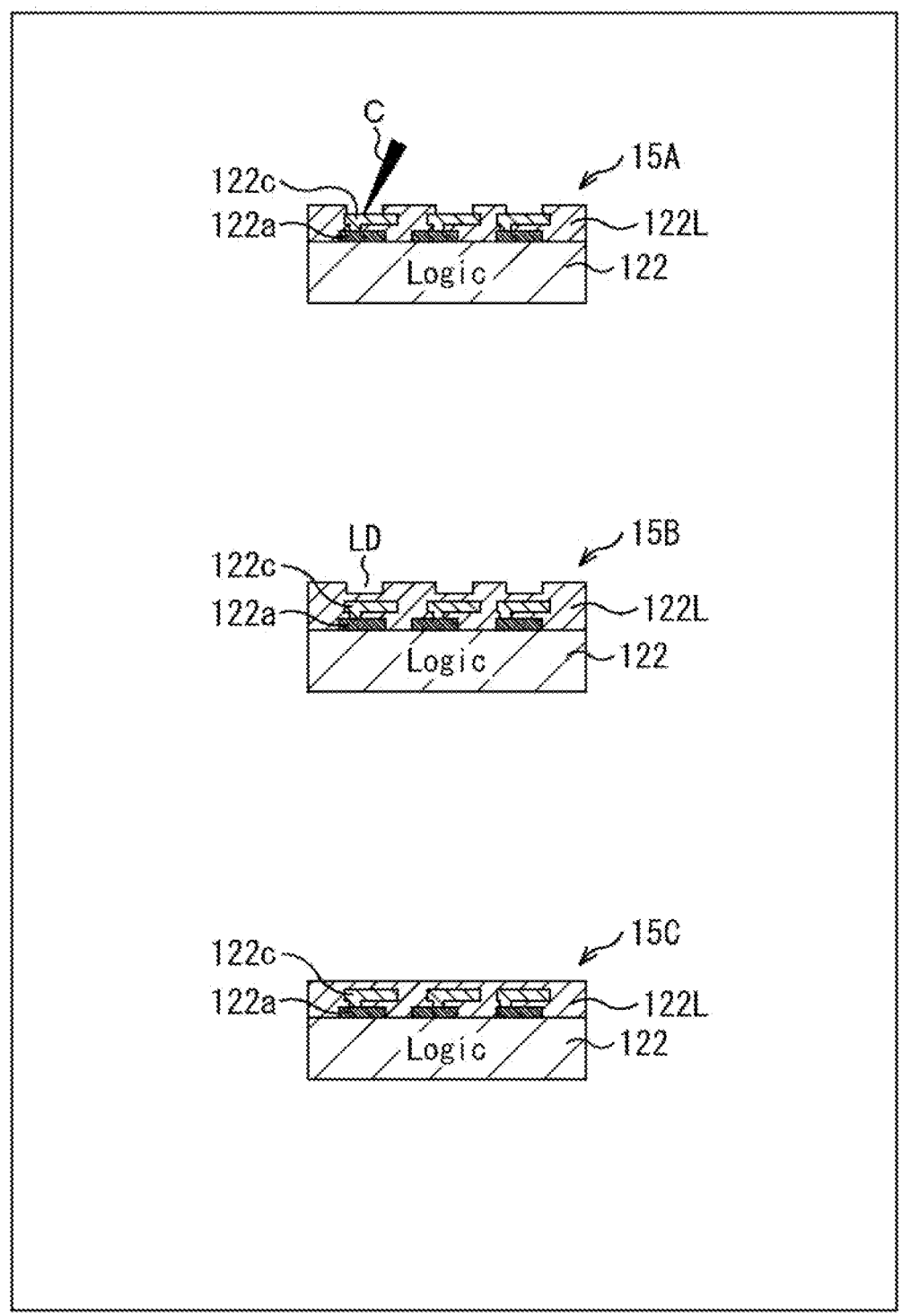
FIG. 15 is a figure for explaining the method of manufacturing the solid-state image pickup apparatus in FIG. 12.

In a process in Step S13 (Logic_Inspection (KGD)), as depicted in a side cross-sectional view 15A in FIG. 15, a measurement terminal C is used to perform an inspection of the wires (pads) 122c of the logic circuit 122, and on the basis of results of the inspection, a logic circuit 122 to be a good element is selected.

In a process in Step S14 (embed pad), as depicted in a side cross-sectional view 15B in FIG. 15, the wires (pads) 122c of the logic circuit 122 are embedded in a Si oxide film 122L by plasma CVD (Chemical Vapor Deposition).

In a process in Step S15 (flatten embedment), as depicted in a side cross-sectional view 15C in FIG. 15, embedment steps LD (see the side cross-sectional view 15B) formed with the Si oxide film 122L of the logic circuit 122 are polished and flattened by CMP (Chemical Mechanical Polishing).

In a process in Step S16 (Logic Dicing), logic circuits 122 on the wafer 104 are separated into pieces by dicing, and good elements are extracted.

As mentioned above, by the processes in Steps S11 to S16, the logic circuit 122 is manufactured.

Next, a method of manufacturing a memory circuit 121 is explained.

In a process in Step S21 (Memory_FEOL), a wiring pattern is formed on a board of each memory circuit 121 by FEOL (Front-End-Of-Line: board process) on the wafer 103 in FIG. 4, for example.

In a process in Step S22 (Memory_BEOL), wires are formed with a metal such as AL or Cu along the wiring pattern on the board of the memory circuit 121 by BEOL (Back-End-Of-Line: wiring process).

In a process in Step S23 (Memory_Inspection (KGD: Known Good Die)), as depicted in a side cross-sectional view 16A in FIG. 16, the measurement terminal C is used to perform an inspection of the wires (pads) 121c of the memory circuit 121, and on the basis of results of the inspection, a memory circuit 121 to be a good element is selected.

Figure 16:
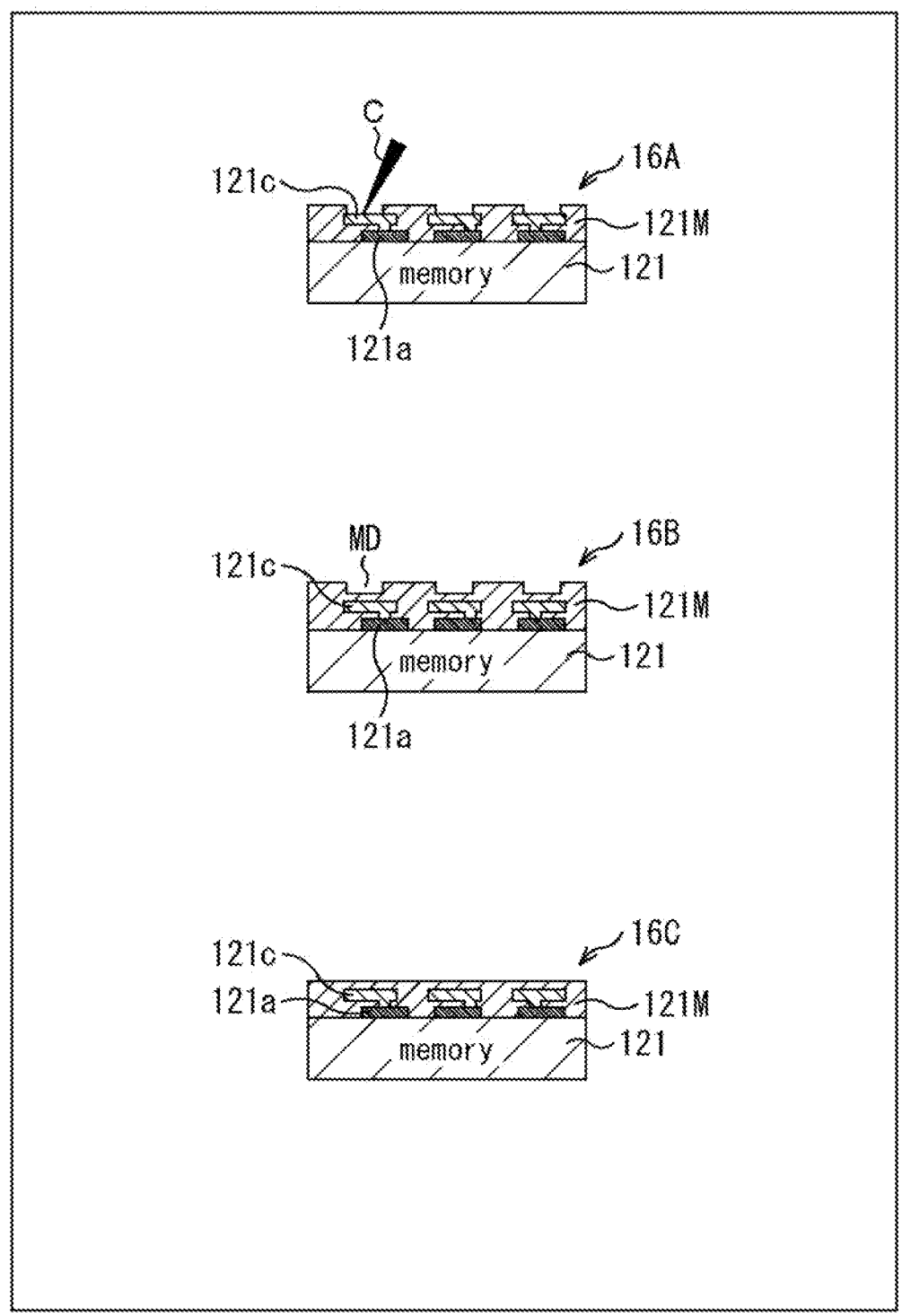
FIG. 16 is another figure for explaining the method of manufacturing the solid-state image pickup apparatus in FIG. 12.

In a process in Step S24 (embed pad), as depicted in a side cross-sectional view 16B in FIG. 16, the wires (pads) 121c of the memory circuit 121 are embedded in a Si oxide film 121M by plasma CVD (Chemical Vapor Deposition).

In a process in Step S25 (flatten embedment), as depicted in a side cross-sectional view 16C in FIG. 16, embedment steps MD (see the side cross-sectional view 16B) formed with the Si oxide film 121M of the memory circuit 121 are polished and flattened by CMP (Chemical Mechanical Polishing).

In a process in Step S26 (Memory_Dicing), logic circuits 122 on the wafer 103 are separated into pieces by dicing, and good elements are extracted.

As mentioned above, by the processes in Steps S21 to S26, the memory circuit 121 is manufactured.

Next, a process of re-arranging a manufactured memory circuit 121 and logic circuit 122 on the re-arrangement board 151 is explained.

Figure 17:
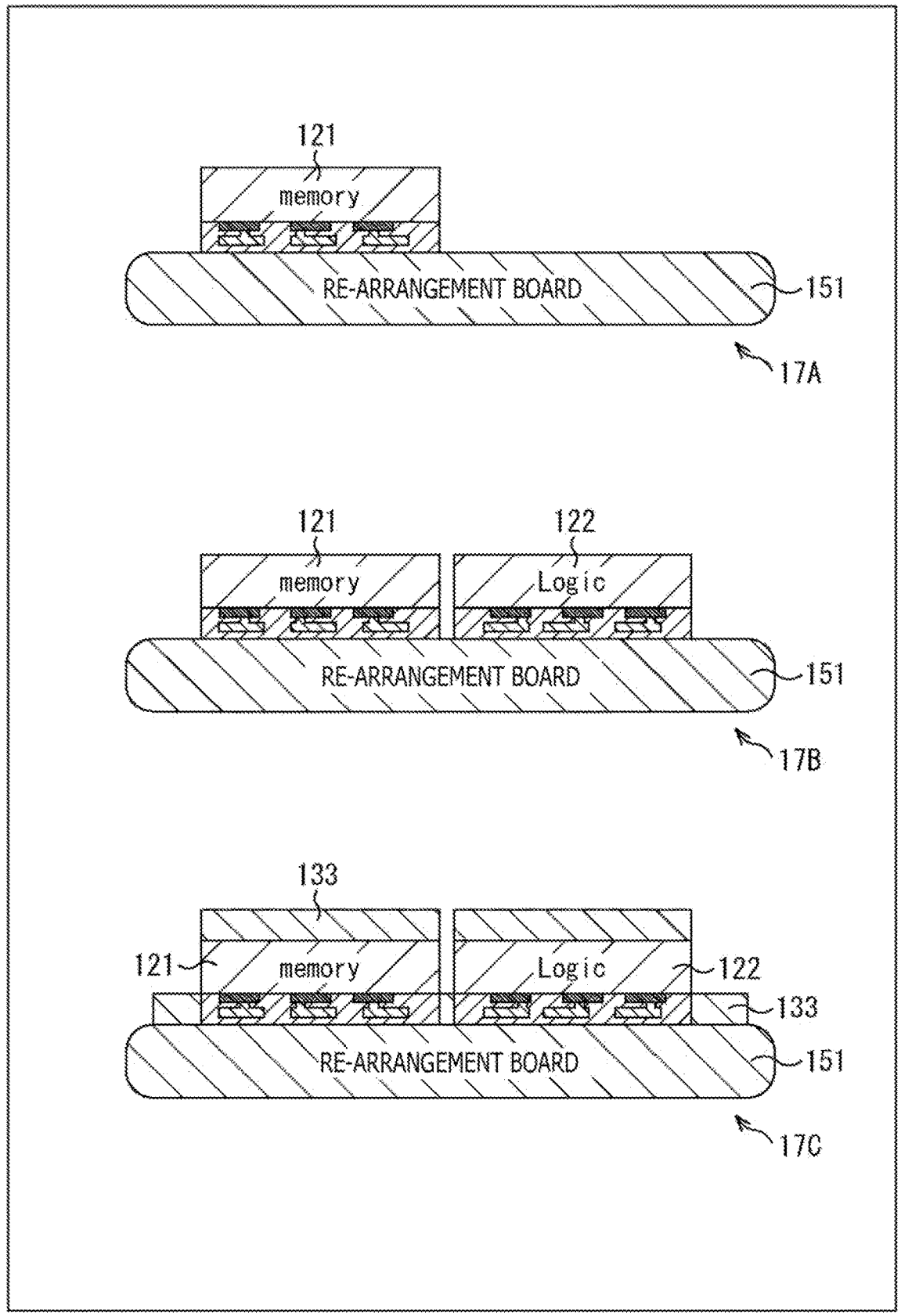
FIG. 17 is another figure for explaining the method of manufacturing the solid-state image pickup apparatus in FIG. 12.

In a process in Step S31 (Memory_die CoW), as depicted in a side cross-sectional view 17A in FIG. 17, a junction Si oxide film is formed on the re-arrangement board 151 by CVD, and the memory circuit 121 is temporarily connected such that a surface thereof provided with wires (pads) 121c abuts against the junction Si oxide film (Face down). Examples of the connection method for the temporary connection include oxide-film joining such as plasma joining.

In addition, for the temporary connection, a method other than oxide-film joining such as plasma joining may be used, and, for example, a commercially available temporary joint tape or the like may be used. Note that it becomes possible to enhance the connection quality by forming an alignment mark for each CoW in advance on the side of the re-arrangement board 151.

In a process in Step S32 (Logic_die CoW), as depicted in a side cross-sectional view 17B in FIG. 17, the logic circuit 122 is temporarily connected such that a surface thereof provided with wires (pads) 122c abuts against the re-arrangement board 151 (Face down).

In a process in Step S33 (embed die), as depicted in a side cross-sectional view 17C in FIG. 17, a gap between the memory circuit 121 and the logic circuit 122 is filled (partially) with the oxide film 133 by plasma CVD, and the diced memory circuit 121 and logic circuit 122 are fixed to the re-arrangement board 151.

In a process in Step S34 (make die thin), as depicted in a side cross-sectional view 18A in FIG. 18, Si boards of the diced memory circuit 121 and logic circuit 122 are made thin. More specifically, grinding is performed at high speed by a grinder, and CMP is performed for a surface quality improvement.

In a process in Step S35 (embed dei), as depicted in a side cross-sectional view 18B in FIG. 18, the oxide film 133 is formed until steps are filled again by plasma CVD or the like for the purpose of filling the gap between the memory circuit 121 and logic circuit 122 having been made thin.

In a process in Step S36 (embedment surface CMP), as depicted in a side cross-sectional view 18C in FIG. 18, a step KD formed on the surfaces of the memory circuit 121 and the logic circuit 122 is flattened by CMP. At this time, the memory circuit 121 and the logic circuit 122 are finished such that their Si film thicknesses are within the range approximately of 1 to 10 um.

By the processes up to this point, the memory circuit 121 and the logic circuit 122 are re-arranged on the re-arrangement board 151 and are embedded in the oxide film 133.

Next, a process in which the memory circuit 121 and the logic circuit 122 re-arranged on the re-arrangement board 151 are formed on the support board 132 is explained.

In a process in Step S41 (permanently join WoW), as depicted in a side cross-sectional view 19A in FIG. 19, the support board 132 on which a Si oxide film is formed is permanently joined by plasma joining on the memory circuit 121 and the logic circuit 122 re-arranged on the re-arrangement board 151.

In a process in Step S42 (debond re-arrangement board), as depicted in a side cross-sectional view 19B in FIG. 19, the re-arrangement board 151 is debonded and peeled.

Figure 20:
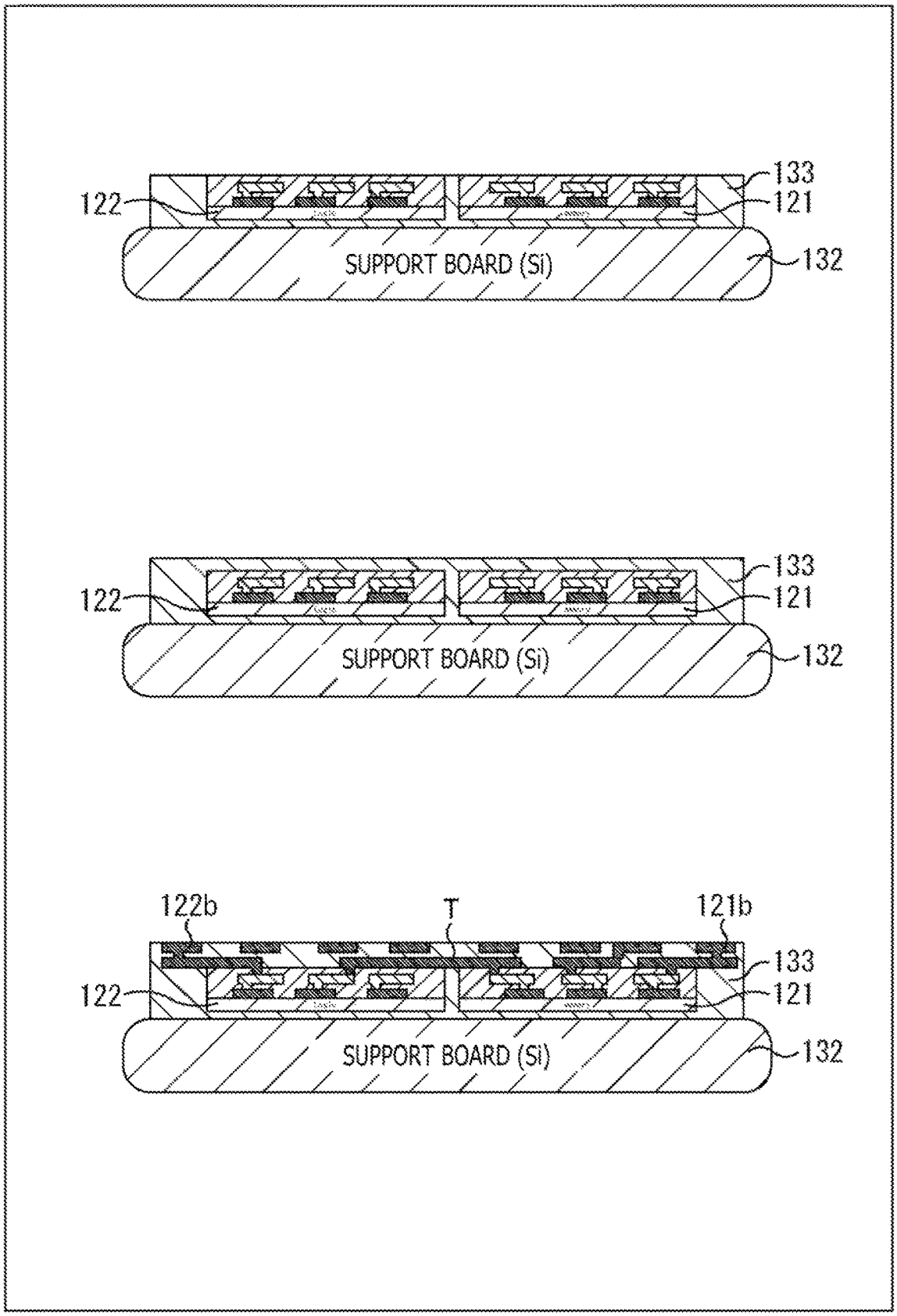
FIG. 20 is another figure for explaining the method of manufacturing the solid-state image pickup apparatus in FIG. 12.

In a process in Step S43 (form communication wire), as depicted in a side cross-sectional view 20B in FIG. 20, the oxide film 133 is further accumulated additionally. Then, as depicted in a side cross-sectional view 20C in FIG. 20, the communication wire T to connect the memory circuit 121 and the logic circuit 122 is formed.

In a process in Step S44 (form Cu—Cu connection wire (etc.)), as depicted in a side cross-sectional view 20C in FIG. 20, pads 121b and 122b for electrical connection with the solid-state image pickup element 120 are formed.

Figure 21:
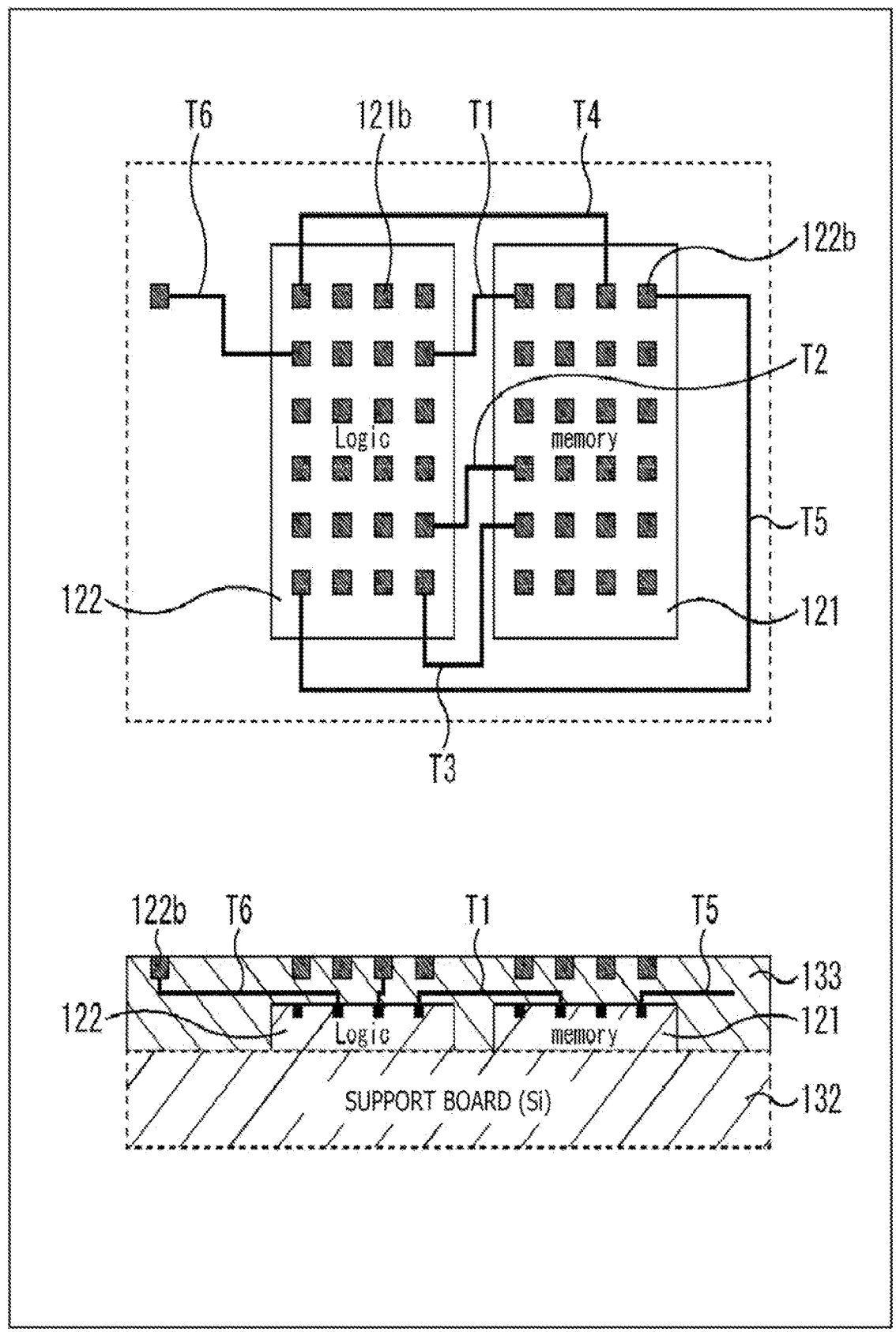
FIG. 21 is another figure for explaining the method of manufacturing the solid-state image pickup apparatus in FIG. 12.

Note that the communication wire T may include plural wires depending on the pitches of the pads 121b and 122b as represented by communication wires T1 to T5 as depicted in FIG. 21. In addition, as represented by the communication wires T3 to T5, the communication wires may be formed in an area outside the arrangement area of the memory circuit 121 and the logic circuit 122.

Further, the pads 121b and 122b may be formed on a grid in the area of the solid-state image pickup element 120 to be stacked thereafter. In addition, the communication wires may be connected to another circuit or the like other than the memory circuit 121 and the logic circuit 122 as represented by a communication wire T6 such that the memory circuit 121 or the logic circuit 122 is individually connected with another circuit.

Note that FIG. 21 includes a top view of the support board 132 on the upper half, and a side view of the support board 132 on the lower half. In addition, an area surrounded by a dotted line in the top view in FIG. 21 is an area on which the solid-state image pickup element 120 is to be stacked.

By the processes above, after the wafer on which the memory circuit 121 and the logic circuit 122 are re-arranged is formed, the memory circuit 121 and the logic circuit 122 are connected by the communication wire T, and further the pads 121b and 122b for connection with the solid-state image pickup element 120 are formed.

Next, the manufacturing of a solid-state image pickup element 120 is explained.

In a process in Step S51 (CIS_FEOL), a wiring pattern is formed on a board of each solid-state image pickup element 120 by FEOL (Front-End-Of-Line: board process) on the wafer 101 in FIG. 4, for example.

In a process in Step S52 (Logic_BEOL), wires are formed with a metal such as AL or Cu along the wiring pattern on the board of the solid-state image pickup element 120 by BEOL (Back-End-Of-Line: wiring process).

In a process in Step S53 (flatten embedment), although an illustration is omitted, the pads 120b of the solid-state image pickup element 120 are embedded in a Si oxide film by plasma CVD (Chemical Vapor Deposition), and embedment steps including the Si oxide film are polished and flattened by CMP (Chemical Mechanical Polishing).

Figure 22:
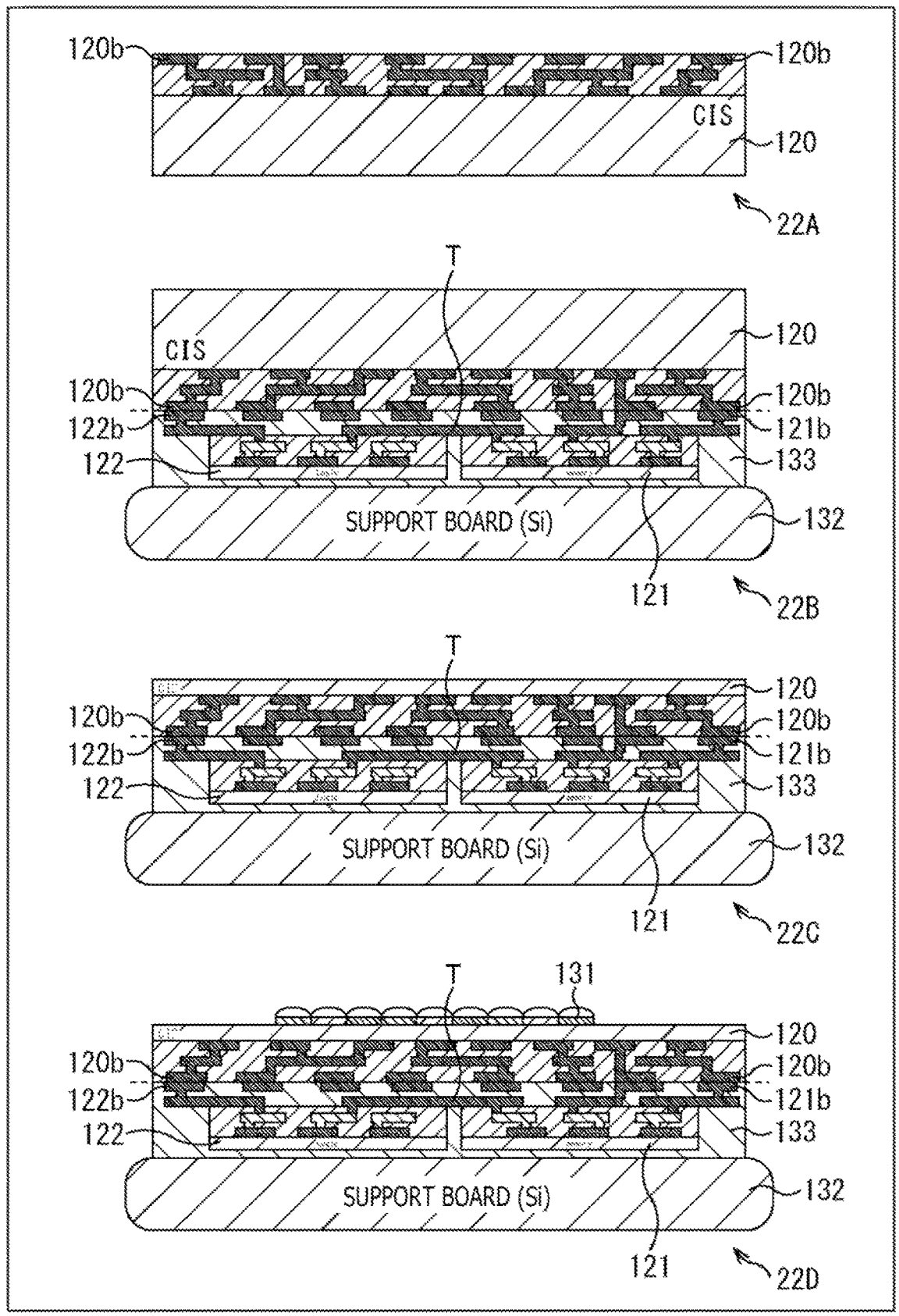
FIG. 22 is another figure for explaining the method of manufacturing the solid-state image pickup apparatus in FIG. 12.

In a process in Step S54 (form Cu—Cu connection wire (etc.)), as depicted in a side cross-sectional view 22A in FIG. 22, the pads 120b for electrical connection with the solid-state image pickup element 120 are formed, and the wafer 101 of the solid-state image pickup element 120 is completed.

As mentioned above, the solid-state image pickup element 120 is manufactured by the processes in Steps S51 to S54.

Next, a process in which the wafer 102 on which the memory circuit 121 and the logic circuit 122 are re-arranged, and in which the mutual communication wire T is formed, and the wafer 101 of the solid-state image pickup element 120 are joined to manufacture the solid-state image pickup apparatuses 111 is explained.

In a process in Step S61 (permanent (Cu—Cu joining WoW)), as depicted in a side cross-sectional view 22B in FIG. 22, the pads 120*b* of the solid-state image pickup element 120, and the pads 121*b* of the memory circuit and the pads 122*b* of the logic circuit 122 are CuCu-joined (direct joining).

In a process in Step S62 (backside CIS process), as depicted in a side cross-sectional view 22C in FIG. 22, the solid-state image pickup element 120 is made thin, and a protective film is formed. Thereafter, as depicted in a side cross-sectional view 22D of FIG. 22, the color filters and on-chip lenses pixels 131 are formed.

With the series of processes above, the solid-state image pickup apparatus 111 in FIG. 12 formed with the communication wire of the memory circuit 121 and the logic circuit 122 not going through the solid-state image pickup element 120 is manufactured.

Because, as a result, it becomes unnecessary to form a communication wire that goes through the solid-state image pickup element 120, it becomes possible to suppress a process increase in the manufacturing of the solid-state image pickup element 120, and it becomes possible to enhance the yield.

In addition, because the degree of freedom of the placement of wires is enhanced, it becomes possible to make wire lengths short and to increase wires, and it becomes possible to stabilize power supplies, and to reduce power consumption.

Further, the degree of freedom of the formation of light-blocking films for measures against hot carrier is improved.

In addition, because it becomes possible to place communication wires around in an area as larger as or larger than the area size of the solid-state image pickup element 120, it becomes possible to expand wire pitches, and it becomes possible to suppress the deterioration of the yield.

Further, it becomes unnecessary to aggregate wires, and the wire density is reduced. Accordingly, the electrical resistance can be lowered, and so it becomes possible to attempt to reduce the power consumption.

4. Application Example of Second Embodiment

While in the example explained above, the communication wire T of the memory circuit 121 and the logic circuit 122 is formed in the semiconductor element layer E2, and on a side of the boundary with the solid-state image pickup element 120, it may be formed in another area as long as it is possible to join the memory circuit 121 and the logic circuit 122.

For example, the communication wire may be formed in the semiconductor element layer E2, and on a side of the boundary with the support board 132.

Figure 23:
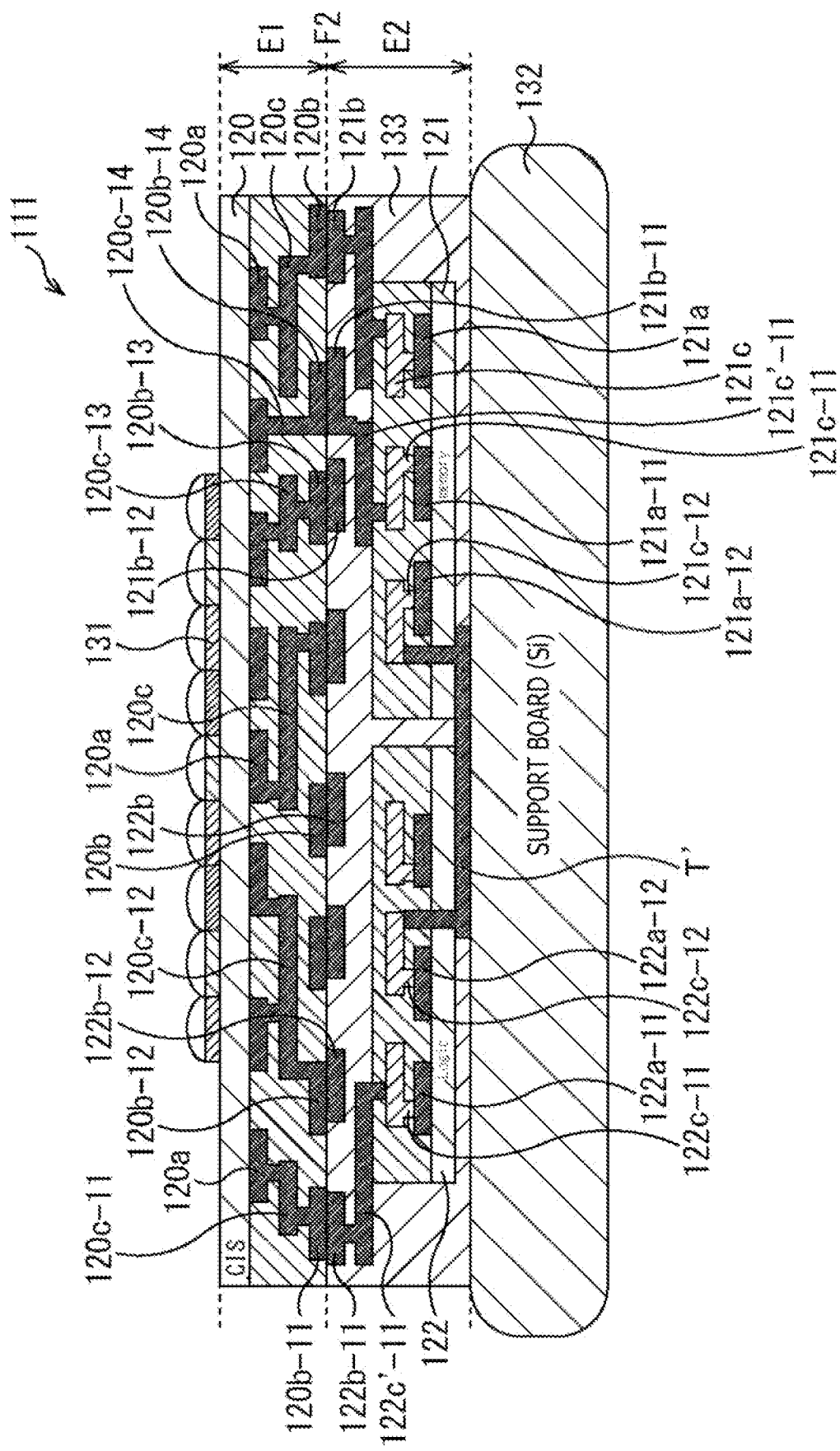
FIG. 23 is a figure for explaining an application example of the solid-state image pickup apparatus according to the second embodiment of the present disclosure.

FIG. 23 depicts the solid-state image pickup apparatus 111 in which a communication wire T' is formed in the semiconductor element layer E2, and on a side of the boundary with the support board 132.

In the case of the solid-state image pickup apparatus 111 in FIG. 23 also, it becomes possible to attain effects similar to the effects attained with the solid-state image pickup apparatus 111 in FIG. 12 having the communication wire T formed therein.

Note that the solid-state image pickup apparatus 111 in FIG. 23 is similar to the solid-state image pickup apparatus 111 in FIG. 12 in other respects than that the communication wire T' is formed in the memory circuit 121 and the logic circuit 122, and on a side of the boundary with the support board 132, and so an explanation regarding a method of manufacturing the solid-state image pickup apparatus 111 in FIG. 23 is omitted.

5. Third Embodiment

In the explanation above, the connections between the solid-state image pickup element 120, and the memory circuit 121 and the logic circuit 122 are formed between wires CuCu-joined with the pads 120*b* and the pads 121*b* and 122*b* connected at a junction surface F2.

However, because it is sufficient as long as the solid-state image pickup element 120, and the memory circuit 121 and the logic circuit 122 are electrically connected, they may be connected by another method.

Electrical connections between the solid-state image pickup element 120, and the memory circuit 121 and the logic circuit 122 may go through through-electrodes TCV (Through Chip Via), for example.

Figure 24:
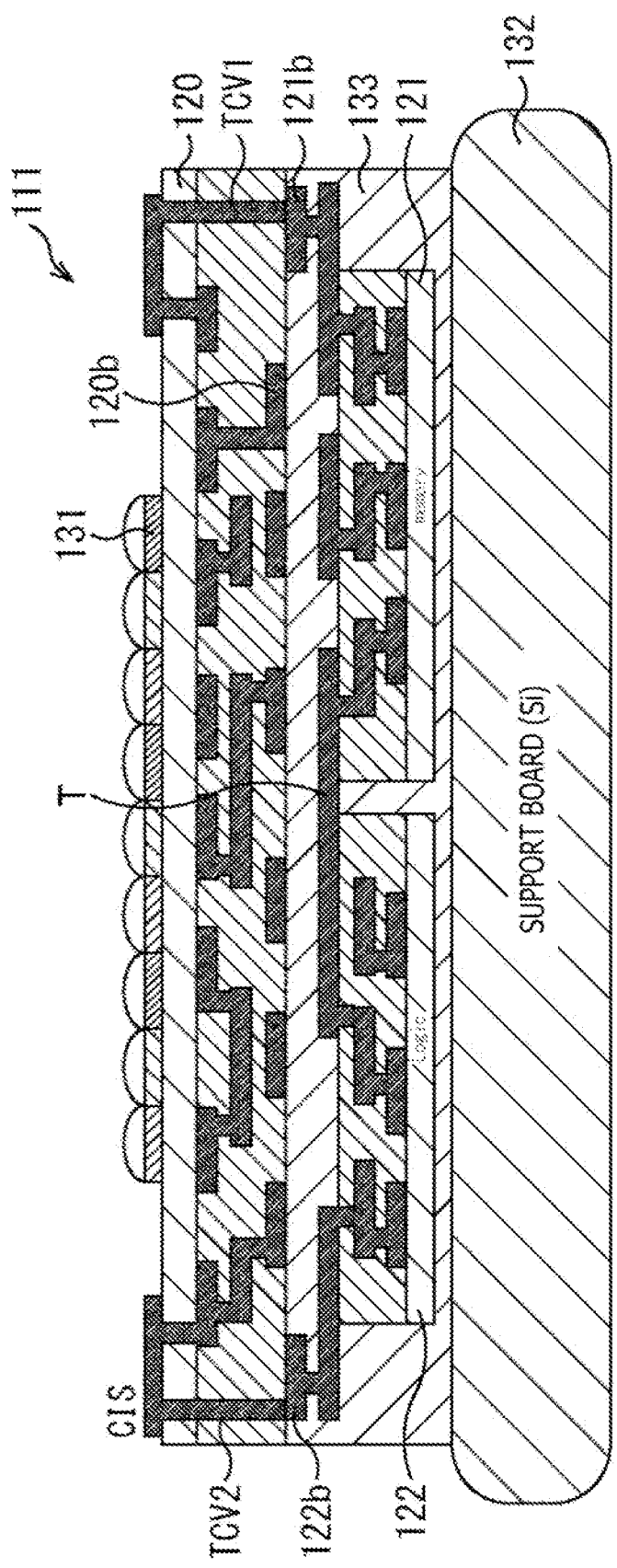
FIG. 24 is a figure for explaining a configuration example of the solid-state image pickup apparatus according to a third embodiment of the present disclosure.

That is, in the solid-state image pickup apparatus 111 in FIG. 24, the solid-state image pickup element 120, and the memory circuit 121 are connected by a through-electrode TCV1, and the solid-state image pickup element 120 and the logic circuit 122 are connected by a through-electrode TCV2. The through-electrodes TCV1 and TCV2 include Cu, and insulating films are formed on surfaces thereof.

More specifically, the memory circuit 121 is provided with a pad 121*b* to be connected with the through-electrode TCV1, and the logic circuit 122 is provided with a pad 122*b* to be connected with the through-electrode TCV2.

In addition, the pad 121*b* of the memory circuit 121, and the pad 122*b* of the logic circuit 122 are formed when the communication wire T is formed.

With such a configuration, processes of forming the pad 120*b* in the solid-state image pickup element 120, the pad 121*b* of the memory circuit 121 and the pad 122*b* of the logic circuit 122 can be omitted, and so it becomes possible to reduce the yield.

In addition, because wires can be placed in spaces in which the pad 120*b* in the solid-state image pickup element 120, the pad 121*b* of the memory circuit 121 and the pad 122*b* of the logic circuit 122 are provided, it becomes possible to reduce the resistance of wires, and to reduce the power consumption.

<Method of Manufacturing Solid-State Image Pickup Apparatus in FIG. 24>

Next, a method of manufacturing the solid-state image pickup apparatus 111 in FIG. 24 is explained with reference to a flowchart in FIG. 25.

Figure 14:
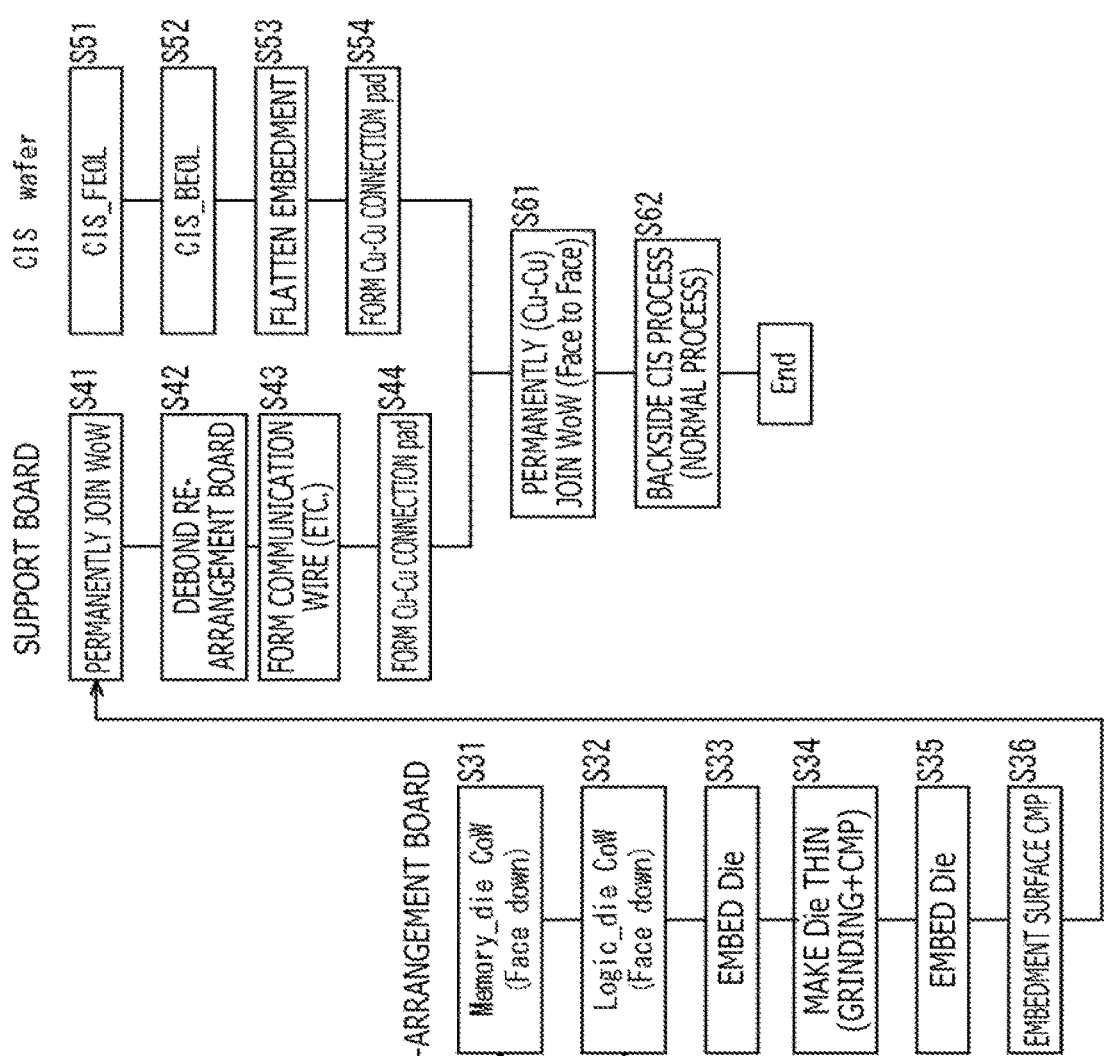
FIG. 14 is a flowchart for explaining a method of manufacturing the solid-state image pickup apparatus in FIG. 12.
Figure 25:
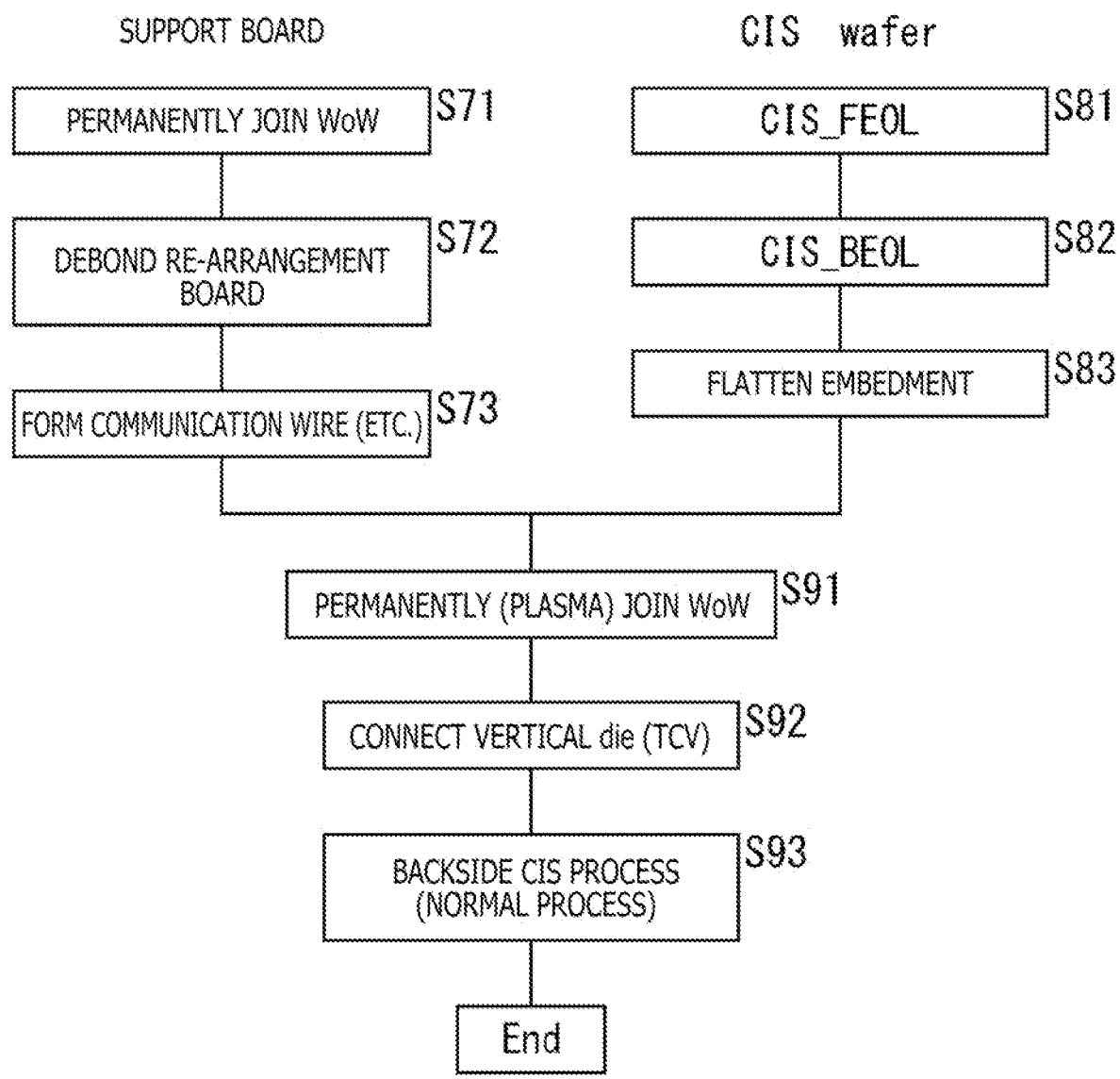
FIG. 25 is a flowchart for explaining a method of manufacturing the solid-state image pickup apparatus in FIG. 24.

Note that the processes of manufacturing the memory circuit 121, the logic circuit 122, and the re-arrangement board 151 are similar to those in the flowchart in FIG. 14, and so are omitted in the flowchart in FIG. 25.

In addition, the processes in Steps S71, S72, S81 to S83, S91, and S93 in FIG. 25 are similar to the processes in Steps S41, S42, S51 to S53, S61, and S62 explained with reference to FIG. 14, and so explanations thereof are omitted.

That is, in the flowchart in FIG. 25, the communication wire T is formed in a process in Step S73 (form communication wire (etc.)). At this time, the pad 121*b* of the memory circuit 121, and the pad 122*b* of the logic circuit 122 for the connection with the through-electrodes TCV1 and TCV2 are formed at positions corresponding to the through-electrodes TCV1 and TCV2.

Then, in a process in Step S92 (connect vertical die (TCV)), through-holes are formed at the positions of the through-electrodes TCV1 and TCV2 in FIG. 24 through the Si board of the solid-state image pickup element 120, and thereafter the through-holes are filled with Cu, and formed as electrodes.

With such a process, the solid-state image pickup apparatus 111 in FIG. 24 is manufactured.

In addition, because wires can be placed in spaces in which the pad 120b in the solid-state image pickup element 120, the pad 121b of the memory circuit 121, and the pad 122b of the logic circuit 122 are provided, it becomes possible to reduce the resistance of wires, and to reduce the power consumption.

6. Fourth Embodiment

While in the example explained above, the junction surface F2 is formed in a state in which the wiring layer side of the memory circuit 121 and the logic circuit 122, and the wiring layer side of the solid-state image pickup element 120 are facing each other, through-electrodes may be formed on a surface (a surface on the side of the Si board) opposite to the wiring layers of the memory circuit 121 and the logic circuit 122, and joined with the solid-state image pickup element 120.

Figure 26:
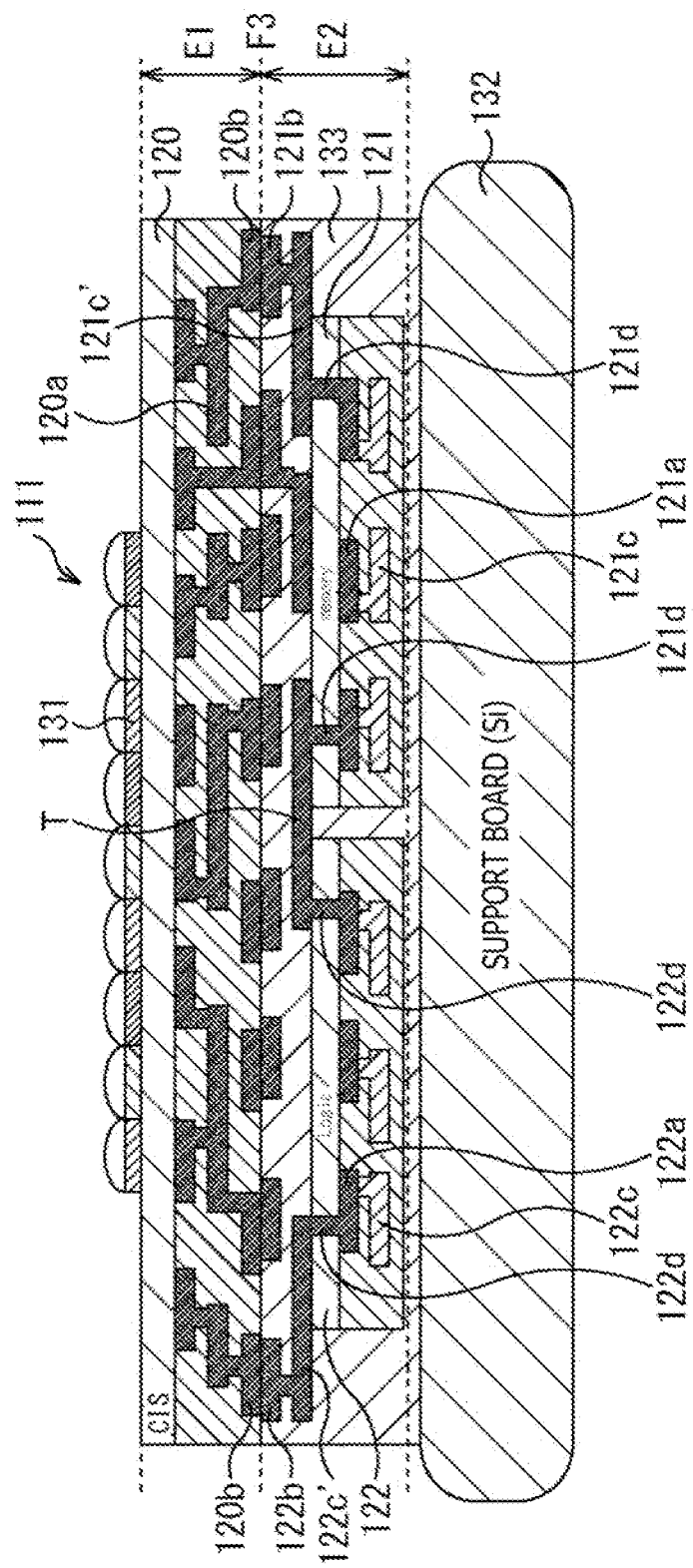
FIG. 26 is a figure for explaining a configuration example of the solid-state image pickup apparatus according to a fourth embodiment of the present disclosure.

FIG. 26 depicts the solid-state image pickup apparatus 111 in which through-electrodes TSV (Through Silicon Via) are formed on a surface opposite to the wiring layers of the memory circuit 121 and the logic circuit 122, and joined with the solid-state image pickup element 120.

That is, the solid-state image pickup apparatus 111 in FIG. 26 is different from the solid-state image pickup apparatus 111 in FIG. 12 in that the memory circuit 121 and the logic circuit 122 are vertically reversed in the figure, and have through-electrodes 121d and 122d formed on the backsides thereof (the Si-board sides thereof to be the top surfaces in FIG. 26), and wires 121c' and 122c' are connected to the pads 121b and 122b via through-electrodes (TSV).

With such a configuration, it becomes possible to attain effects similar to the effects attained with the solid-state image pickup apparatus 111 in the first embodiment.

<Method of Manufacturing Solid-State Image Pickup Apparatus in FIG. 26>

Next, a method of manufacturing the solid-state image pickup apparatus 111 in FIG. 26 is explained with reference to a flowchart in FIG. 27, and side cross-sectional views in FIG. 28 to FIG. 32.

Figure 27:
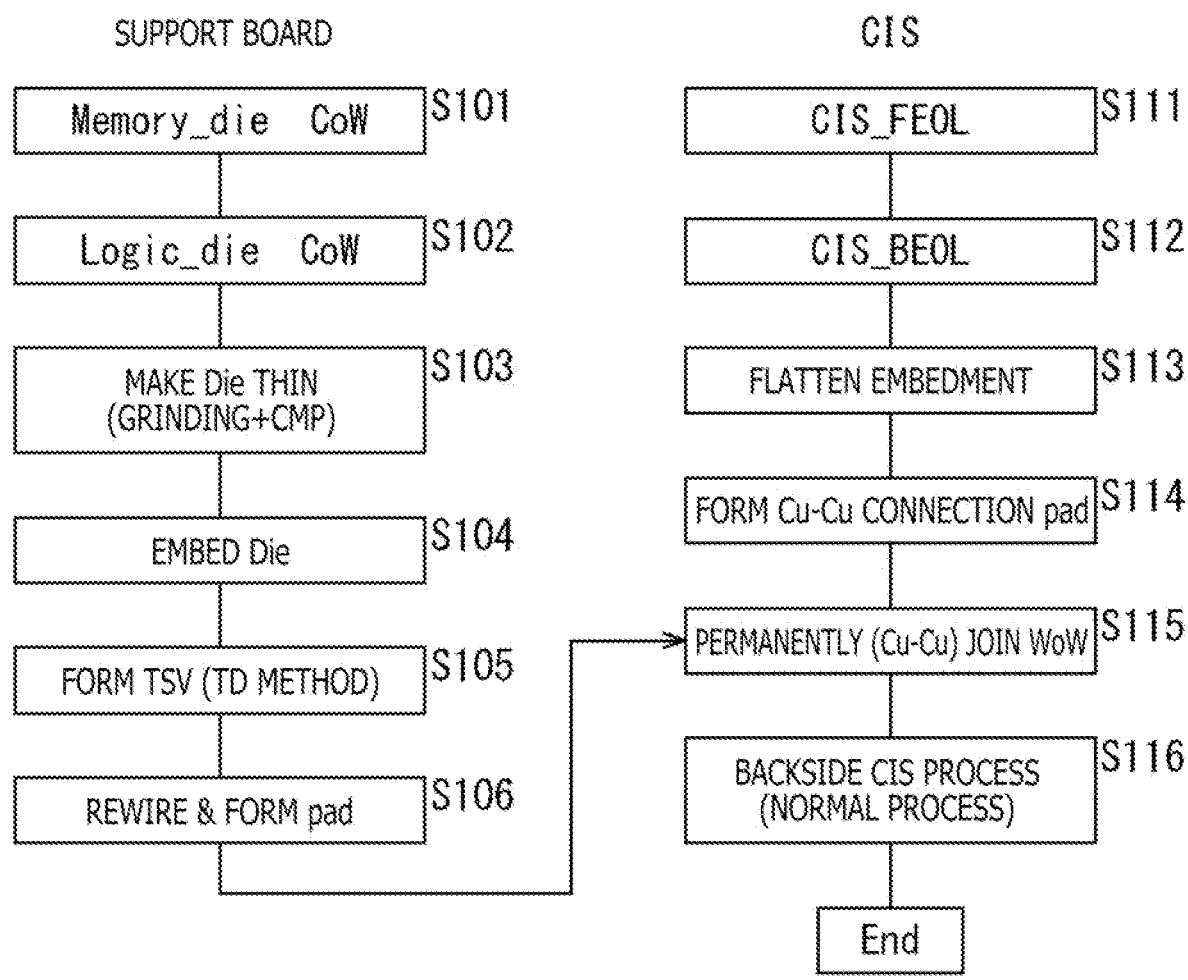
FIG. 27 is a flowchart for explaining a method of manufacturing the solid-state image pickup apparatus in FIG. 26.

Note that, in the flowchart in FIG. 27, the processes of manufacturing the memory circuit 121 and the logic circuit 122 are similar to Steps S11 to S16, and Steps S21 to S26 in the flowchart in FIG. 14, and so explanations thereof are omitted.

In addition, the processes in Steps S111 to S114 which are the processes of manufacturing the solid-state image pickup element 120 are similar to the processes in Steps S51 to S54 in FIG. 14, and so explanations thereof are omitted.

Further, because the re-arrangement board 151 is not used as described below, there are no processes related to the re-arrangement board 151.

Figure 28:
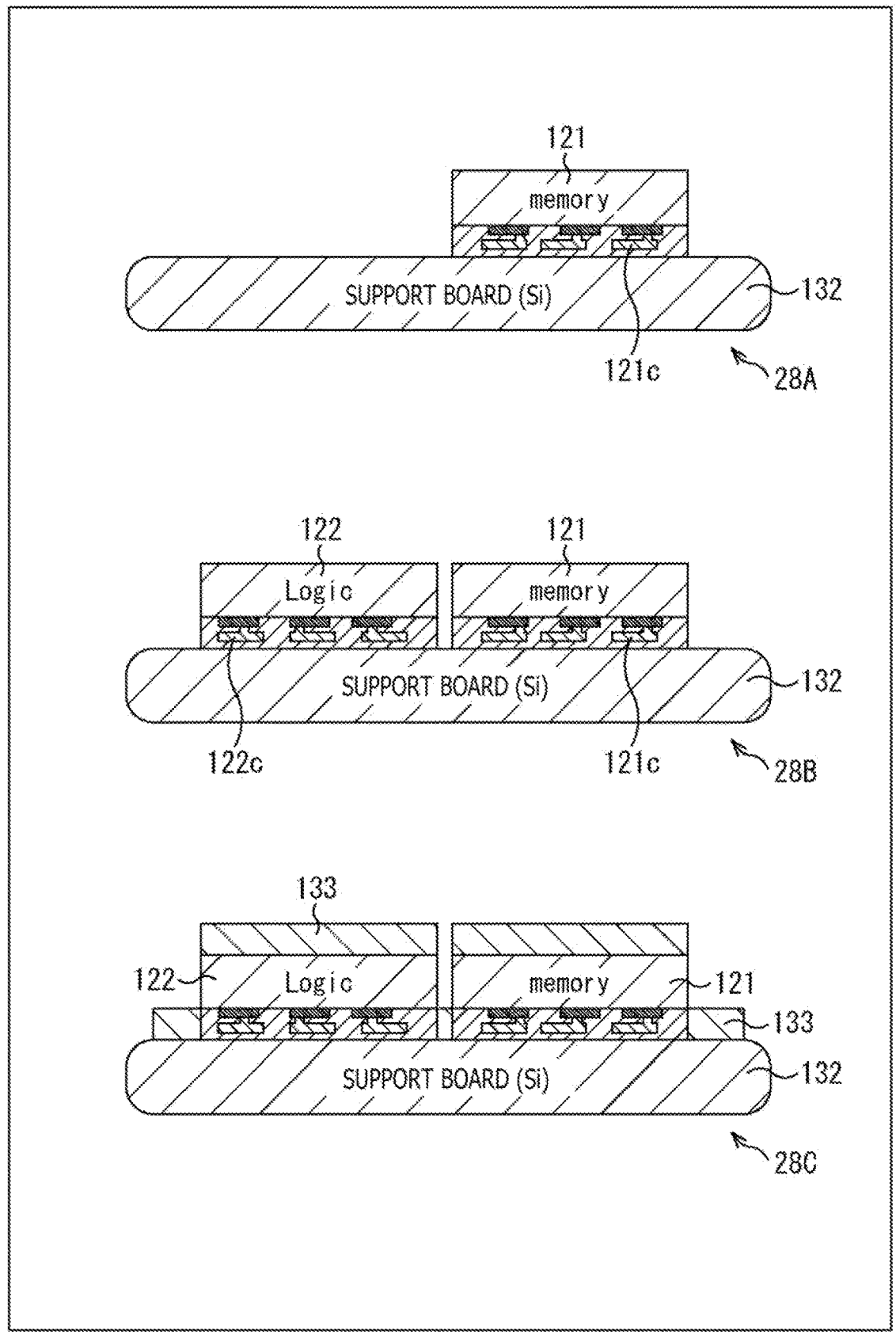
FIG. 28 is a figure for explaining the method of manufacturing the solid-state image pickup apparatus in FIG. 26.

That is, in a process in Step S101 (Memory_die CoW), as depicted in a side cross-sectional view 28A in FIG. 28, a junction Si oxide film is formed on the support board 132 by CVD, and the memory circuit 121 is connected such that a surface thereof provided with wires (pads) 121c abuts against the junction Si oxide film (Face down). Examples of the connection method include oxide-film joining such as plasma joining.

In addition, for the connection, a method other than oxide-film joining such as plasma joining may be used, and, for example, a commercially available temporary joint tape or the like may be used. Note that it becomes possible to enhance the connection quality by forming an alignment mark for each CoW in advance on the side of the re-arrangement board 151.

In a process in Step S102 (Logic_die CoW), as depicted in a side cross-sectional view 28B in FIG. 28, the logic circuit 122 is connected such that a surface thereof provided with wires 122c abuts against the support board 132 (Face down).

In a process in Step S103 (make die thin), as depicted in a side cross-sectional view 28C in FIG. 28, a gap between the memory circuit 121 and the logic circuit 122 is filled (partially) with the oxide film 133 by plasma CVD, and the diced memory circuit 121 and logic circuit 122 are fixed to the support board 132.

Further, as depicted in a side cross-sectional view 29A in FIG. 29, Si boards of the diced memory circuit 121 and logic circuit 122 are made thin. More specifically, grinding is performed at high speed by a grinder, and CMP is performed for a surface quality improvement.

In a process in Step S104 (embed dei), as depicted in a side cross-sectional view 29B in FIG. 29, the oxide film 133 is formed until steps are filled again by plasma CVD or the like for the purpose of filling the gap between the memory circuit 121 and logic circuit 122 having been made thin.

Further, as depicted in a side cross-sectional view 29C in FIG. 29, a step KD formed on the surfaces of the memory circuit 121 and the logic circuit 122 is flattened by CMP. At this time, the memory circuit 121 and the logic circuit 122 are finished such that their Si film thicknesses are within the range approximately of 1 to 10 um.

By the processes up to this point, the memory circuit 121 and the logic circuit 122 are re-arranged on the support board 132 and are embedded in the oxide film 133.

In a process in Step S105 (rewire & form pad), plasma SiO2 is formed such that the thickness becomes approximately 100 to 1500 nm for the purpose of insulating the Si films of the memory circuit 121 and the logic circuit 122 after CMP.

Subsequently, as depicted in a side cross-sectional view 30A in FIG. 30, groove sections 121e, 122e, and Te corresponding to wires to connect the memory circuit 121 and the logic circuit 122 are formed by resist patterning and oxide film dry etching.

At this time, the groove sections 121e, 122e, and Te are formed down to depths that do not reach Si of the memory circuit 121 and the logic circuit 122.

Figure 30:
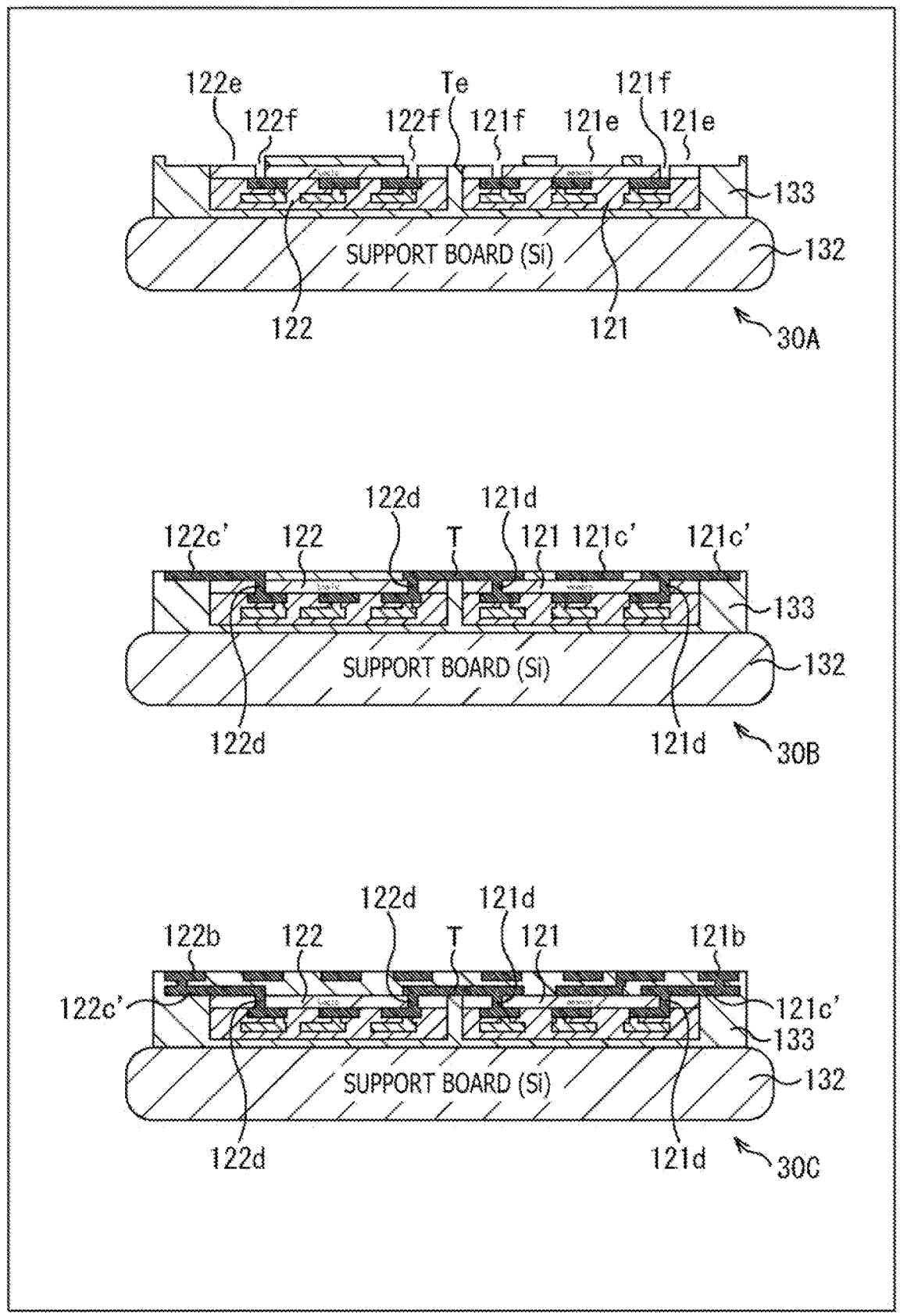
FIG. 30 is another figure for explaining the method of manufacturing the solid-state image pickup apparatus in FIG. 26.

Further, as depicted in a side cross-sectional view 30A in FIG. 30, through-holes 121f and 122f are formed as openings to reach depths immediately before reaching copper wires of the lowermost layer in the multi-layer wiring layer, or as openings to reach depths immediately before reaching Al pads at the uppermost layer, such that the through-holes 121f and 122f penetrate Si of the memory circuit 121 and the logic circuit 122 from the areas of the groove sections 121e and 122e formed in the manner described above. The diameters of the through-holes 121f and 122f are approximately 1 to 5 um, for example.

In addition, insulating films including SiO2 are formed on the side walls of Si exposed as a result of the processing described above, and thereafter an etch-back process is performed to thereby eliminate SiO2 formed as protective films of bottom sections of the through-holes 121f and 122f, and make the wiring layers of the memory circuit 121 and the logic circuit 122 exposed.

Then, as depicted in a side cross-sectional view 30B in FIG. 30, after a barrier metal is formed, a metal such as Cu is embedded in the through-holes 121*f* and 122*f*, the surfaces are polished by CMP (Chemical Mechanical Polishing), and only the conductive materials of the groove sections 121*e*, 122*e*, and Te and the through-holes 121*f* and 122*f* are left.

Thereby, the communication wire T that connects the memory circuit 121 and the logic circuit 122, and lead wires 121*c'* and 122*c'* from the through-electrodes 121*d* and 122*d* of the memory circuit 121 and the logic circuit 122 are formed in areas in the insulating spacer layer.

Further, as depicted in a side cross-sectional view 30C in FIG. 30, the pads 121*b* and 122*b* for CuCu-joining (hybrid joining) with the solid-state image pickup element 120 are formed.

Figure 31:
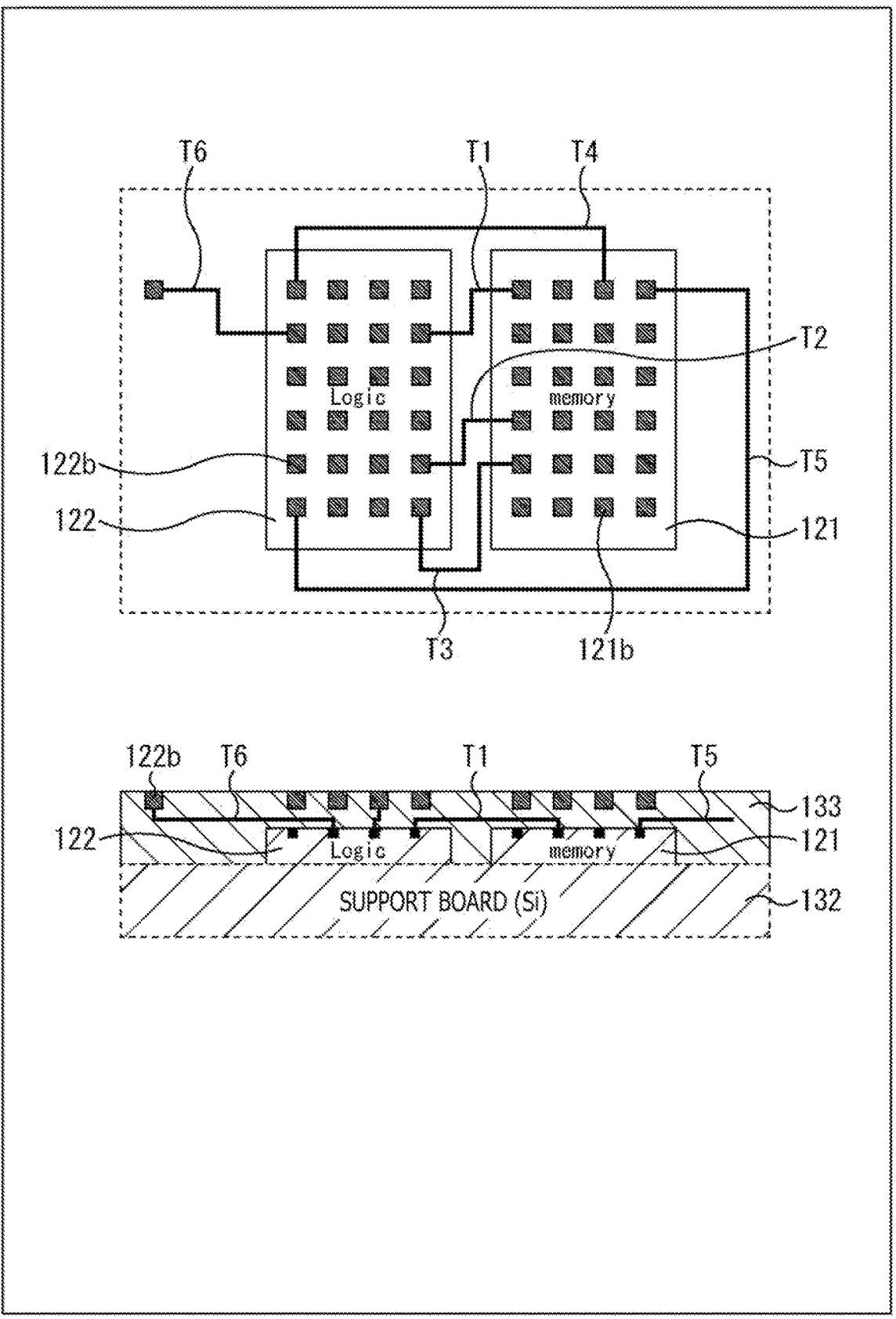
FIG. 31 is another figure for explaining the method of manufacturing the solid-state image pickup apparatus in FIG. 26.

Note that the communication wire T may include plural wires depending on the pitches of the pads 121*b* and 122*b* as represented by the communication wires T1 to T5 in FIG. 31. In addition, as represented by the communication wires T3 to T5, the communication wires may be formed in an area that is in the arrangement area of the solid-state image pickup element 120, and outside the arrangement area of the memory circuit 121 and the logic circuit 122.

Further, the pads 121*b* and 122*b* may be formed on a grid in the area of the solid-state image pickup element 120 to be stacked thereafter. In addition, the communication wires may be connected to another circuit or the like other than the memory circuit 121 and the logic circuit 122 as represented by the communication wire T6 such that the memory circuit 121 or the logic circuit 122 is individually connected with another circuit.

Note that FIG. 31 includes a top view of the support board 132 on the upper half, and a side view of the support board 132 on the lower half. In addition, an area surrounded by a dotted line in the top view in FIG. 31 is an area on which the solid-state image pickup element 120 is to be stacked.

By the processes above, after the wafer on which the memory circuit 121 and the logic circuit 122 are re-arranged is formed, the memory circuit 121 and the logic circuit 122 are connected by the communication wire T, and further the pads 121*b* and 122*b* for connection with the solid-state image pickup element 120 are formed.

Figure 32:
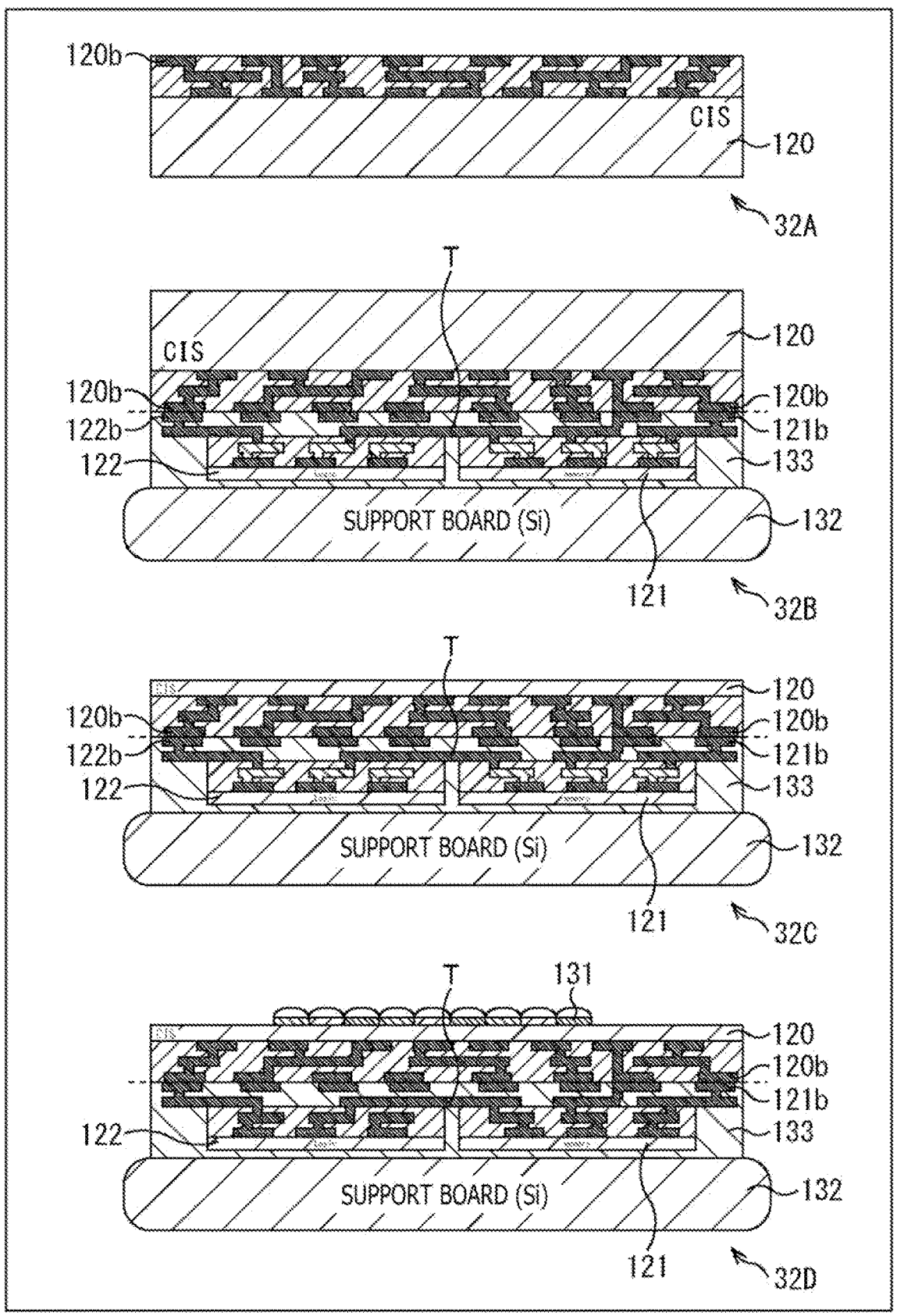
FIG. 32 is another figure for explaining the method of manufacturing the solid-state image pickup apparatus in FIG. 26.

In addition, in processes in Step S111 to Step S114 (form Cu—Cu connection wire (etc.)), as depicted in a side cross-sectional view 32A in FIG. 32, the pads 120*b* for electrical connection with the pads 121*b* and 122*b* of the memory circuit 121 and the logic circuit 122 are formed, and the wafer 101 of the solid-state image pickup element 120 is completed.

Then, in a process in Step S115 (permanent (Cu—Cu joining WoW)), as depicted in a side cross-sectional view 32B in FIG. 32, the pads 120*b* of the solid-state image pickup element 120, and the pads 121*b* of the memory circuit and the pads 122*b* of the logic circuit 122 are CuCu-joined (direct joining).

In a process in Step S116 (backside CIS process), as depicted in a side cross-sectional view 32C in FIG. 32, the solid-state image pickup element 120 is made thin, and a protective film is formed. Thereafter, as depicted in a side cross-sectional view 32D of FIG. 32, the color filters and on-chip lenses 130 are formed.

With the series of processes above, the solid-state image pickup apparatus 111 in FIG. 12 formed with the communication wire of the memory circuit 121 and the logic circuit 122 not going through the solid-state image pickup element 120 is manufactured.

Because, as a result, it becomes unnecessary to form a communication wire that goes through the solid-state image pickup element 120, it becomes possible to suppress a process increase in the manufacturing of the solid-state image pickup element 120, and it becomes possible to reduce the occurrence of the yield.

In addition, because the degree of freedom of the placement of wires is enhanced, it becomes possible to make wire lengths short and to increase wires, and it becomes possible to stabilize power supplies, and to reduce power consumption.

Further, the degree of freedom of the formation of light-blocking films for measures against hot carrier is improved.

In addition, because it becomes possible to place communication wires around in an area as large as or larger than the area size of the solid-state image pickup element 120, it becomes possible to expand wire pitches, and it becomes possible to suppress the deterioration of the yield.

Further, it becomes unnecessary to aggregate wires, and the wire density is reduced. Accordingly, the electrical resistance can be lowered, and so it becomes possible to attempt to reduce the power consumption.

7. Fifth Embodiment

While in the example explained above, a wiring layer is formed in each of the memory circuit 121, the logic circuit 122, and the solid-state image pickup element 120, and the junction surface F2 is formed in a state in which the memory circuit 121, the logic circuit 122, and the solid-state image pickup element 120 are facing one another, further a wiring layer may be formed also on the support board 132, and a communication wire between the memory circuit 121 and the logic circuit 122 may be formed on the wiring layer on the support board 132.

Figure 33:
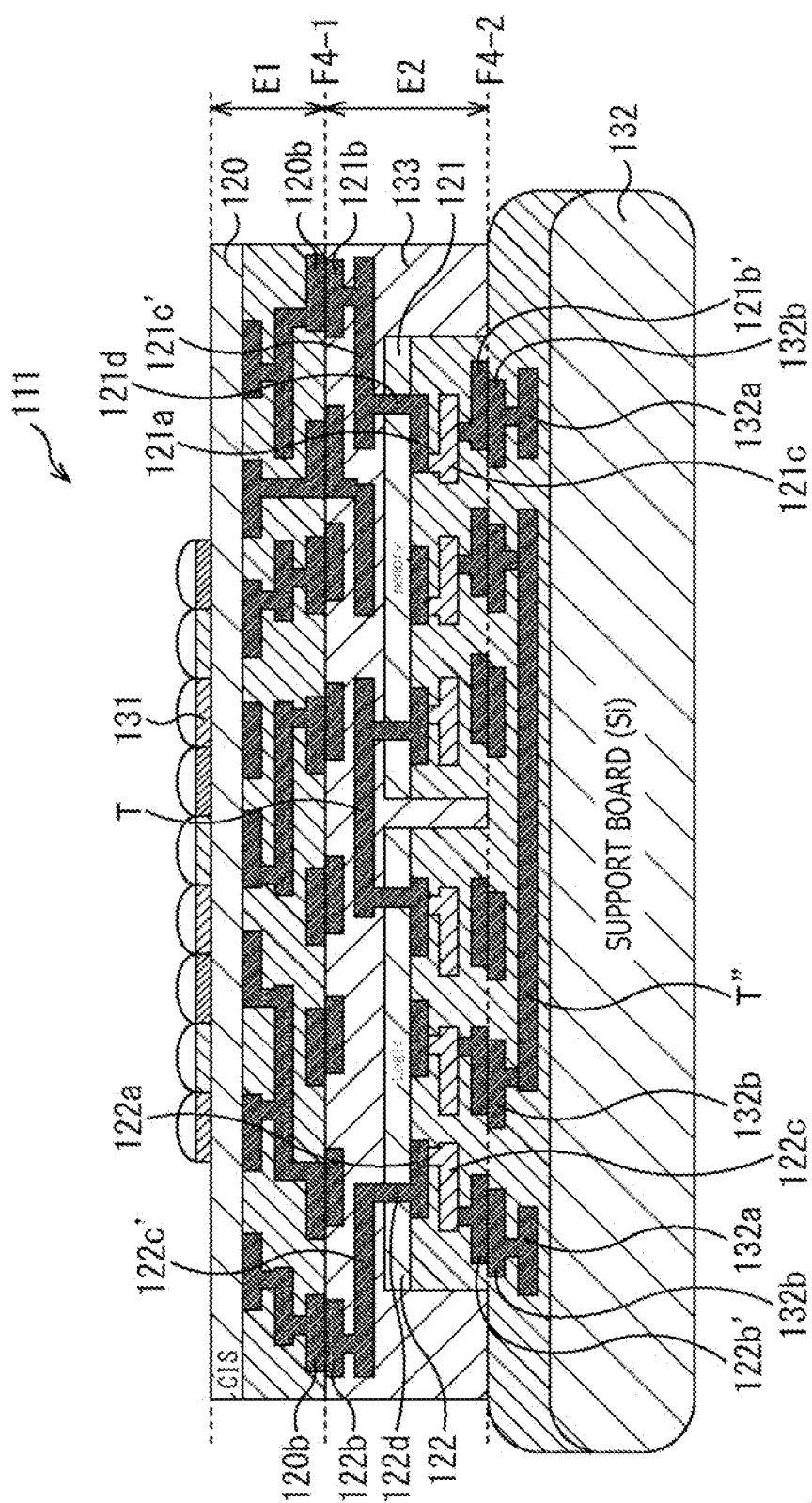
FIG. 33 is a figure for explaining a configuration example of the solid-state image pickup apparatus according to a fifth embodiment of the present disclosure.

FIG. 33 depicts a configuration example of the solid-state image pickup apparatus 111 in which a wiring layer is formed also on the support board 132, and a communication wire between the memory circuit 121 and the logic circuit 122 is formed via the wiring layer on the support board 132.

That is, the solid-state image pickup apparatus 111 in FIG. 33 has a configuration that is different from the configuration of the solid-state image pickup apparatus 111 in FIG. 26 in that the solid-state image pickup element 120, and the memory circuit 121 and the logic circuit 122 are electrically connected at a junction surface F4-1, and the memory circuit 121 and the logic circuit 122, and the support board are electrically connected at a junction surface F4-2.

The memory circuit 121 and the logic circuit 122 have pads 121*b'* and 122*b'* formed therein on surfaces thereof that face the support board 132, and at positions corresponding to pads 132*b* forming the wiring layer of the support board 132.

In addition, the support board 132 has the pads 132*b* formed at positions facing the memory circuit 121 and the logic circuit 122, and further wires 132*a*, and a communication wire T" between the memory circuit 121 and the logic circuit 122 are formed at a lower section in FIG. 33.

The wires 132*a* can be used for electrical connection and can also be used for positioning by being used as alignment marks.

The pads 132*b* of the support board 132, the pads 121*b'* of the memory circuit 121, and the pads 122*b'* of the logic circuit 122 are CuCu-connected.

In the example depicted, in the solid-state image pickup apparatus 111 in FIG. 33, communication wires between the memory circuit 121 and the logic circuit 122 include the two communication wires T and T", but only any one of them may be provided.

With a configuration like the one above, it becomes unnecessary to form communication wires that go through the solid-state image pickup element 120, and so a process increase is suppressed. Additionally, it becomes unnecessary to aggregate wires in the solid-state image pickup element 120, and the wire density is reduced. Accordingly, it becomes possible to reduce the occurrence of the yield. In addition, for a similar reason, it is possible to reduce the electrical resistance, and so it becomes possible to attempt to reduce the power consumption.

<Method of Manufacturing Solid-State Image Pickup Apparatus in FIG. 33>

Next, a method of manufacturing the solid-state image pickup apparatus 111 in FIG. 33 is explained with reference to a flowchart in FIG. 34, and side cross-sectional views in FIG. 35 to FIG. 38.

Figure 34:
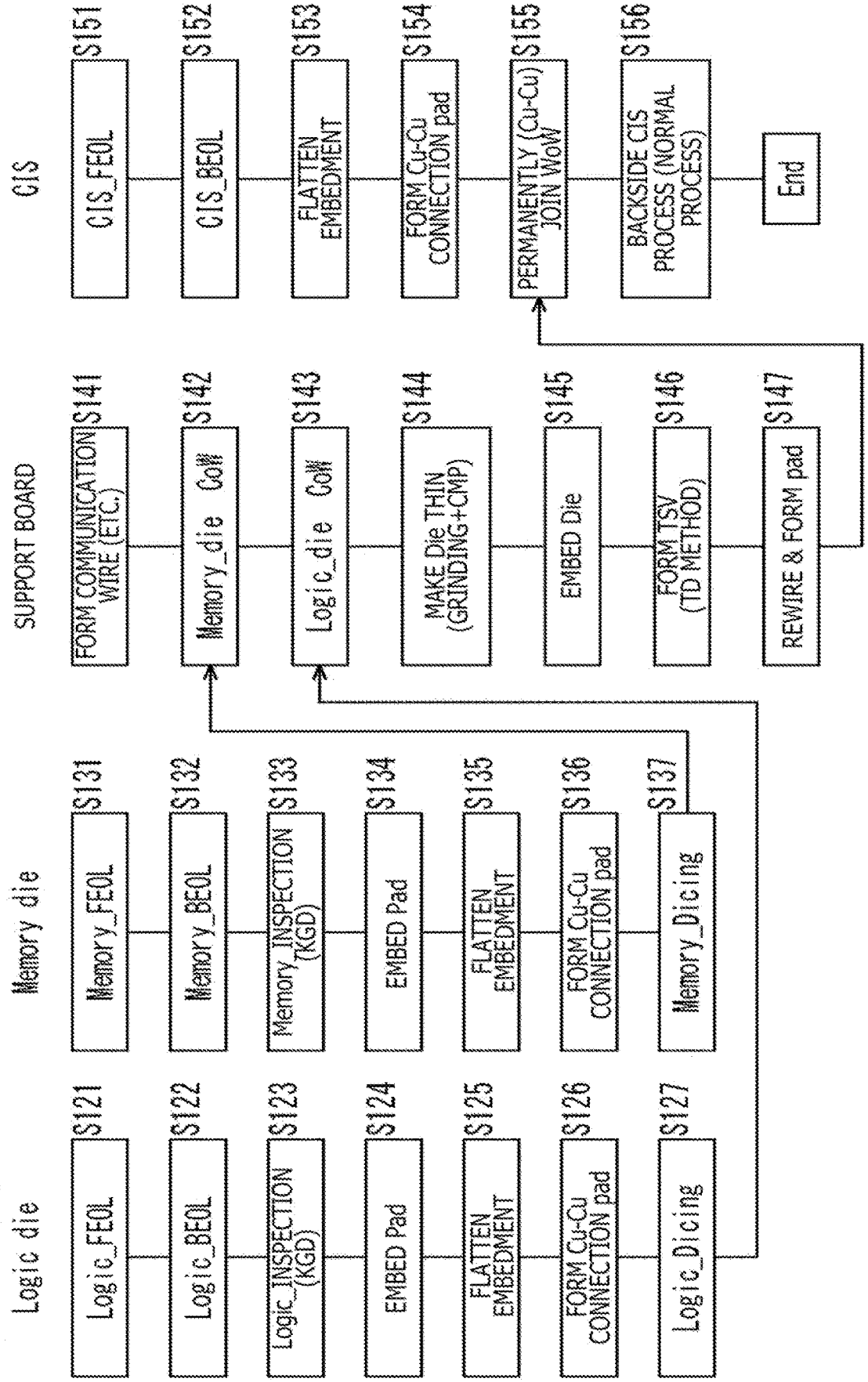
FIG. 34 is a flowchart for explaining a method of manufacturing the solid-state image pickup apparatus in FIG. 33.

Note that, in the flowchart in FIG. 34, the processes of manufacturing the memory circuit 121 and the logic circuit 122 are similar to Steps S11 to S16, and Steps S21 to S26 in the flowchart in FIG. 14 except for the processes in Steps S126 and S136, and so explanations thereof are omitted.

In addition, the processes in Steps S142 to S147 which are the processes related to the support board 132 are similar to the processes in Steps S101 to S106 in FIG. 27, and so explanations thereof are omitted.

Further, the processes in Steps S151 to S154 which are the processes of manufacturing the solid-state image pickup element 120 are similar to the processes in Steps S51 to S54 in FIG. 14, and so explanations thereof are omitted.

Figure 35:
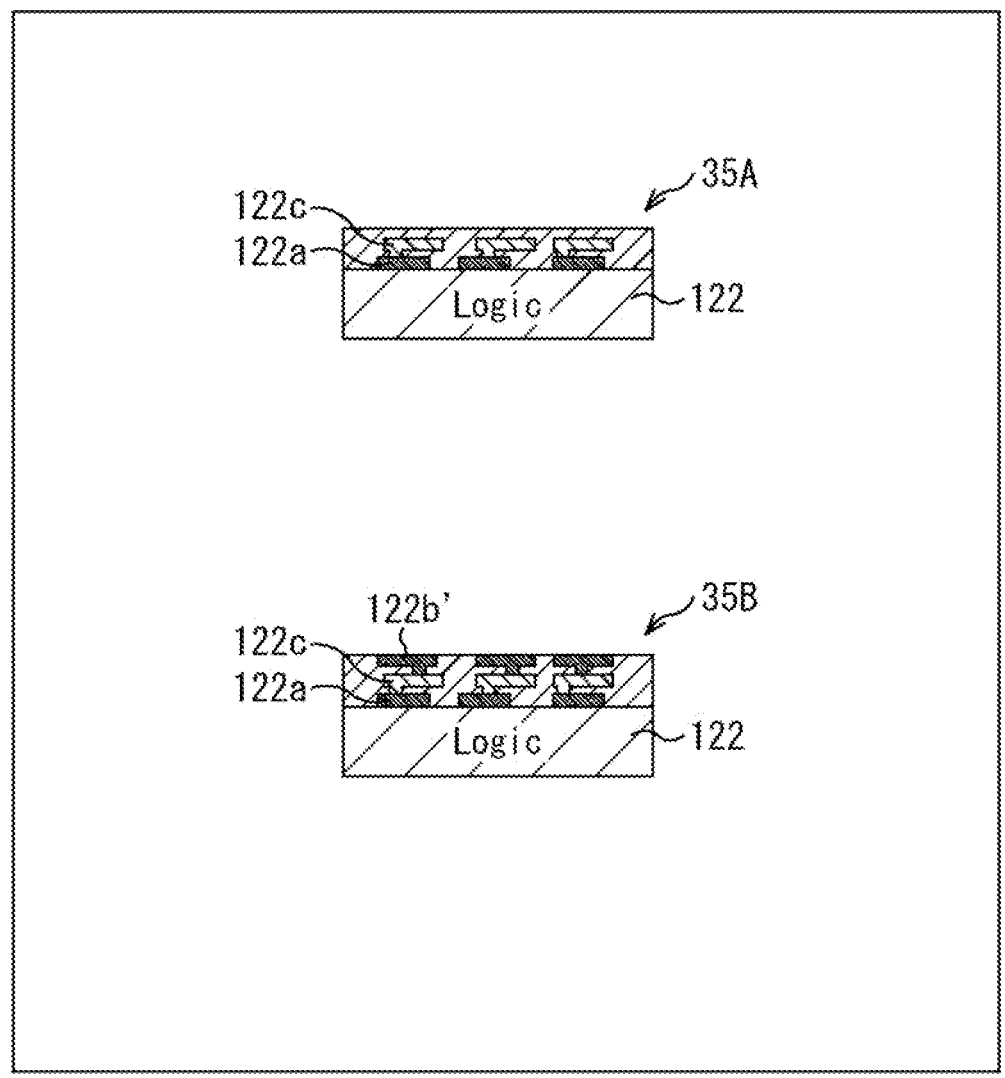
FIG. 35 is a figure for explaining the method of manufacturing the solid-state image pickup apparatus in FIG. 33.

That is, in a process in Step S126 (form Cu—Cu connection pad), in the logic circuit 122 manufactured on the wafer 104 as depicted in a side cross-sectional view 35A in FIG. 35, the pads 122*b*' for CuCu-joining with the pads 132*b* of the support board 132 are formed as depicted in a side cross-sectional view 35B in FIG. 35.

In addition, the pads 122*b*' are formed by a technique that is similar to the technique used in the case the through-electrodes 122*d*, the wire 122*c*', and the pads 122*b*' in the solid-state image pickup apparatus 111 in FIG. 26 are formed in the process in Step S106 explained with reference to the flowchart in FIG. 27. After the pads 121*b*' are formed, the logic circuit 122 on the wafer 104 is diced, and a good element is extracted.

Note that, in Step S136, the pads 121*b*' are formed in the memory circuit 121 also by a similar technique, the memory circuit 121 is diced, and a good element is extracted.

Figure 36:
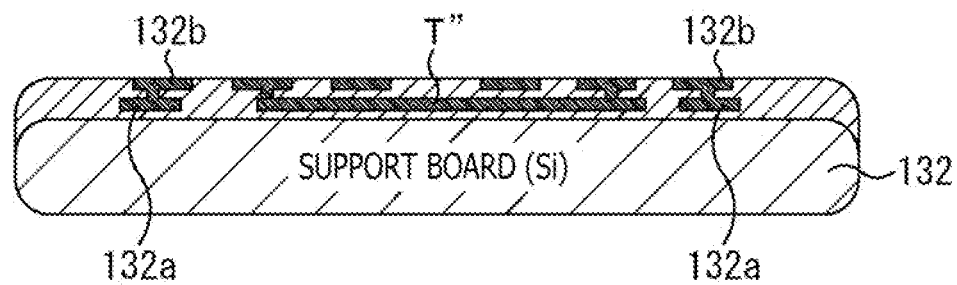
FIG. 36 is another figure for explaining the method of manufacturing the solid-state image pickup apparatus in FIG. 33.

In addition, in a process in Step S141 (form communication wire (etc.)), as depicted in FIG. 36, the wires 132*a*, the communication wire T", and the pads 132*b* are formed on the support board 132.

More specifically, a thermal oxide film, LP-SiN or the like is formed on the support board (bare Si) 132 not having a device structure, and is insulated from Si.

Subsequently, plasma SiO2 is formed to have a thickness of approximately 100 to 1500 nm, a wiring pattern for inter-chip connection with the line pitch width of 0.5 to 5 um is formed by resist-patterning depending on the layout of the pads 121*b*' and 122*b*' of the memory circuit 121 and the logic circuit 122, and a groove section with the depth of 100 to 1000 nm is formed by dry etching.

After a Ta-based or Ti-based barrier metal is formed in the groove section, copper is embedded therein by electroplating, and excess copper at field sections is eliminated by CMP to thereby form inter-chip connections, and a wire 132*a* from each chip.

Subsequently, the pads 132*b* for CuCu-connection are formed by a technique similar to the technique used in the case where the through-electrodes 122*d*, the wire 122*c*', and the pads 122*b* are formed.

Note that, at this time, alignment marks for chip connection are formed simultaneously because the wires 132*a* are used therefor, and so the alignment precision at the time of the formation of the communication wire T" in the support board 132 can be increased.

Figure 37:
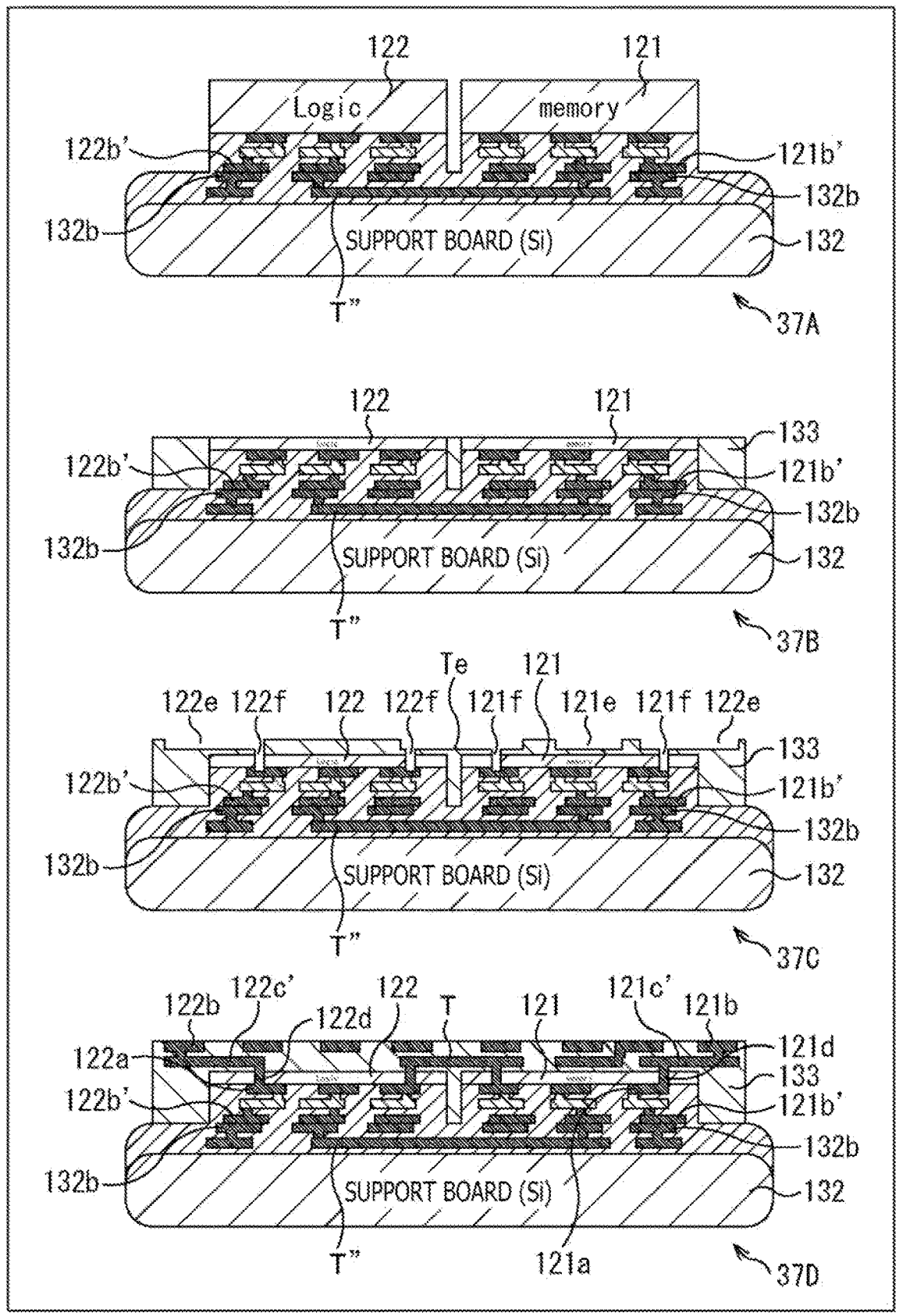
FIG. 37 is another figure for explaining the method of manufacturing the solid-state image pickup apparatus in FIG. 33.

In processes in Steps S142 and S143 (Memory_die CoW, Logic_die CoW), as depicted in a side cross-sectional view 37A in FIG. 37, on the support board 132 where the communication wire T", the pads 132*b*, and the wires 132*a* as alignment marks are formed, the pads 121*b*' and 122*b*' of the memory circuit 121 and the logic circuit 122 are CuCu-joined (direct joining), and electrically connected such that the pads 121*b*' and 122*b*' of the memory circuit 121 and the logic circuit 122 are at positions corresponding to the positions of the pads 132*b*.

In a process in Step S144 (make die thin), a gap between the memory circuit 121 and the logic circuit 122 is filled (partially) with the oxide film 133 by plasma CVD, and the diced memory circuit 121 and logic circuit 122 are fixed to the support board 132.

Further, Si boards of the diced memory circuit 121 and logic circuit 122 are made thin. More specifically, grinding is performed at high speed by a grinder, and CMP is performed for a surface quality improvement.

In a process in Step S145 (embed dei), as depicted in a side cross-sectional view 37B in FIG. 37, the oxide film 133 is formed until steps are filled again by plasma CVD or the like for the purpose of filling the gap between the memory circuit 121 and logic circuit 122 having been made thin.

Further, a step formed on the surfaces of the memory circuit 121 and the logic circuit 122 is flattened by CMP. At this time, the memory circuit 121 and the logic circuit 122 are finished such that their Si film thicknesses are within the range approximately of 1 to 10 um.

In a process in Step S146 (form TSV), plasma SiO2 is formed such that the thickness becomes approximately 100 to 1500 nm for the purpose of insulating the Si films of the memory circuit 121 and the logic circuit 122 after CMP.

Subsequently, as depicted in a side cross-sectional view 37C in FIG. 37, the groove sections 121*e*, 122*e*, and Te corresponding to wires to connect the memory circuit 121 and the logic circuit 122 are formed by resist patterning and oxide film dry etching.

At this time, the groove sections 121*e*, 122*e*, and Te are formed down to depths that do not reach Si of the memory circuit 121 and the logic circuit 122.

Further, subsequently, the through-holes 121*f* and 122*f* are formed as openings to reach depths immediately before reaching copper wires of the lowermost layer in the multi-layer wiring layer, or as openings to reach depths immediately before reaching Al pads at the uppermost layer, such that the through-holes 121*f* and 122*f* penetrate Si of the memory circuit 121 and the logic circuit 122 from the areas of the groove sections 121*e* and 122*e* formed in the manner described above. The diameters of the through-holes 121*f* and 122*f* are approximately 1 to 5 um, for example.

In a process in Step S147 (rewire & form pad), as depicted in a side cross-sectional view 37D in FIG. 37, insulating films including SiO2 are formed on the side walls of Si exposed as a result of the processing described above, and thereafter an etch-back process is performed to thereby eliminate SiO2 formed as protective films of bottom sections of the through-holes 121*f* and 122*f*, and make the wiring layers of the memory circuit 121 and the logic circuit 122 exposed.

Then, after a barrier metal is formed, a metal such as Cu is embedded in the through-holes 121*f* and 122*f*, the surfaces are polished by CMP (Chemical Mechanical Polishing), and only the conductive materials of the groove sections 121*e*, 122*e*, and Te and the through-holes 121*f* and 122*f* are left.

Thereby, the communication wire T that connects the memory circuit 121 and the logic circuit 122, and lead wires 121*c*' and 122*c*' from the through-electrodes 121*d* and 122*d* of the memory circuit 121 and the logic circuit 122 are formed in areas in the insulating spacer layer.

Further, the pads 121*b* and 122*b* for hybrid (Cu—Cu) connection with the solid-state image pickup element 120 are formed.

By the processes above, after the wafer on which the memory circuit 121 and the logic circuit 122 are re-arranged is formed, the memory circuit 121 and the logic circuit 122 are connected by the communication wires T and T", and further the pads 121*b* and 122*b* for connection with the solid-state image pickup element 120 are formed.

In addition, in a process in Step S151 to Step S154 (form Cu—Cu connection wire (etc.)), the pads 120*b* are formed, and the wafer 101 of the solid-state image pickup element 120 is completed.

Figure 38:
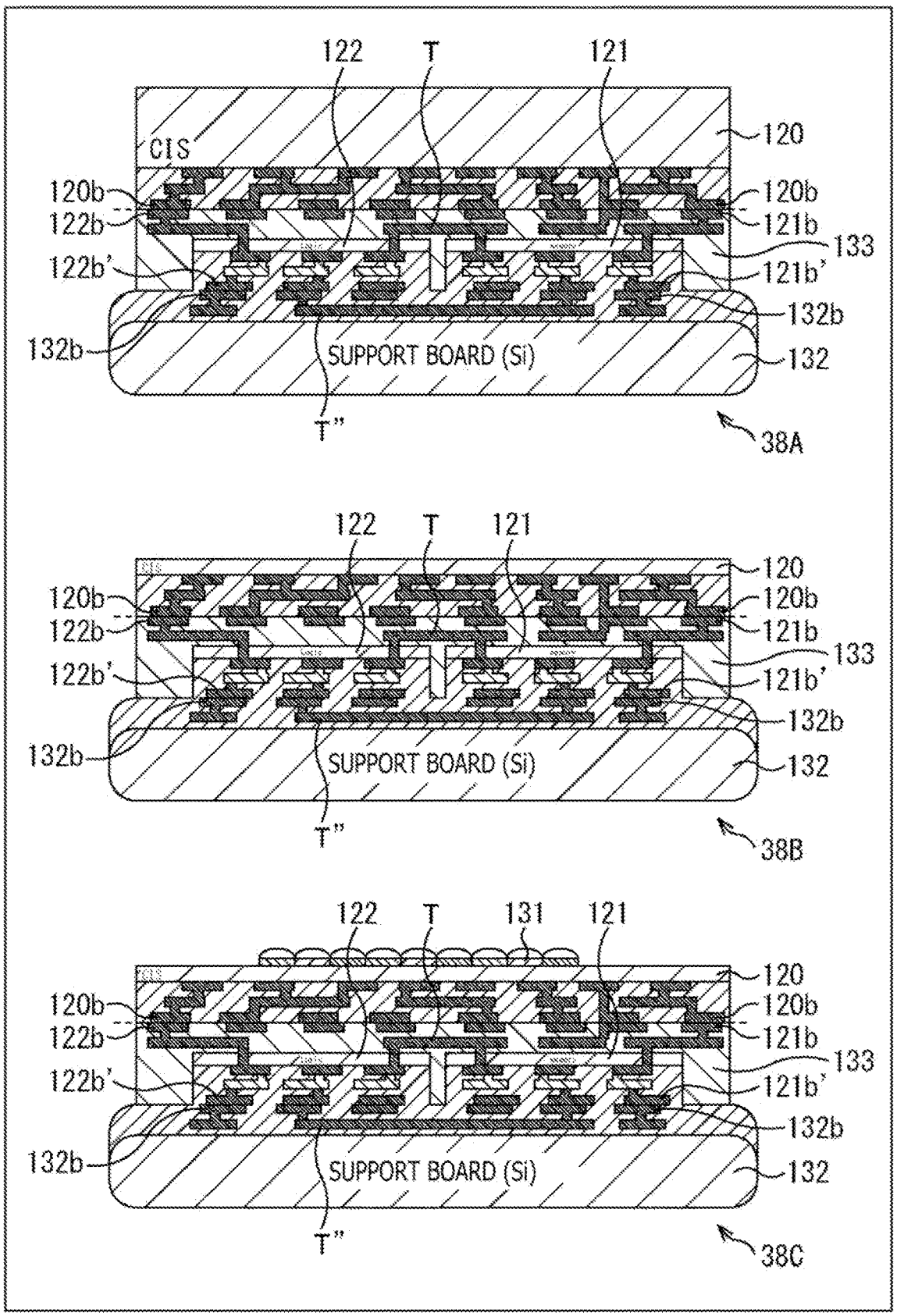
FIG. 38 is another figure for explaining the method of manufacturing the solid-state image pickup apparatus in FIG. 33.

Then, in a process in Step S155 (permanent (Cu—Cu joining WoW)), as depicted in a side cross-sectional view 38A in FIG. 38, the pads 120*b* of the solid-state image pickup element 120, and the pads 121*b* of the memory circuit and the pads 122*b* of the logic circuit 122 are CuCu-joined.

In a process in Step S156 (backside CIS process), as depicted in a side cross-sectional view 32B in FIG. 38, the solid-state image pickup element 120 is made thin, and a protective film is formed. Thereafter, as depicted in a side cross-sectional view 38C of FIG. 38, the color filters and on-chip lenses 130 are formed.

With the series of processes above, the solid-state image pickup apparatus 111 in FIG. 33 formed with the communication wires T and T" of the memory circuit 121 and the logic circuit 122 not going through the solid-state image pickup element 120 is manufactured.

Because, as a result, it becomes unnecessary to form a communication wire that goes through the solid-state image pickup element 120, it becomes possible to suppress a process increase in the manufacturing of the solid-state image pickup element 120, and it becomes possible to enhance the yield.

In addition, because the degree of freedom of the placement of wires is enhanced, it becomes possible to make wire lengths short and to increase wires, and it becomes possible to stabilize power supplies, and to reduce power consumption.

Further, the degree of freedom of the formation of light-blocking films for measures against hot carrier is improved.

In addition, because it becomes possible to place communication wires around in an area as large as or larger than the area size of the solid-state image pickup element 120, it becomes possible to expand wire pitches, and it becomes possible to suppress the deterioration of the yield.

Further, it becomes unnecessary to aggregate wires, and the wire density is reduced. Accordingly, the electrical resistance can be lowered, and so it becomes possible to attempt to reduce the power consumption.

8. Sixth Embodiment

The memory circuit 121 and the logic circuit 122 are re-arranged on the support board 132 including the communication wires, and the solid-state image pickup element 120 is stacked in the solid-state image pickup apparatus 111 in the explanation above; however, in another possible configuration, the logic circuit 122 may be stacked on a memory device board having the function of the memory circuit 121 instead of the support board 132, and the solid-state image pickup element 120 may be stacked on the logic circuit 122.

Figure 39:
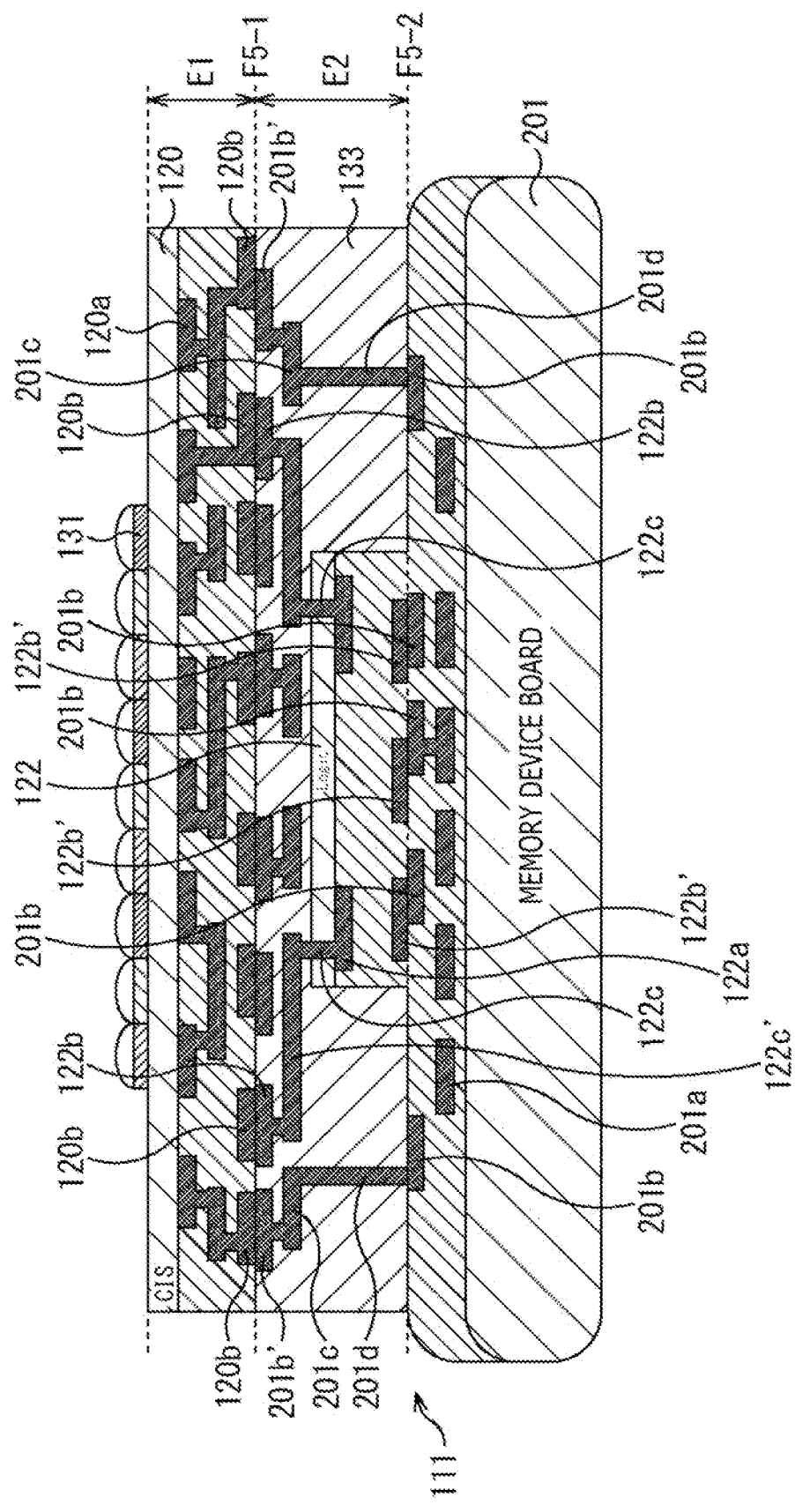
FIG. 39 is a figure for explaining a configuration example of the solid-state image pickup apparatus according to a sixth embodiment of the present disclosure.

FIG. 39 depicts a configuration example of the solid-state image pickup apparatus 111 in which the logic circuit 122 is stacked on a memory device board having the function of the memory circuit 121 instead of the support board 132, and the solid-state image pickup element 120 is stacked on the logic circuit 122.

In the configuration of the solid-state image pickup apparatus 111 in FIG. 39, instead of the support board 132, a memory device board 201 having the function of the memory circuit 121 is provided, the logic circuit 122 is stacked on the memory device board 201 such that the logic circuit 122 is embedded in the oxide film 133, and further the solid-state image pickup element 120 is stacked on the logic circuit 122.

In addition, the solid-state image pickup element 120, and the logic circuit 122 and the memory device board 201 are CuCu-joined and electrically connected at a junction surface F5-1 through the pads 120*b*, and the pads 201*b*' and 122*b*.

More specifically, in the oxide film 133 in which the logic circuit 122 is embedded, the pads 201*b*', wires 201*c*, and through-electrodes 201*d* are formed in a state in which the pads 201*b*', the wires 201*c*, and the through-electrodes 201*d* are connected with each other, and the pads 201*b* of the memory device board 201, and the through-electrodes 201*d* are connected at a junction surface F5-2.

Thereby, the memory device 201 and the solid-state image pickup element 120 are electrically connected via the pads 201*b*', the wires 201*c* and the through-electrodes 201*d*, and the pads 201*b*.

Further, the logic circuit 122 and the memory device board 201 are CuCu-joined and electrically connected at the junction surface F5-2 through the pads 201*b* and 122*b*. Stated differently, the CuCu-joined pads 201*b* and 122*b* substantially function as communication wires.

With such a configuration, communication wires become unnecessary by stacking the memory circuit 121 and the logic circuit 122. Accordingly, it becomes unnecessary to form communication wires to go through the solid-state image pickup element 120, and it becomes possible to suppress a process increase.

In addition, it becomes unnecessary to aggregate wires in the solid-state image pickup element 120, and the wire density is reduced. Accordingly, it becomes possible to enhance the yield, and additionally the electrical resistance can be lowered; as a result, it becomes possible to attempt to reduce the power consumption.

Note that, in the configuration example of the solid-state image pickup apparatus 111 depicted in FIG. 39, instead of the support board 132, the memory device board 201 having the function of the memory circuit 121 is provided, and is stacked such that the logic circuit 122 is sandwiched between the memory device board 201 and the solid-state image pickup element 120. However, instead of the support board 132, a logic device board having the function of the logic circuit 122 may be provided, and stacked such that the memory circuit 121 is sandwiched between the logic device board and the solid-state image pickup element 120, in another possible configuration.

<Method of Manufacturing Solid-State Image Pickup Apparatus in FIG. 39>

Figure 40:
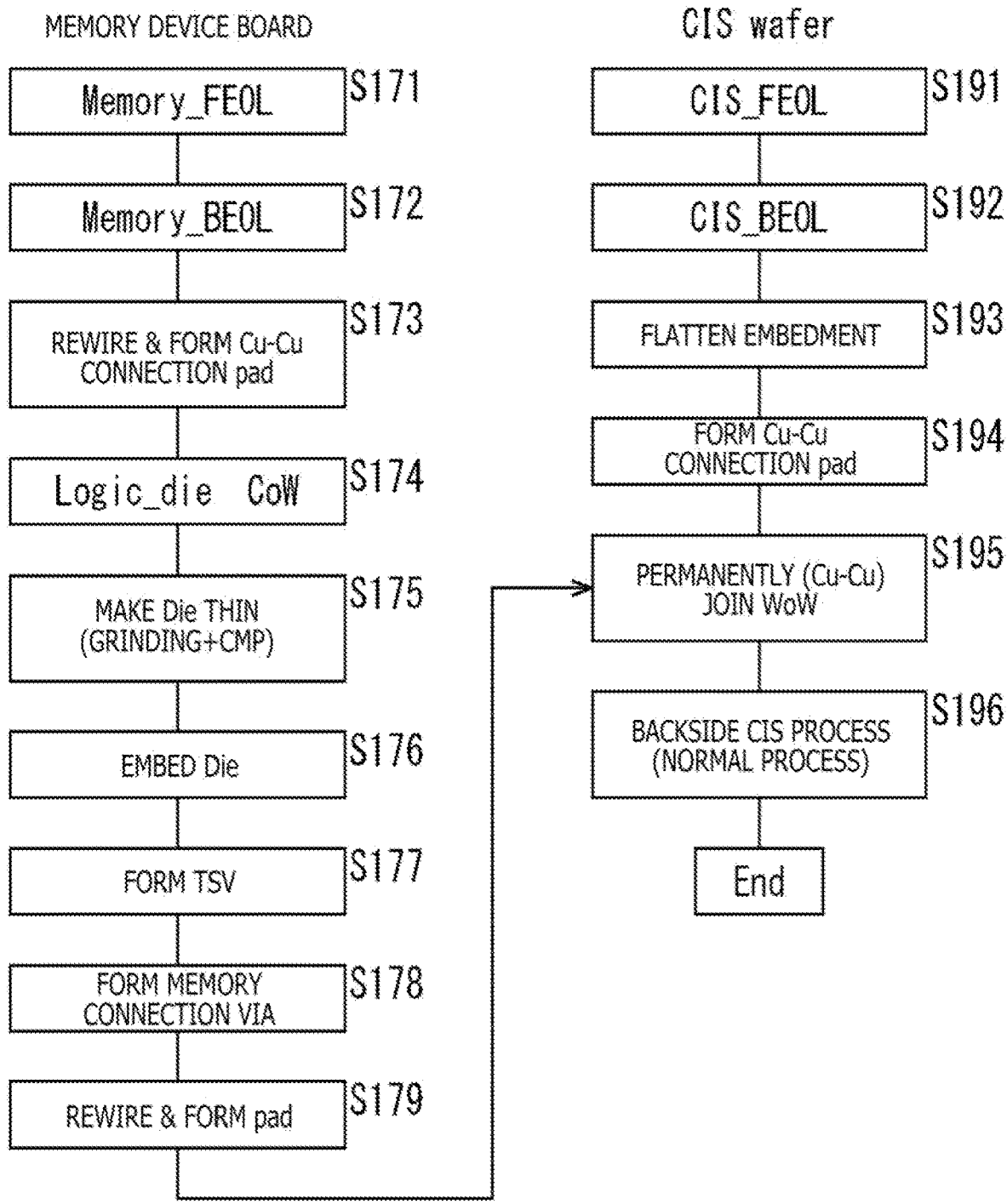
FIG. 40 is a flowchart for explaining a method of manufacturing the solid-state image pickup apparatus in FIG. 39.

Next, a method of manufacturing the solid-state image pickup apparatus 111 in FIG. 39 is explained with reference to a flowchart in FIG. 40, and side cross-sectional views in FIG. 41 to FIG. 43.

Note that, in the flowchart in FIG. 39, the processes of manufacturing the logic circuit 122 are similar to Steps S121 to S127 in the flowchart in FIG. 34, and so explanations thereof are omitted. In addition, the processes in Steps S191 to S194 which are the processes of manufacturing the solid-state image pickup element 120 are similar to the processes in Steps S51 to S54 in the flowchart in FIG. 14, and so explanations thereof are omitted.

Similarly to the processes in Steps S21 and S22 in FIG. 14, in processes in Steps S171 and S172 (Memory_FEOL, Memory_BEOL), a wiring pattern for realizing the function as the memory circuit 121 is formed on the memory device board 201, and wires are formed with a metal such as AL or Cu.

Note that an inspection may be performed after the process in Step S172 (Memory_BEOL), and good dies and bad dies may be clearly identified in advance.

In a process in Step S173 (rewire & form Cu—Cu connection pad), wires 201*a* and the pads 201*b* are formed. Here, alignment marks for connection are formed also.

In a process in Step S174 (Logic_die CoW), as depicted in a side cross-sectional view 41A in FIG. 41, the pads 201*b* of the memory device board 201, and the pads 122*b*' of the logic circuit 122 are CuCu-joined. Note that, while an example in which only the logic circuit 122 is connected is explained with reference to FIG. 41, plural circuit chips may be connected depending on functions.

In a process in Step S175 (make die thin), the space around the logic circuit 122 on the memory device board 201 is filled with the oxide film 133 to thereby fix the logic circuit 122 onto the memory device board 201, and thereafter the logic circuit 122 is made thin.

In a process in Step S176 (embed die), as depicted in a side cross-sectional view 41B in FIG. 41, by repeating the process in Step S175, the logic circuit 122 is embedded in the oxide film 133.

In processes in Steps S177 and S178 (form TSV, form memory connection via), as depicted in side cross-sectional views 42A to 42C in FIG. 42, the through-electrodes 122*d* that penetrate Si of the logic circuit 122, and the through-electrodes 201*d* for connection with the memory device board 201 are formed.

More specifically, as depicted in the side cross-sectional view 42A in FIG. 42, an insulating film 221 including plasma SiO2 is formed such that the thickness becomes 100 to 1500 nm, for the purpose of insulating Si after CMP. Then, an area where the pads 201*b*', the wires 201*c* and the through-electrodes 201*d* to connect the memory device board 201 and the solid-state image pickup element 120 are formed, and groove sections 222 that are corresponding to intra-stack connecting wires to be used when the solid-state image pickup element 120 and the logic circuit 122 are connected are formed by resist patterning and oxide film dry etching. At this time, the groove sections 222 are formed with depths that do not reach Si of the logic circuit 122 and the memory device 201.

Next, after resists for processing of the groove sections 222 are eliminated, as depicted in a side cross-sectional view 42B in FIG. 42, vias 223 for connection with the memory device board 201, and vias 224 for connection with the logic circuit 122 are formed by patterning, and dry etching of the oxide film 133 is performed first.

Because the oxide film 133 on the logic circuit 122 is thin, the vias 224 reach Si while the vias 223 of the memory device board 201 are being formed, but because the selection ratio of SiO2 and Si is high, Si is not processed, and the vias 223 and 224 with different depths are formed.

Note that, at this time, the SiO2 processing of the vias 224 is stopped before the vias 223 reach the pads 201*b* on the memory device board 201.

Thereafter, the etching condition is changed, and the vias 223 and 224 are processed. That is, after the processing resists are eliminated, the insulating film 221 including plasma SiO2 for insulating Si is formed, and thereafter an etch-back process performed. Thereby, vias 223' and 254' are formed simultaneously as depicted in a side cross-sectional view 42C in FIG. 42.

Figure 43:
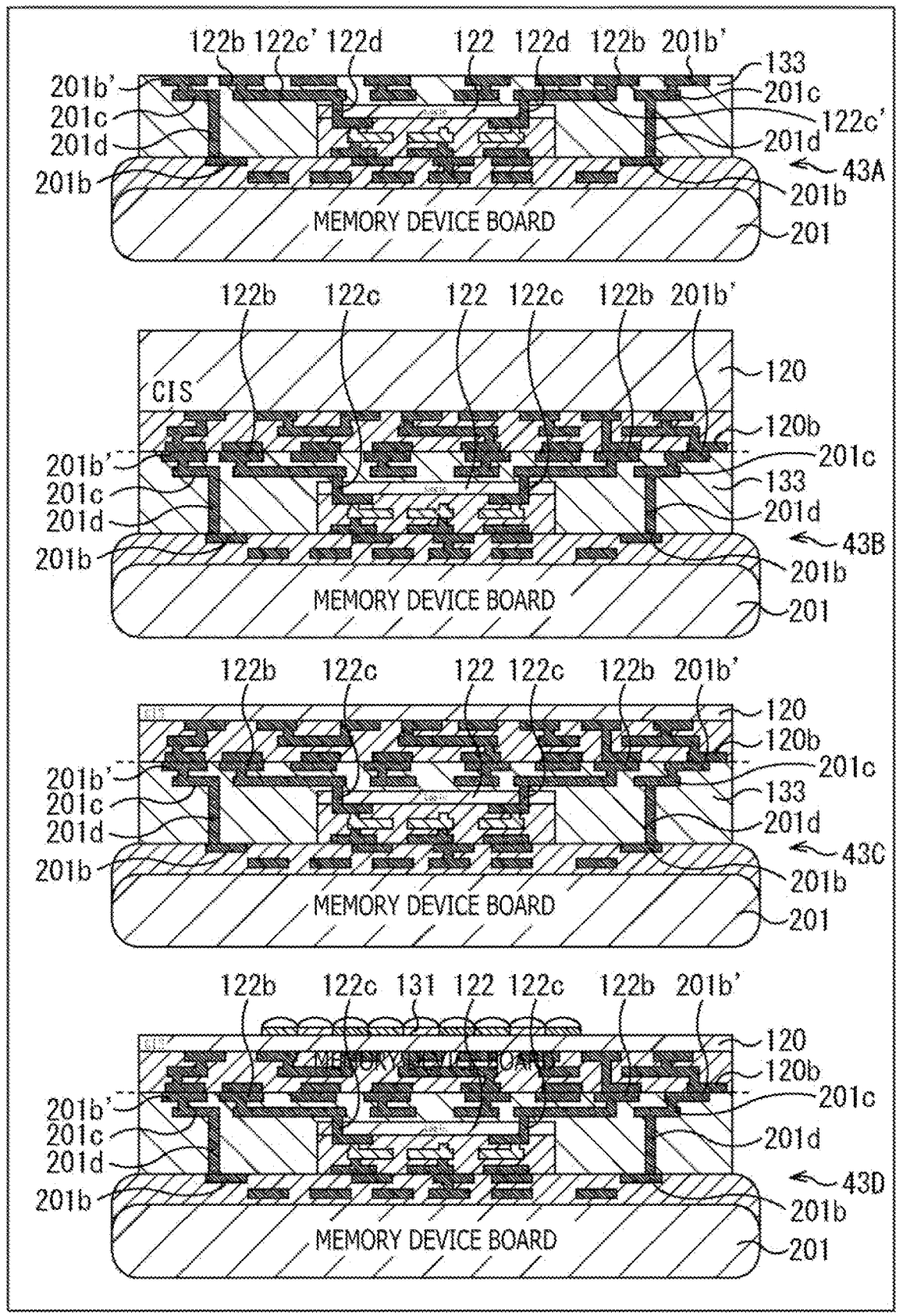
FIG. 43 is another figure for explaining the method of manufacturing the solid-state image pickup apparatus in FIG. 39.

In a process in Step S179 (rewire & form pad), as depicted in a side cross-sectional view 43A in FIG. 43, after a barrier metal is formed, a metal such as Cu is embedded in the vias 223' and 224', and the surfaces are polished by CMP (Chemical Mechanical Polishing).

By this process, only the conductive materials of the wires 122*c*' and 201*c*, and the through-electrodes 122*d* and 201*d* are left. Thereby, the wires 122*c*' and 201*c*, and the through-electrodes 122*d* and 201*d* which are lead wires from the memory device board 201 and the logic circuit 122 are formed.

Further, the pads 201*b* and 122*b* for CuCu-connection with the solid-state image pickup element 120 are formed.

In a process in Step S195 (permanently (Cu—Cu) join WoW), as depicted in a side cross-sectional view 43B in FIG. 43, the pads 120*b* of the solid-state image pickup element 120, and the pads 201*b* and 122*b*' of the memory device board 201 and the logic circuit 122 are CuCu-joined.

In a process in Step S196 (backside CIS process), as depicted in a side cross-sectional view 43C in FIG. 43, the solid-state image pickup element 120 is made thin, and a protective film is formed. Thereafter, as depicted in a side cross-sectional view 43D of FIG. 43, the color filters and on-chip lenses pixels 131 are formed.

According to the solid-state image pickup apparatus 111 manufactured by the processes above, it becomes possible to reduce the number of processes before the solid-state image pickup element 120 with a large area size is joined, and it is possible to enhance the yield according to the reduction of processes.

In addition, because it becomes possible to form wires of the memory device board 201 and the logic circuit 122 without using wires of the solid-state image pickup element 120, it becomes possible to enhance the degree of freedom of the placement of wires.

As a result, it becomes possible to make wire lengths short and to increase wires, and it becomes possible to stabilize power supplies, and to reduce power consumption. In addition, it becomes possible to enhance the degree of freedom of the formation of light-blocking films for measures against hot carrier.

Note that because it becomes possible to join at least any one of the memory circuit 121 and the logic circuit 122 after an inspection, it becomes possible to enhance the yield of the backside-illumination solid-state image pickup apparatus 111 to be finished.

9. Seventh Embodiment

<Manufacturing Method in which Memory Circuit and Logic Circuit are Stacked on Solid-State Image Pickup Element>

In the example explained above, the memory circuit 121 and the logic circuit 122 are stacked on the re-arrangement board 151 or the support board 132 and are embedded in the oxide film 133, and the solid-state image pickup element 120 is stacked on the memory circuit 121 and the logic circuit 122, to thereby manufacture the solid-state image pickup apparatus 111.

However, the memory circuit 121 and the logic circuit 122 may be stacked on the solid-state image pickup element 120 and be embedded in the oxide film 133, and the support board 132 may be stacked on the memory circuit 121 and the logic circuit 122.

The configuration of the completed solid-state image pickup apparatus 111 is basically similar to that in FIG. 10. In view of this, in the method of manufacturing the solid-state image pickup apparatus 111 explained here with reference to side cross-sectional views in FIG. 44 to FIG. 46, the memory circuit 121 and the logic circuit 122 are stacked on the solid-state image pickup element 120 and are embedded in the oxide film 133, and the support board 132 is stacked on the memory circuit 121 and the logic circuit 122.

Note that it is assumed that the solid-state image pickup element 120, the memory circuit 121 and the logic circuit 122 have been manufactured, and the memory circuit 121 and the logic circuit 122 have been diced, and selected as good elements as a result of an inspection.

In a first process, as depicted in a side cross-sectional view 44A in FIG. 44, the wires 120a and the pads 120b are formed in the solid-state image pickup element 120.

In a second process, as depicted in a side cross-sectional view 44B in FIG. 44, the memory circuit 121 and the logic circuit 122 are stacked on the solid-state image pickup element 120, and the pads 120b, and the pads 121b and 122b are CuCu-joined. At this time, because oxide-film connection is performed after a hydrophilic treatment, connection at the normal temperature is possible at the time of the CuCu-connection, and it becomes possible to highly precisely ensure the alignment between the solid-state image pickup element 120, and the memory circuit 121 and the logic circuit 122.

For example, the alignment precision is at a level that can satisfy 1 um<3σ. In addition, as depicted in the side cross-sectional view 44B in FIG. 44, after the alignment, the memory circuit 121 is tilted, and is caused to partially abut against the solid-state image pickup element 120. In this state, the whole is joined. By this implementation, it becomes possible to suppress generation of voids due to entrainment, and enhance the reliability of the operation of the solid-state image pickup element 120, the memory circuit 121, and the logic circuit 122. Further, it is possible to easily cope with even a case where the heights of the memory circuit 121 and the logic circuit 122 to be implemented are different. Note that, while the side cross-sectional view 44B in FIG. 44 depicts a state where only the memory circuit 121 is tilted, and is caused to partially abut against the solid-state image pickup element 120, the logic circuit 122 is also implemented by a similar technique.

In a third process, as depicted in a side cross-sectional view 44C in FIG. 44, Si of the memory circuit 121 and the logic circuit 122 is made thin. Considering the embeddability by the oxide film 133, it is better if the memory circuit 121 and the logic circuit 122 are made as thin as possible before the embedment process using the oxide film 133, or the like. In terms of ensuring the properties of the oxide film 133 and the like that allow embedment flattening, and in terms of an increase of the warp amount, the thicknesses of the memory circuit 121 and the logic circuit 122 are preferably made equal to or thinner than approximately 20 um, for example.

Figure 45:
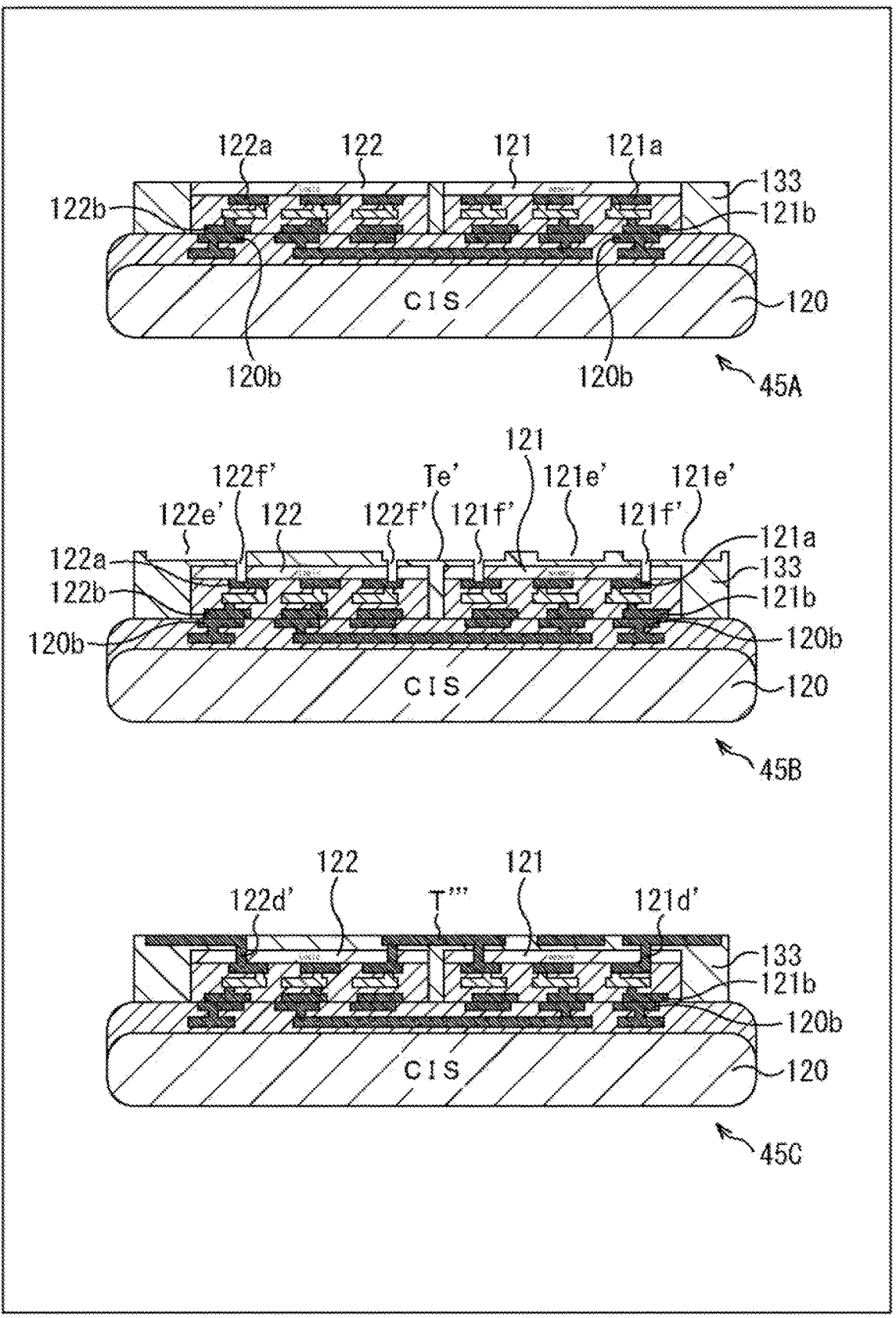
FIG. 45 is another figure for explaining the method of manufacturing the solid-state image pickup apparatus according to the seventh embodiment of the present disclosure.

In a fourth process, as depicted in a side cross-sectional view 45A in FIG. 45, the memory circuit 121 and the logic circuit 122 are embedded in the oxide film 133. If the oxide film 133 is an inorganic film, it is desirably a Si-based oxide film such as a SiO2 film, a SiO film, or a SRO film in terms of heat resistance and the warp amount after film formation. In addition, in a case where the oxide film 133 is an organic film, the oxide film 133 is preferably a polyimide-based (PI, PBO, etc.) oxide film, a polyamide-based oxide film or the like that can easily ensure high heat resistance.

In a fifth process, as depicted in a side cross-sectional view 45B in FIG. 45, groove sections 121e', 122e', and Te' corresponding to wires to connect the memory circuit 121 and the logic circuit 122 are formed by resist patterning and oxide film dry etching.

At this time, the groove sections 121e', 122e', and Te' are formed down to depths that do not reach Si of the memory circuit 121 and the logic circuit 122.

Further, subsequently, through-holes 121f and 122f are formed as openings to reach depths immediately before reaching copper wires of the lowermost layer in the multilayer wiring layer, or as openings to reach depths immediately before reaching Al pads at the uppermost layer, such that the through-holes 121f and 122f penetrate Si of the memory circuit 121 and the logic circuit 122 from the areas of the groove sections 121e' and 122e' formed in the manner described above. The diameters of the through-holes 121f and 122f are approximately 1 to 5 um, for example.

In a sixth process, as depicted in a side cross-sectional view 45C in FIG. 45, insulating films including SiO2 are formed on the side walls of Si exposed as a result of the processing described above, and thereafter an etch-back process is performed to thereby eliminate SiO2 formed as protective films of bottom sections of the through-holes 121f and 122f, and make the wiring layers of the memory circuit 121 and the logic circuit 122 exposed.

Then, after a barrier metal is formed, a metal such as Cu is embedded in the through-holes 121f and 122f, the surfaces are polished by CMP (Chemical Mechanical Polishing), and only the conductive materials of the groove sections 121e', 122e', and Te' and the through-holes 121f and 122f are left.

Thereby, a communication wire T''' that connects the memory circuit 121 and the logic circuit 122, and through-electrodes 121d' and 122d' of the memory circuit 121 and the logic circuit 122 are formed in areas in the insulating spacer layer.

In a seventh process, as depicted in a side cross-sectional view 46A in FIG. 46, the solid-state image pickup element 120, the memory circuit 121, and the logic circuit 122 in the state depicted in the side cross-sectional view 45C in FIG. 45 are reversed vertically, and are connected onto the support board 132.

Then, in an eighth process, as depicted in a side cross-sectional view 46B in FIG. 46, the Si board of the solid-state image pickup element 120 is made thin, and thereafter the color filters and on-chip lenses pixels 131 are formed.

By the processes above, it becomes possible to increase the theoretical yield, and it becomes possible to reduce the cost.

In addition, in a case where the configuration of the solid-state image pickup element 120 uses an organic photoelectric conversion film, in the eighth process, as depicted in a side cross-sectional view 46C in FIG. 46, in addition to the on-chip lenses 10 (color filters are not included in FIG. 46), an organic photoelectric conversion film 241 may be formed between the on-chip lenses 10 and the solid-state image pickup element 120.

In the case of the solid-state image pickup element 120 that uses the organic photoelectric conversion film 241 which has been proposed for the enhancement of pixel characteristics in recent years, the heat proof temperature of the organic photoelectric conversion film 241 is low, and cannot endure a solder connection temperature which requires heating at 200° C. or higher.

However, in the seventh embodiment of the present disclosure, it is possible to form the less heat-resistant organic photoelectric conversion film 241 after the stacking of chips, and a technology of fine CuCu joining can be applied. Accordingly, it becomes possible to realize the solid-state image pickup apparatus 111 including the solid-state image pickup element 120 having low dark current characteristics, while maintaining a high external quantum efficiency.

10. Eighth Embodiment

<Manufacturing Method in which Memory Circuit and Logic Circuit are Stacked on Solid-State Image Pickup Element>

In the example explained above, the memory circuit 121 and the logic circuit 122 are arrayed and stacked on the solid-state image pickup element 120, and are embedded in the oxide film 133, and the support board 132 is stacked on the memory circuit 121 and the logic circuit 122, to thereby manufacture the solid-state image pickup apparatus 111.

However, the solid-state image pickup apparatus 111 may be manufactured by stacking and arranging the memory circuit 121 and the logic circuit 122 on the solid-state image pickup element 120, embedding the memory circuit 121 and the logic circuit 122 in the oxide film 133, and stacking the support board 132 on the stacked memory circuit 121 and logic circuit 122.

Figure 47:
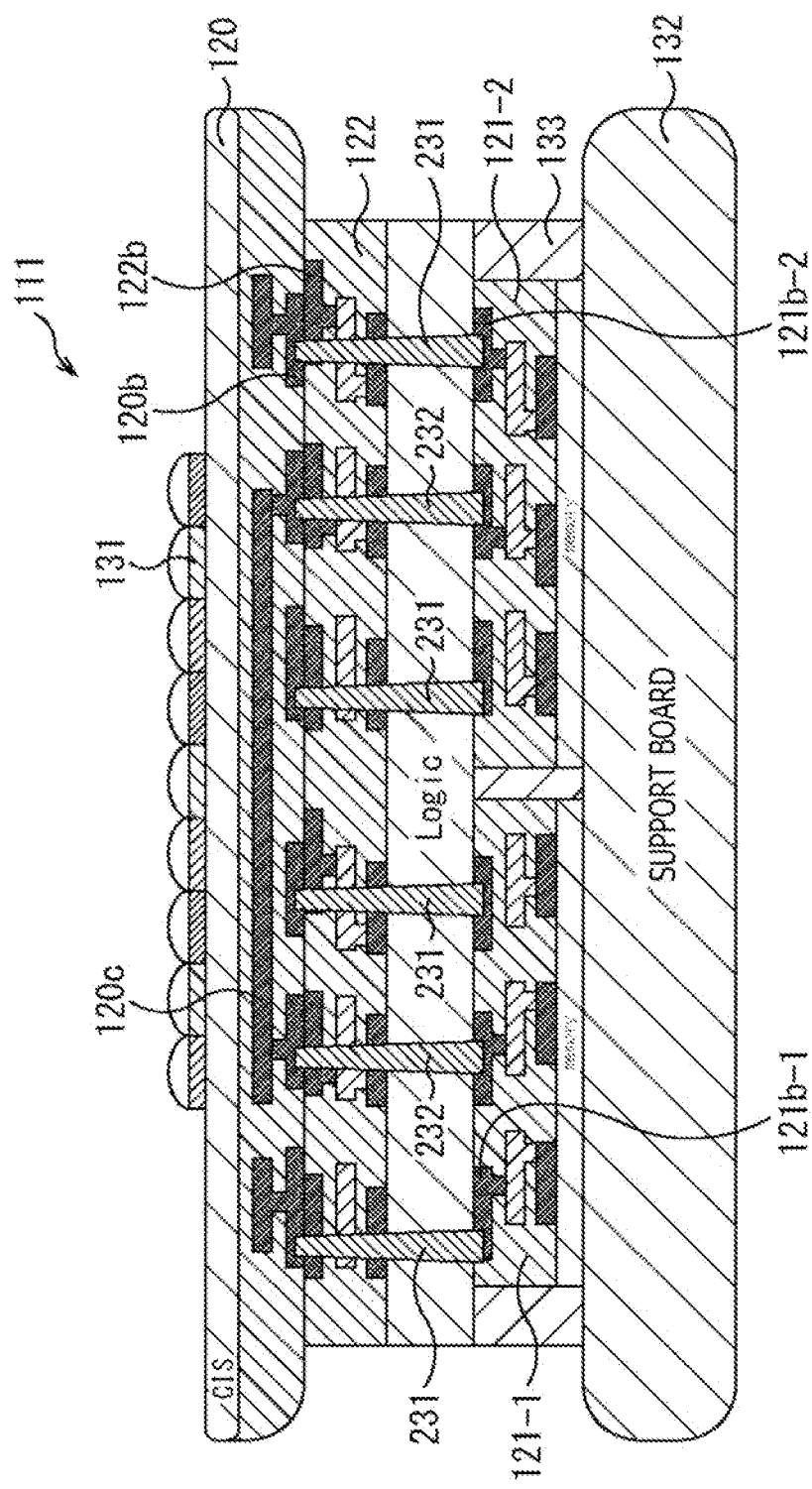
FIG. 47 is a figure for explaining a configuration example of the solid-state image pickup apparatus according to an eighth embodiment of the present disclosure.

FIG. 47 depicts a configuration example of the solid-state image pickup apparatus 111 manufactured by stacking and arranging the memory circuit 121 and the logic circuit 122 on the solid-state image pickup element 120, embedding the memory circuit 121 and the logic circuit 122 in the oxide film 133, and stacking the support board 132 on the memory circuit 121 and logic circuit 122.

That is, the logic circuit 122 is stacked on the support board 132, further two memory circuits 121-1 and 121-2 are arrayed in the horizontal direction and stacked on the logic circuit 122, and then the solid-state image pickup element 120 is stacked on the memory circuits 121-1 and 121-2.

In addition, through-electrodes (TSV) 231 and 232 are formed in the memory circuits 121-1 and 121-2, the solid-state image pickup element 120 and the logic circuit 122 are electrically connected via the through-electrodes 231, and the memory circuit 121 and the logic circuit 122 are electrically connected via the through-electrodes 232. That is, the through-electrodes 232 function as communication wires.

Note that the order in which the memory circuit 121 and the logic circuit 122 are stacked may be reversed, and, for example, the memory circuit 121 and the logic circuit 122 in FIG. 47 may be vertically reversed, in one possible configuration.

Because the solid-state image pickup apparatus 111 can be manufactured by stacking the good memory circuit 121 and logic circuit 122 in such a configuration also, it is possible to enhance the theoretical yield, and it becomes possible to reduce the cost.

In addition, for example, plural layers of memory circuits 121 and logic circuits 122 may be stacked further by a similar technique, and so it becomes possible to realize a capacity increase of a memory.

In particular, in a case where the solid-state image pickup element 120 that uses the organic photoelectric conversion film 241 (FIG. 46) is used, there is a pixel signal for each wavelength of RGB. Accordingly, a large capacity memory that stores data once before performing signal processing is required. Because of this, by forming a structure in which memory circuits 121 are stacked at many stages, it becomes possible to increase the memory capacity effectively, and it becomes possible to effectively use the organic photoelectric conversion film 241.

<Method of Manufacturing Solid-State Image Pickup Apparatus in FIG. 47>

Next, a method of manufacturing the solid-state image pickup apparatus 111 in FIG. 47 is explained with reference to FIGS. 48 and 49.

Note that it is assumed that the solid-state image pickup element 120, the memory device board 201 and the logic circuit 122 have been manufactured similarly to the memory circuit 121 and the logic circuit 122, and the logic circuit 122 has been diced, and selected as a good element as a result of an inspection.

Figure 48:
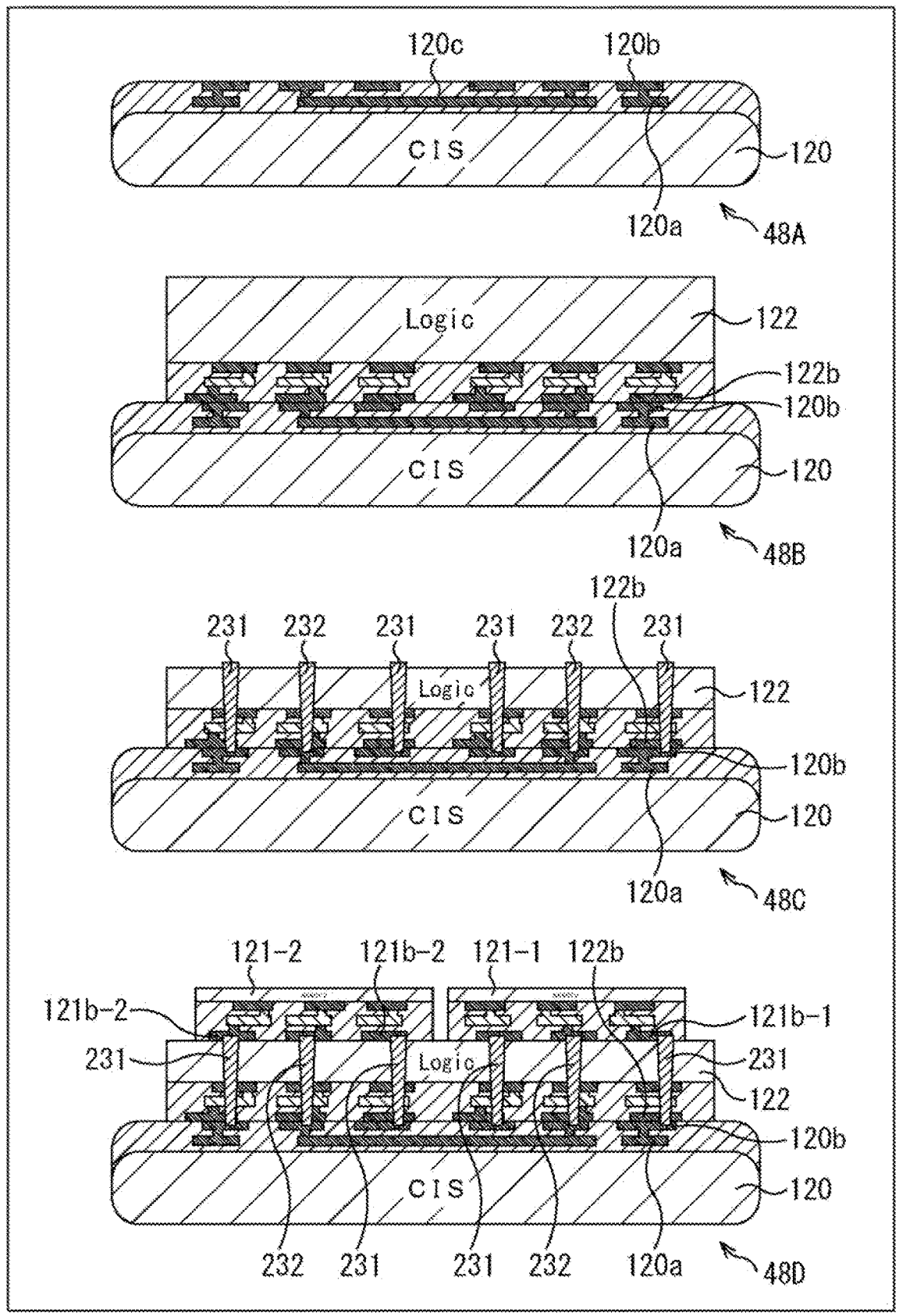
FIG. 48 is a figure for explaining a method of manufacturing the solid-state image pickup apparatus in FIG. 47.

In a first process, as depicted in a side cross-sectional view 48A in FIG. 48, the wires 120a and the pads 120b are formed in the solid-state image pickup element 120.

In a second process, as depicted in a side cross-sectional view 48B in FIG. 48, the logic circuit 122 is stacked on the solid-state image pickup element 120, and the pads 120b and the pads 122b are CuCu-joined.

In a third process, as depicted in a side cross-sectional view 48C in FIG. 48, Si of the logic circuit 122 is made thin, and the through-electrodes 231 and 232 are formed. The through-electrodes 231 are connected with the pads 120b of the solid-state image pickup element 120, and the through-electrodes 232 are connected with the pads 122b of the logic circuit.

In a fourth process, as depicted in a side cross-sectional view 48D in FIG. 48, the memory circuits 121-1 and 121-2 are arranged being arrayed on the logic circuit 122, and the through-electrodes 231 and 232, and the pads 121b-1 and 121b-2 of the memory circuits 121-1 and 121-2 are CuCu-connected.

Figure 49:
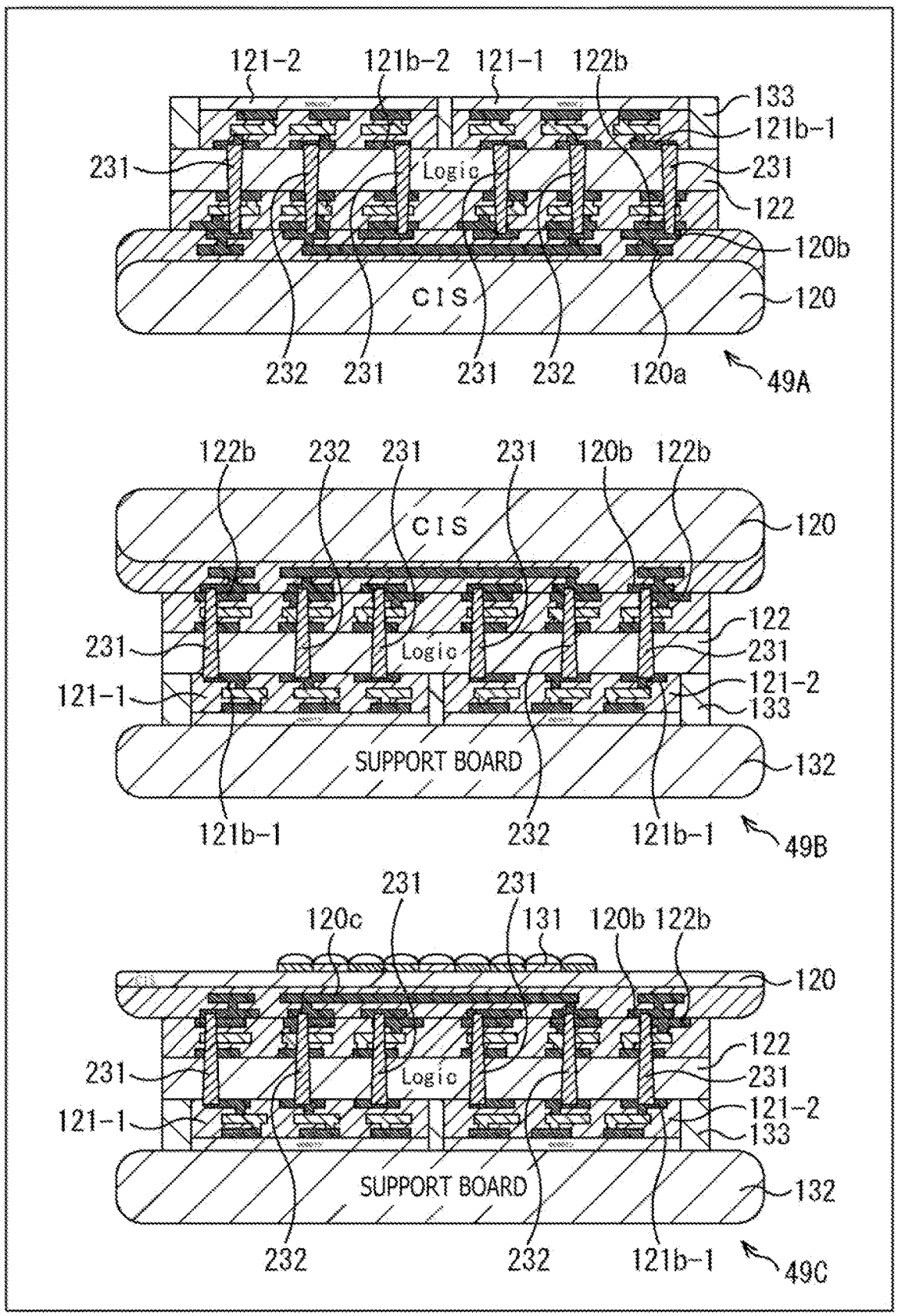
FIG. 49 is another figure for explaining the method of manufacturing the solid-state image pickup apparatus in FIG. 47.

In a fifth process, as depicted in a side cross-sectional view 49A in FIG. 49, the memory circuits 121-1 and 121-2 are formed being embedded in the oxide film 133, and further surfaces of the memory circuits 121-1 and 121-2 are flattened by CMP.

In a sixth process, as depicted in a side cross-sectional view 49B in FIG. 49, the state in the side cross-sectional view 49A is reversed vertically, and the memory circuits 121-1 and 121-2 are connected and fixed onto the support board 132.

In a seventh process, as depicted in a side cross-sectional view 49C in FIG. 49, the Si board of the solid-state image pickup element 120 is made thin, and thereafter the color filters and on-chip lenses pixels 131 are formed.

Note that, in a case where memory circuits 121 are stacked further, the memory circuits 121 are stacked at a necessary number of stages by repeating the fourth and fifth processes explained with reference to the side cross-sectional view 48D in FIG. 48, and the side cross-sectional view 49A in FIG. 49.

Because the solid-state image pickup apparatus 111 manufactured by the processes above also can be manufactured by stacking the good memory circuit 121 and logic circuit 122, it is possible to enhance the theoretical yield, and it becomes possible to reduce the cost.

In addition, by stacking many stages of memory circuits 121 further, it becomes possible to realize a large capacity of a memory, and it becomes possible to stably realize signal processing in the solid-state image pickup element 120 like the one that uses the organic photoelectric conversion film 241.

11. Ninth Embodiment

<Configuration Example of Solid-State Image Pickup Apparatus in which Wiring Layer is Formed on Side of Support Board, and Terminals of Wire Bonding are Formed>

While in the example explained above, the good memory circuit 121 and logic circuit 122 are stacked on the solid-state image pickup element 120 to manufacture the solid-state image pickup apparatus 111, a wiring layer may be formed on the side of the support board, and terminals of wire bonding may be formed.

Figure 50:
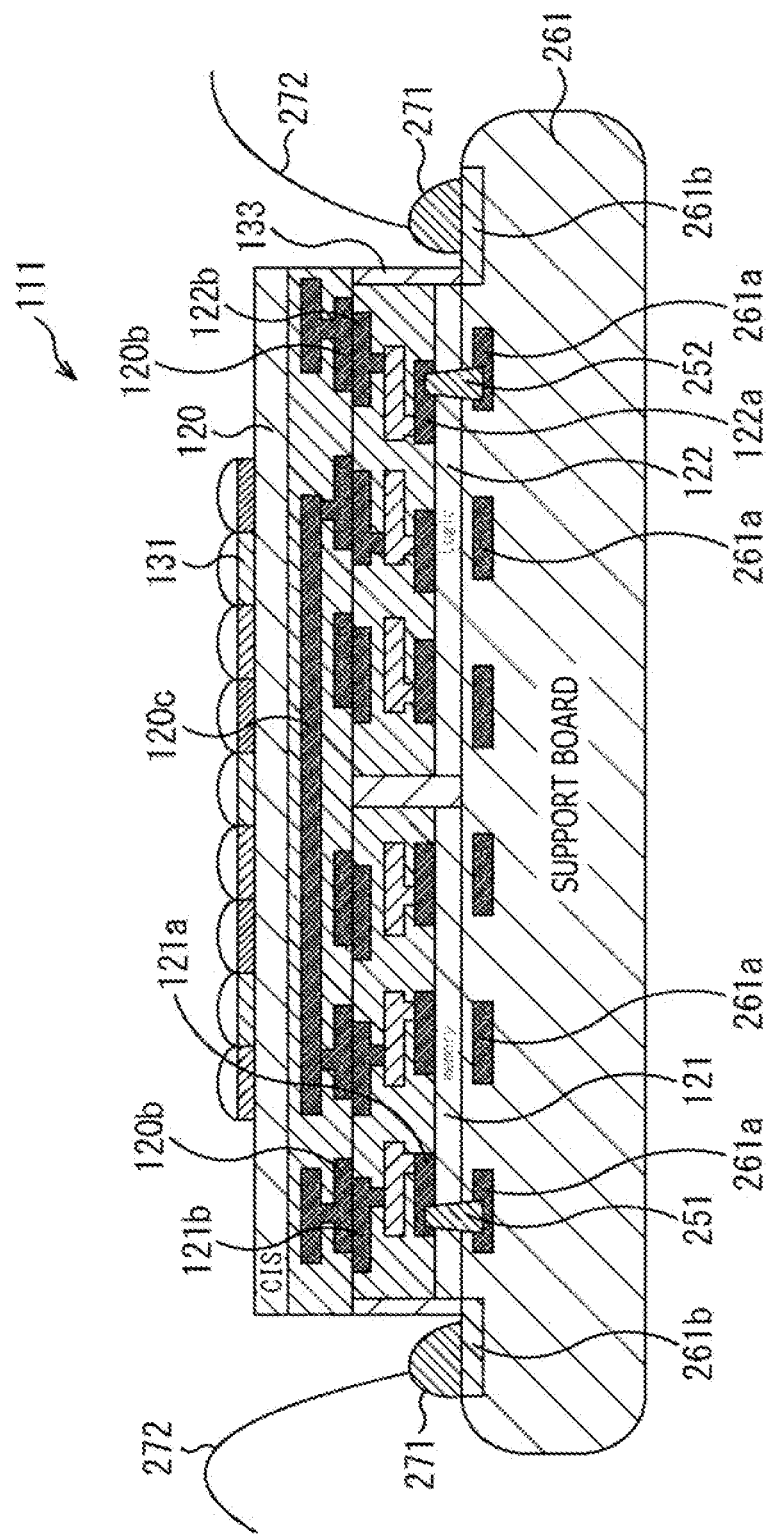
FIG. 50 is a figure for explaining a configuration example of the solid-state image pickup apparatus according to a ninth embodiment of the present disclosure.

FIG. 50 depicts a configuration example of the solid-state image pickup apparatus 111 in which a wiring layer is formed on the side of the support board, and terminals of wire bonding are formed.

The solid-state image pickup apparatus 111 in FIG. 50 has a configuration in which wires 261a are formed in a support board 261 and are electrically connected with terminals 261b at left and right end sections. The wires 261a are connected with the wires 121a and 122a via through-electrodes 251 and 252 that penetrate the Si boards of the memory circuit 121 and the logic circuit 122. In addition, because the pads 121b and 122b of the memory circuit 121 and the logic circuit 122 are CuCu-joined with the wires 120a of the solid-state image pickup element 120, the wires 261a are electrically connected also with the solid-state image pickup element 120 via the memory circuit 121 and the logic circuit 122.

The terminals 261b are provided with bonding sections 271 to which wires 272 are connected, and the solid-state image pickup apparatus 111 has a configuration that can transmit and receive signals to and from an external apparatus via the wires 272 via the bonding sections 271.

<Method of Manufacturing Solid-State Image Pickup Apparatus in FIG. 50>

Next, a method of manufacturing the solid-state image pickup apparatus 111 in FIG. 50 is explained with reference to FIG. 51 and FIG. 52. Note that it is assumed that the solid-state image pickup element 120, the memory circuit 121, and the logic circuit 122 have been manufactured, and the memory circuit 121 and the logic circuit 122 have been diced, and selected as good elements as a result of an inspection.

In addition, an explanation is given below assuming that the wires 120a and the pads 120b have been formed on the solid-state image pickup element 120, the memory circuit 121, and the logic circuit 122 have been stacked on the solid-state image pickup element 120, the pads 120b, and the pads 121b and 122b have been CuCu-joined and embedded in the oxide film 133, and Si of the memory circuit 121 and the logic circuit 122 have been made thin, and flattened.

Figure 51:
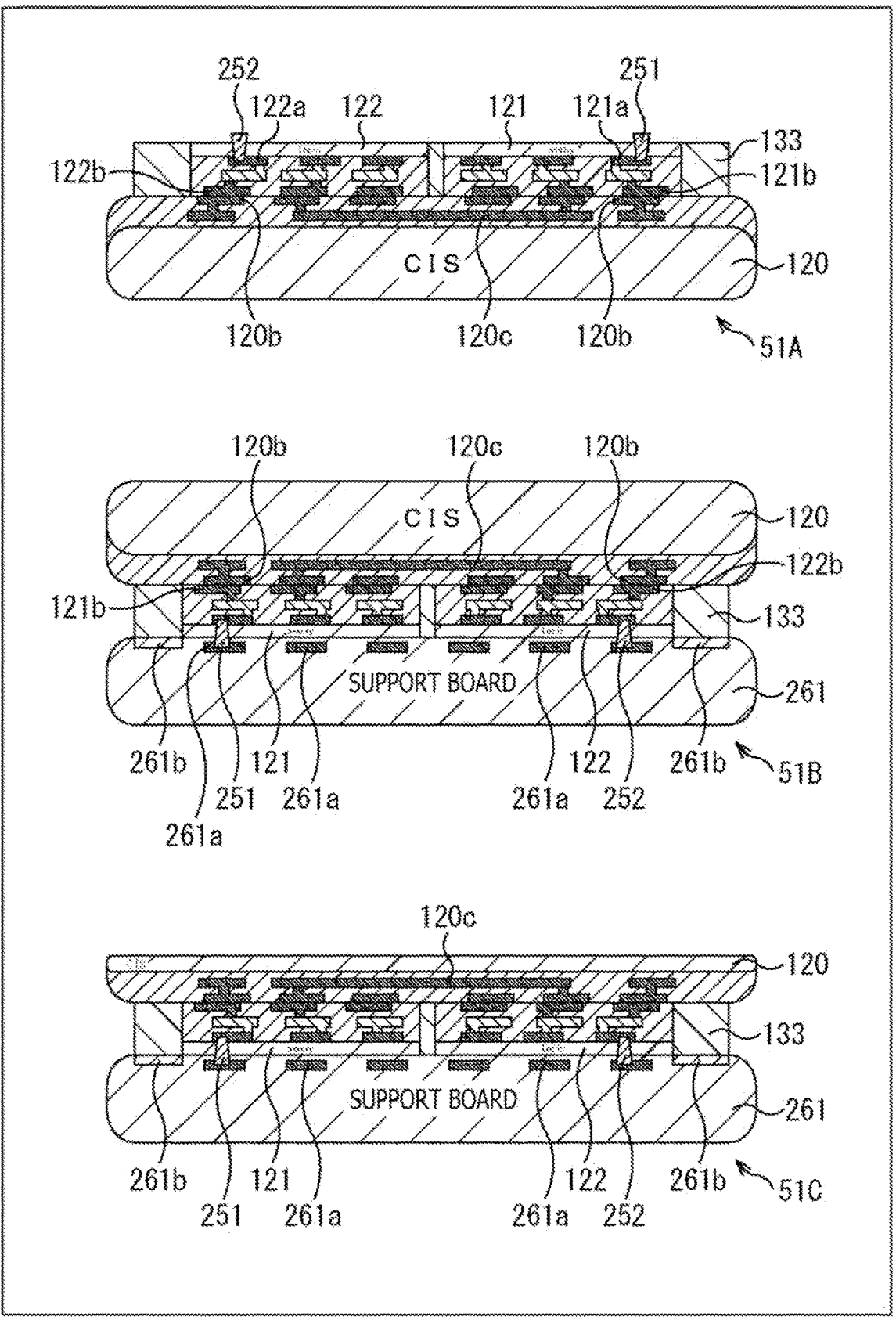
FIG. 51 is a figure for explaining a method of manufacturing the solid-state image pickup apparatus in FIG. 50.

In a first process, as depicted in a side cross-sectional view 51A in FIG. 51, the through-electrodes 251 and 252 are formed to the wires 121a and 122a in the Si boards of the memory circuit 121 and the logic circuit 122.

In a second process, as depicted in a side cross-sectional view 51B in FIG. 51, the configuration in the side cross-sectional view 51A in FIG. 51 is vertically reversed, and is joined to the support board 261 in which the wires 261a and the terminals 261b are formed. At this time, the through-electrodes 251 and 252 are joined with the wires 261a of the support board 261.

In a third process, as depicted in a side cross-sectional view 51C in FIG. 51, the Si board of the solid-state image pickup element 120 is made thin.

Figure 52:
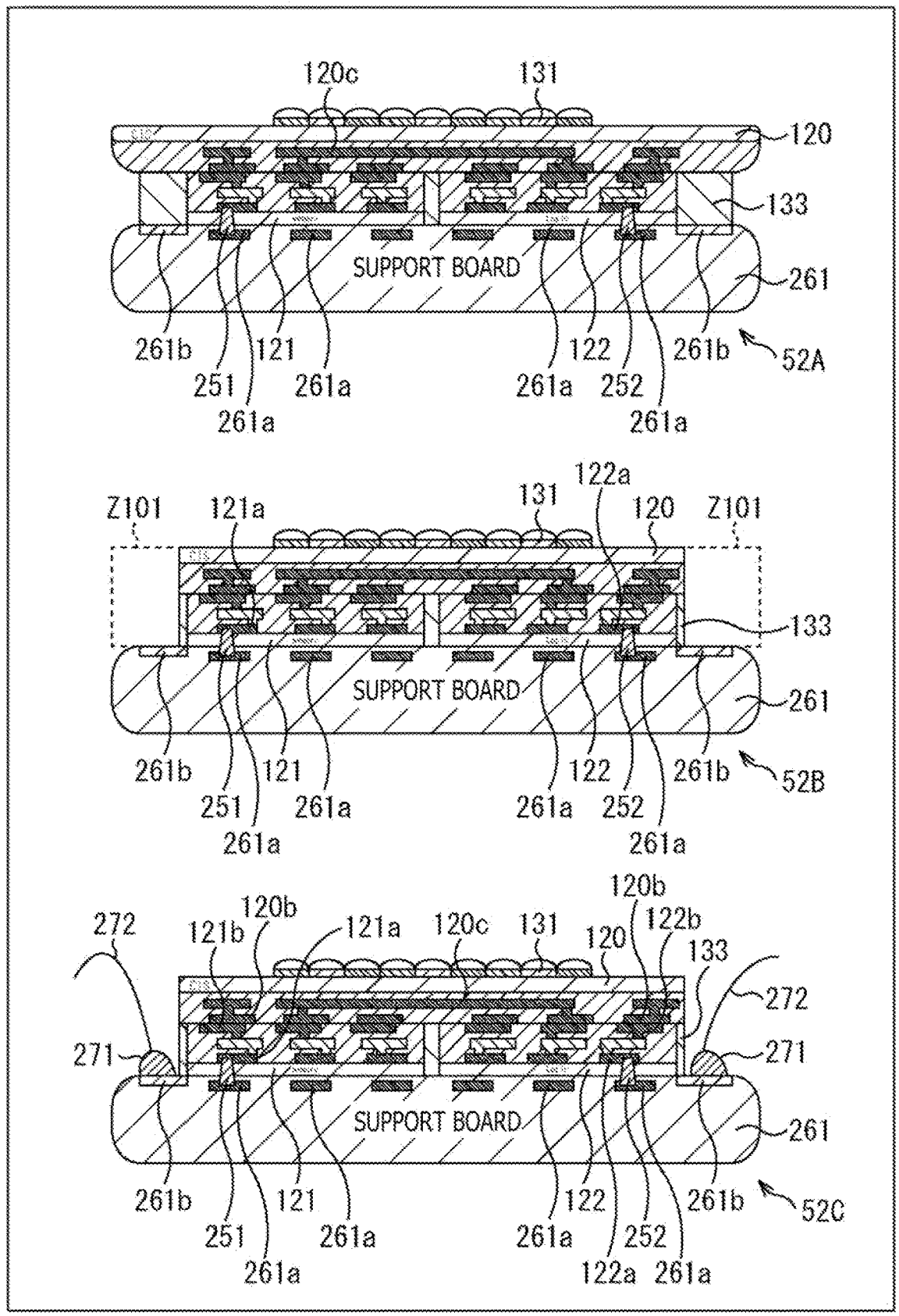
FIG. 52 is another figure for explaining the method of manufacturing the solid-state image pickup apparatus in FIG. 50.

In a fourth process, as depicted in a side cross-sectional view 52A in FIG. 52, the color filters and on-chip lenses pixels 131 are formed on the solid-state image pickup element 120.

In a fifth process, as depicted in a side cross-sectional view 52B in FIG. 52, the oxide film 133 and the solid-state image pickup element 120 that are in upper sections of the terminals 261b surrounded by dotted lines in the figure are partially cut out, and the terminals 261b are made exposed.

In a sixth process, as depicted in a side cross-sectional view 52C in FIG. 52, the wires 272 are connected with the terminals 261b via the bonding sections 271, and the solid-state image pickup apparatus 111 is completed.

In such a manufacturing method also, it becomes possible to enhance the theoretical yield, and so it becomes possible to reduce the cost.

Figure 53:
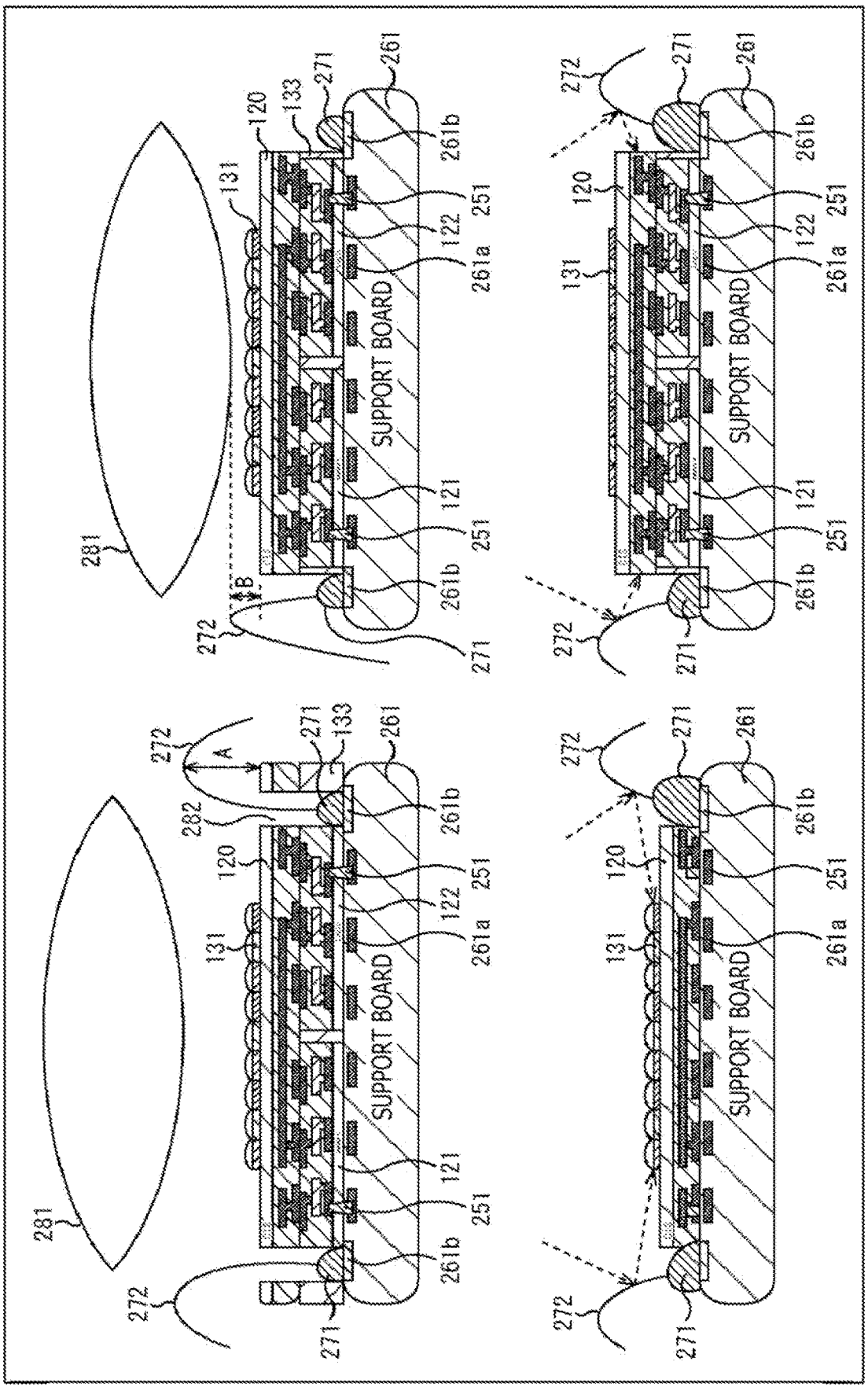
FIG. 53 is a figure for explaining effects of the solid-state image pickup apparatus in FIG. 50.

In addition, by manufacturing by such processes, for example, if the wires 272 are to be connected by the bonding sections 271 by providing through-holes 282 on the terminals 261b as depicted in an upper left section in FIG. 53, it becomes necessary to keep a distance to a lens 281, and accordingly this becomes a hindrance to a reduction of the height of the solid-state image pickup apparatus 111.

That is, in a case where the wires 272 are placed around via the through-holes 282 as depicted in the upper left section in FIG. 53, the space required for handling in order to cope with the bending of the wires 272 increases, and so the distance to the lens 281 needs to be a distance A.

In contrast to this, in the case of the solid-state image pickup apparatus 111 manufactured by the manufacturing method of the present disclosure, the space required for handling of the wires 272 can be made small as depicted in an upper right section in FIG. 53, and so the distance between the solid-state image pickup element 120 and the lens 281 can be made a distance B shorter than the distance A.

As a result, it becomes possible to realize a reduction of the height of the solid-state image pickup apparatus 111.

In addition, in a case where the solid-state image pickup element 120 is arranged directly on the support board 261 as depicted in a lower left section in FIG. 53, there is a fear that a ghost or a flare occurs due to incident light reflected off the wires 272 as represented by dotted arrows.

In contrast to this, in the case of the solid-state image pickup apparatus 111 manufactured by the manufacturing method of the present disclosure, as depicted in a lower right section in FIG. 53, incident light reflected off the wires 272 enters a side-surface section of the solid-state image pickup element 120, and side-surface sections of the memory circuit 121 and logic circuit 122, and so it becomes possible to suppress the occurrence of a ghost and a flare.

12. Application Example of Ninth Embodiment

First Application Example of Ninth Embodiment

In the example explained above, the through-electrodes 251 and 252 are formed from the memory circuit 121 and the logic circuit 122, respectively, and signals from the solid-state image pickup element 120 are output to the outside via the wires 272 connected to the bonding sections 271 via the memory circuit 121 and the logic circuit 122, and the wires 261a and the terminals 261b of the support board 261.

Figure 54:
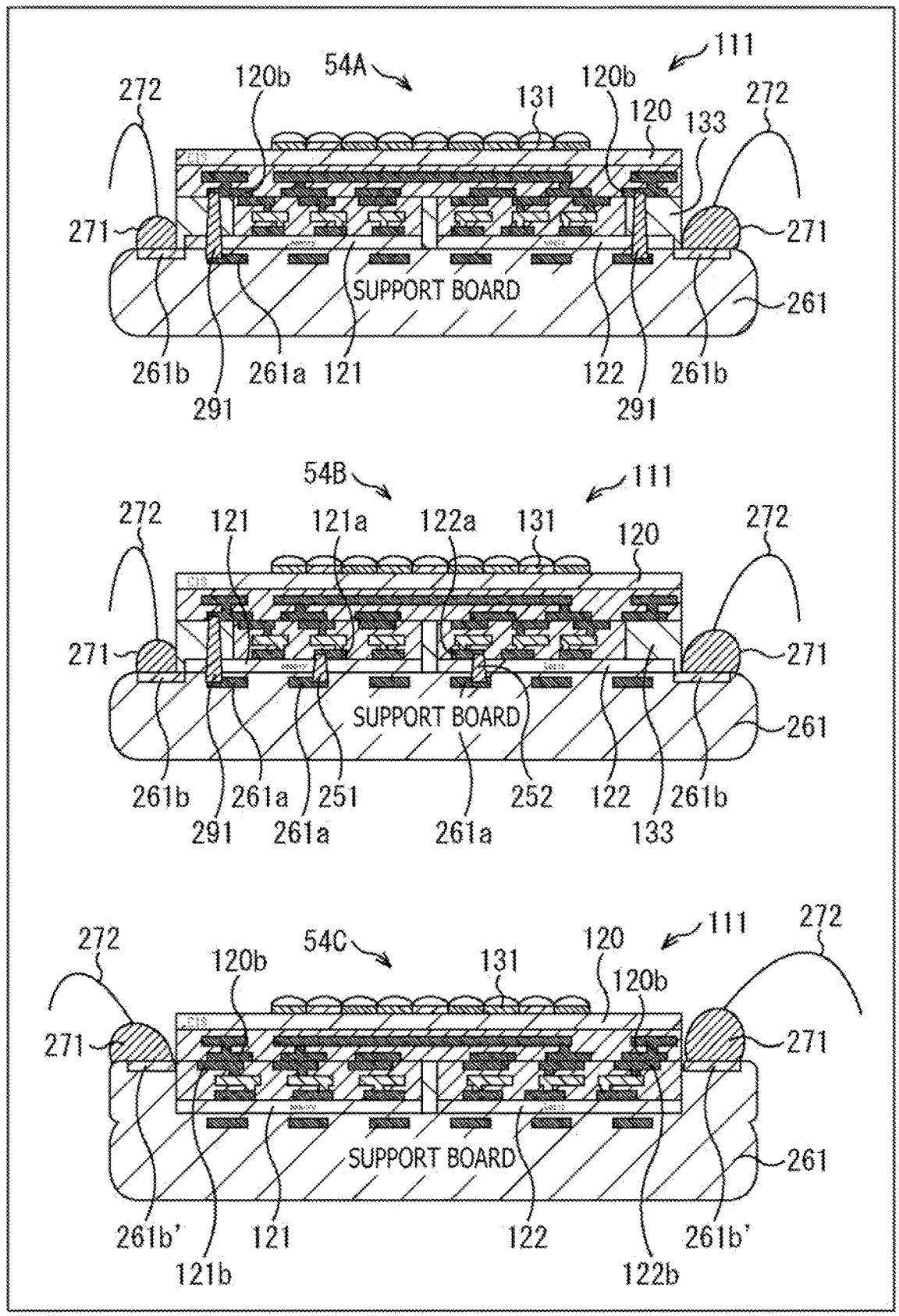
FIG. 54 is a figure for explaining an application example of the solid-state image pickup apparatus according to the ninth embodiment of the present disclosure.

However, for example, as depicted in a side cross-sectional view 54A in FIG. 54, through-electrodes 291 that penetrate the oxide film 133 without penetrating the memory circuit 121 and the logic circuit 122, and connect the pads 120b of the solid-state image pickup element 120, and the wires 261a of the support board 261 may be formed.

In this case, the solid-state image pickup element 120, and the wires 261a of the support board 261 are connected directly via the through-electrodes 291. It should be noted however that, in this case, the memory circuit 121 and the logic circuit 122 become not electrically connected with the support board 261, but output to the outside is possible via wires in the solid-state image pickup element 120, and the through-electrodes 291.

Second Application Example of Ninth Embodiment

While in the examples explained above, either the through-electrodes 251 and 252 or the through-electrodes 291 are provided, all of them may be provided in one possible configuration.

That is, as depicted in a side cross-sectional view 54B in FIG. 54, the through-electrodes 291 that connect the pads 120b of the solid-state image pickup element 120, and the wires 261a of the support board 261, the through-electrodes 251 that connect the wires 121a of the memory circuit 121, and the wires 261a, and the through-electrodes 251 that connect the wires 122a of the logic circuit 122, and the wires 261a may be provided.

In this case, the solid-state image pickup element 120, the memory circuit 121, and the logic circuit 122 are individually independently electrically connected with the support board 261, and so it becomes unnecessary to provide communication wires and the like.

Third Application Example of Ninth Embodiment

While in the examples explained above, at least any one of the through-electrodes 251 and 252, and the through-electrodes 291 are provided, output to the outside may not be performed via the support board 261 via the through-electrodes 251, 252, and 271, and terminals may be provided in the electrically connected state in a wiring layer in the memory circuit 121 and the logic circuit 122 on which the pads 121b and 122b are provided.

That is, in the solid-state image pickup apparatus 111 in a side cross-sectional view 54C in FIG. 54, terminals 261b' in the electrically connected state are provided in the wiring layer in the memory circuit 121 and the logic circuit 122 on which the pads 121b and 122b are provided.

By adopting such a configuration, it becomes possible to form the terminals 261b' and the bonding sections 271 at positions in a latter stage in terms of the direction of incidence than the incidence surface of the solid-state image pickup element 120, and it becomes possible to suppress the space required for handling by the wires 272, without providing through-electrodes. Thereby, as explained with reference to the upper half of FIG. 53, it becomes possible to make the distance to a lens short, and to realize a reduction of the height, without providing through-electrodes in the solid-state image pickup apparatus 111.

13. Tenth Embodiment

While in the example explained above, wires are led out from bonding sections at the top surfaces of end sections of the support board, and signals are output to the outside therethrough, it may be made possible to output signals of the solid-state image pickup element 120 directly from the backside of the support board.

Figure 55:
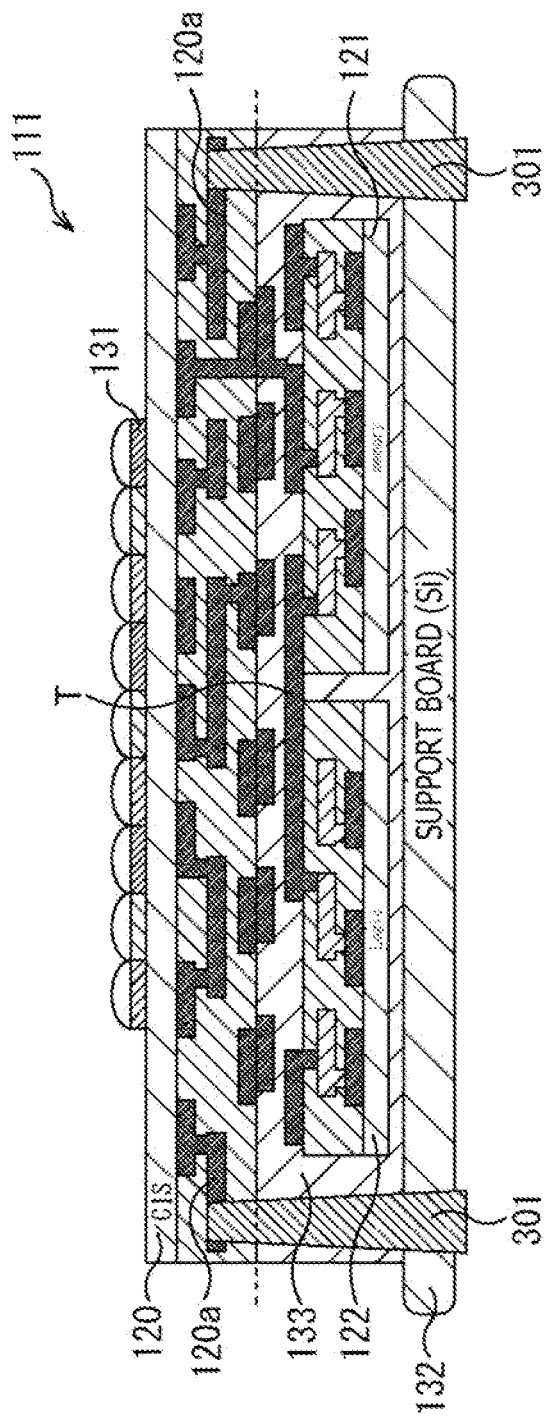
FIG. 55 is a figure for explaining a configuration example of the solid-state image pickup apparatus according to a tenth embodiment of the present disclosure.

FIG. 55 depicts a configuration example of the solid-state image pickup apparatus 111 that can output signals directly from through-electrodes 301 connected to the solid-state image pickup element 120 from the backside of the support board 132, without going through the memory circuit 121 and the logic circuit 122.

With a configuration like the solid-state image pickup apparatus 111 in FIG. 55, it becomes possible to enhance the theoretical yield to thereby reduce the cost, and additionally to lead out signals from the solid-state image pickup element 120 from the backside of the support board 132.

Thereby, it becomes possible to configure signal processing circuits and the like by stacking them on the backside of the solid-state image pickup apparatus 111.

<Method of Manufacturing Solid-State Image Pickup Apparatus in FIG. 55>

Next, a method of manufacturing the solid-state image pickup apparatus 111 in FIG. 55 is explained with reference to FIG. 56 and FIG. 57. Note that a side cross-sectional view 56A in FIG. 56 depicts a state where the solid-state image pickup apparatus 111 in FIG. 12 has been manufactured. An explanation is given regarding the solid-state image pickup apparatus 111 in FIG. 55 assuming that it is generated by processing the solid-state image pickup apparatus 111 in FIG. 12.

In a first process, as depicted in a side cross-sectional view 56B in FIG. 56, the configuration in the side cross-sectional view 56A in FIG. 56 is vertically reversed, and is placed on a backing board 311 via an interference section 312 which includes a resin that can protect the color filters and on-chip lenses pixels 131 on the solid-state image pickup element 120, and is resistant to heat that is equal to or higher than 250° C., or the like.

In a second process, as depicted in a side cross-sectional view 56C in FIG. 56, the support board 132 is made thin.

Figure 57:
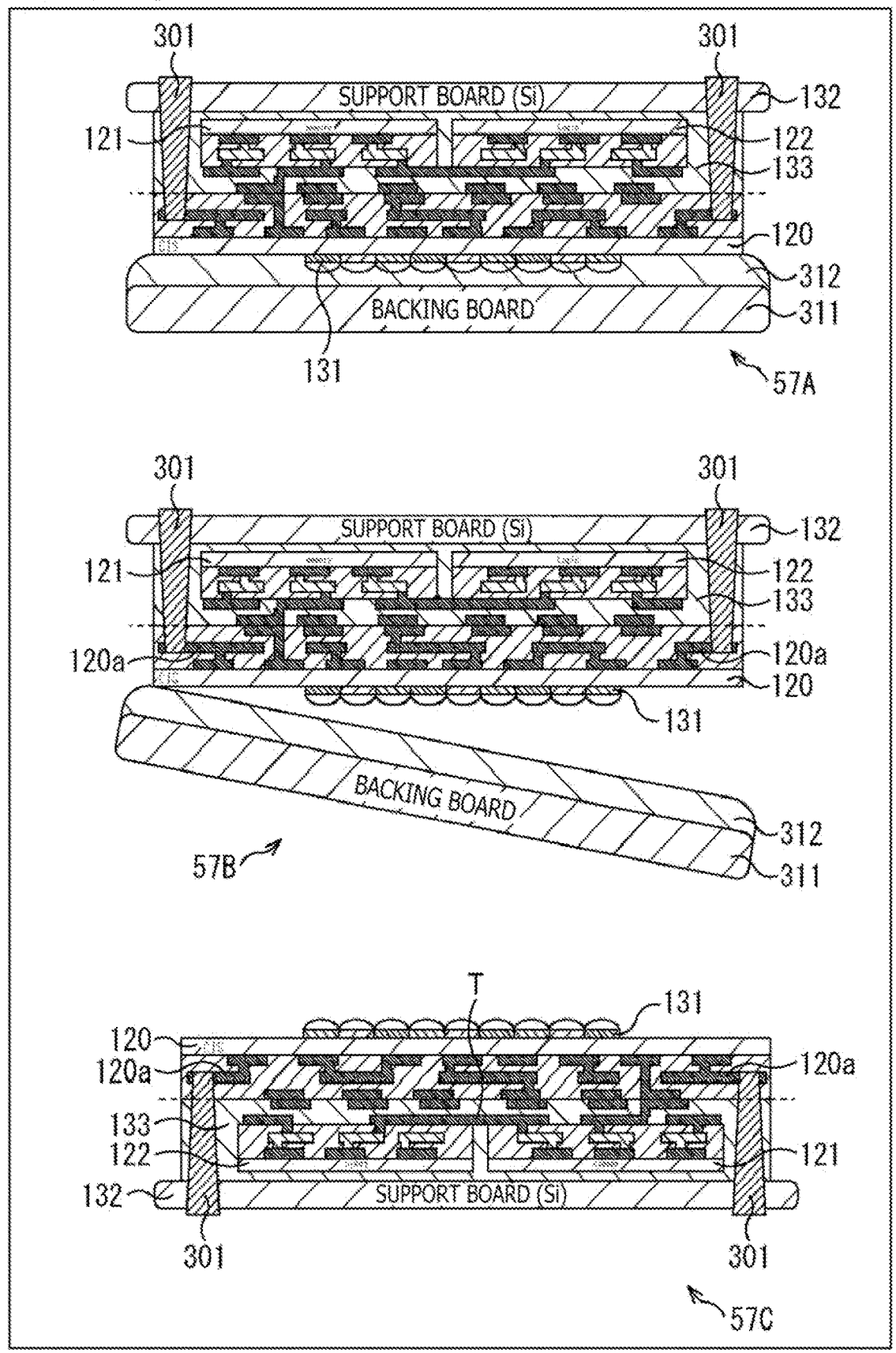
FIG. 57 is another figure for explaining a method of manufacturing the solid-state image pickup apparatus in FIG. 55.

In a third process, as depicted in a side cross-sectional view 57A in FIG. 57, the through-electrodes 301 are formed such that they penetrate the oxide film 133 from above the support board 132, and reach the wires 120a of the solid-state image pickup element 120.

In a fourth process, as depicted in a side cross-sectional view 57B in FIG. 57, the surface of the solid-state image pickup element 120 including the color filters and on-chip lenses pixels 131 is peeled off from the interference section 312, and the configuration is reversed vertically as depicted in a side cross-sectional view 57C to thereby complete the solid-state image pickup apparatus 111 in FIG. 55.

By a manufacturing method like the one above, it becomes possible to manufacture the solid-state image pickup apparatus 111 that can directly lead out signals of the solid-state image pickup element 120 from the backside of the support board 132 of the solid-state image pickup apparatus 111.

14. First Application Example of Tenth Embodiment

While in the example explained above, it is made possible to output signals of the solid-state image pickup element 120 directly from the backside of the support board by forming the through-electrodes 301, dug sections of the through-electrodes undesirably become thicker as the through-electrodes reach deeper positions, due to tapering. In view of this, it may be made possible to make the thicknesses of the through-electrodes thin by forming through-holes that are each formed separately in layers, and eventually stacking the through-holes to form the through-electrodes, not by forming the through-electrodes at once.

Here, in a method of manufacturing the solid-state image pickup apparatus 111 explained with reference to FIG. 58 to FIG. 60, through-electrodes are each formed separately in layers, and stacked.

Note that an explanation is given here on the premise that a memory circuit 121 and a logic circuit 122 extracted as good circuits have been placed on the re-arrangement board 151.

In a first process, through-electrodes 371 with predetermined depths are formed in advance on the support board 132 at positions corresponding to the through-electrodes 301 in FIG. 55. Then, as depicted in a side cross-sectional view 58A in FIG. 58, in a state in which the support board 132 is vertically reversed, the support board 132 is fixed onto the memory circuit 121 and the logic circuit 122 placed on the re-arrangement board 151.

Figure 58:
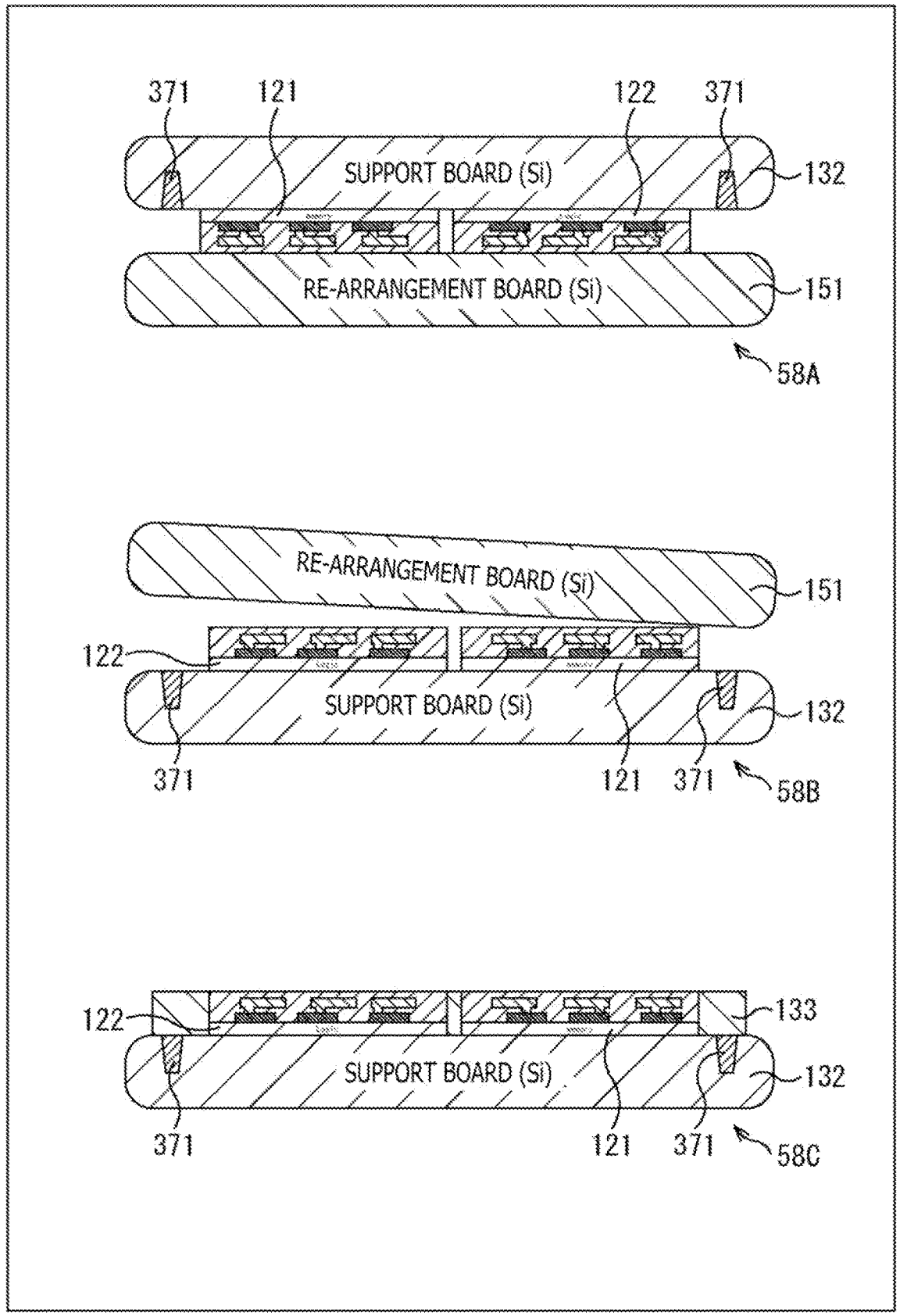
FIG. 58 is a figure for explaining a first application example of the method of manufacturing the solid-state image pickup apparatus according to the tenth embodiment of the present disclosure.

In a second process, as depicted in a side cross-sectional view 58B in FIG. 58, after the state of the side cross-sectional view 58A in FIG. 58 is vertically reversed, the re-arrangement board 151 is removed.

In a third process, as depicted in a side cross-sectional view 58C in FIG. 58, the memory circuit 121 and the logic circuit 122 are embedded in the oxide film 133, and flattened.

Figure 59:
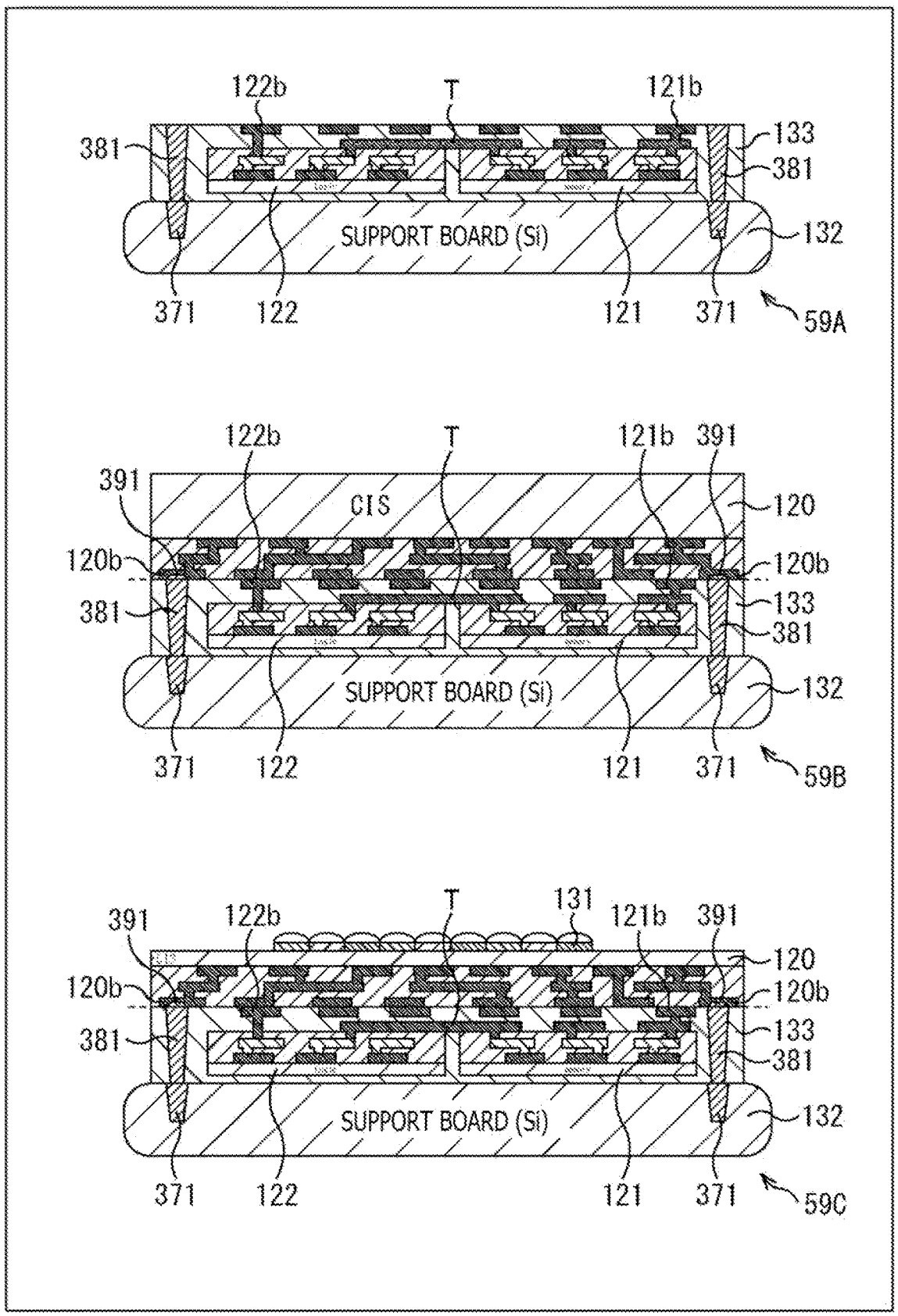
FIG. 59 is another figure for explaining the first application example of the method of manufacturing the solid-state image pickup apparatus according to the tenth embodiment of the present disclosure.

In a fourth process, as depicted in a side cross-sectional view 59A in FIG. 59, after the communication wire T, and the pads 121b and 122b are formed, through-electrodes 381 are formed in the oxide film 133 at positions corresponding to the through-electrodes 301 in FIG. 55. That is, the through-electrodes 381 become electrically connected with the through-electrodes 371.

In a fifth process, after through-electrodes 391 are formed at positions corresponding to the through-electrodes 301 in FIG. 55 of the solid-state image pickup element 120, as depicted in a side cross-sectional view 59B in FIG. 59, the state is vertically reversed, and the through-electrodes 391 are joined onto the memory circuit 121 and the logic circuit 122. That is, the through-electrodes 391 become electrically connected with the through-electrodes 381. That is, by the processes up to this point, the through-electrodes 371, 381, and 391 are configured as integrated through-electrodes.

In a sixth process, as depicted in a side cross-sectional view 59C in FIG. 59, the solid-state image pickup element 120 is made thin, and thereafter the color filters and on-chip lenses pixels 131 are formed on the image pickup surface.

Figure 60:
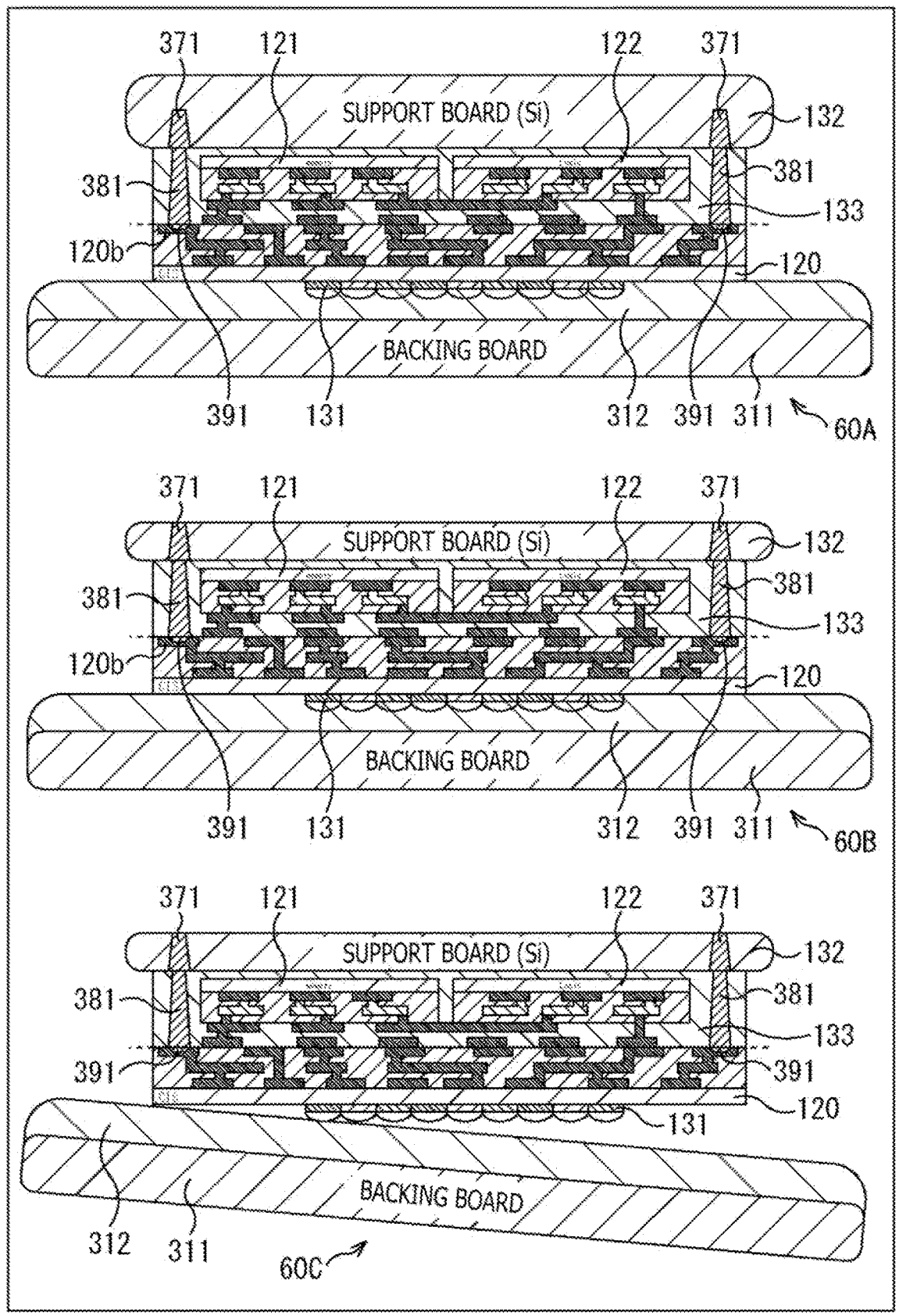
FIG. 60 is another figure for explaining the first application example of the method of manufacturing the solid-state image pickup apparatus according to the tenth embodiment of the present disclosure.

In a seventh process, as depicted in a side cross-sectional view 60A in FIG. 60, the configuration in the side cross-sectional view 59C in FIG. 59 in the vertically reversed state is placed on the backing board 311 via the interference section 312 which includes a resin that can protect the color filters and on-chip lenses pixels 131 on the solid-state image pickup element 120, and is resistant to heat that is equal to or higher than 250° C., or the like.

In an eighth process, as depicted in a side cross-sectional view 60B in FIG. 60, the support board 132 is made thin, and top sections of the through-electrodes 371 are exposed.

In a ninth process, as depicted in a side cross-sectional view 60C in FIG. 60, the interference section 312 is peeled off from the surface of the solid-state image pickup element 120 including the color filters and on-chip pixels 131, and the configuration is reversed vertically to thereby complete the solid-state image pickup apparatus 111 in FIG. 55.

By a manufacturing method like the one above, when through-electrodes to directly lead out signals of the solid-state image pickup element 120 to the backside of the support board 132 are formed, it becomes possible, by forming the through-electrodes 371, 381, and 391 in the individual layers, to form through-electrodes thinner than through-electrode formed at once.

15. Second Application Example of Tenth Embodiment

While in the example explained above, through-electrodes are formed, and through-electrodes that directly lead out signals of the solid-state image pickup element 120 from the backside of the support board 132 to be the backside of the solid-state image pickup apparatus 111 are formed, it may be made possible to lead out signals directly from the backside of the support board 132 by forming through-electrodes through each of the memory circuit 121 and the logic circuit 122.

Figure 61:
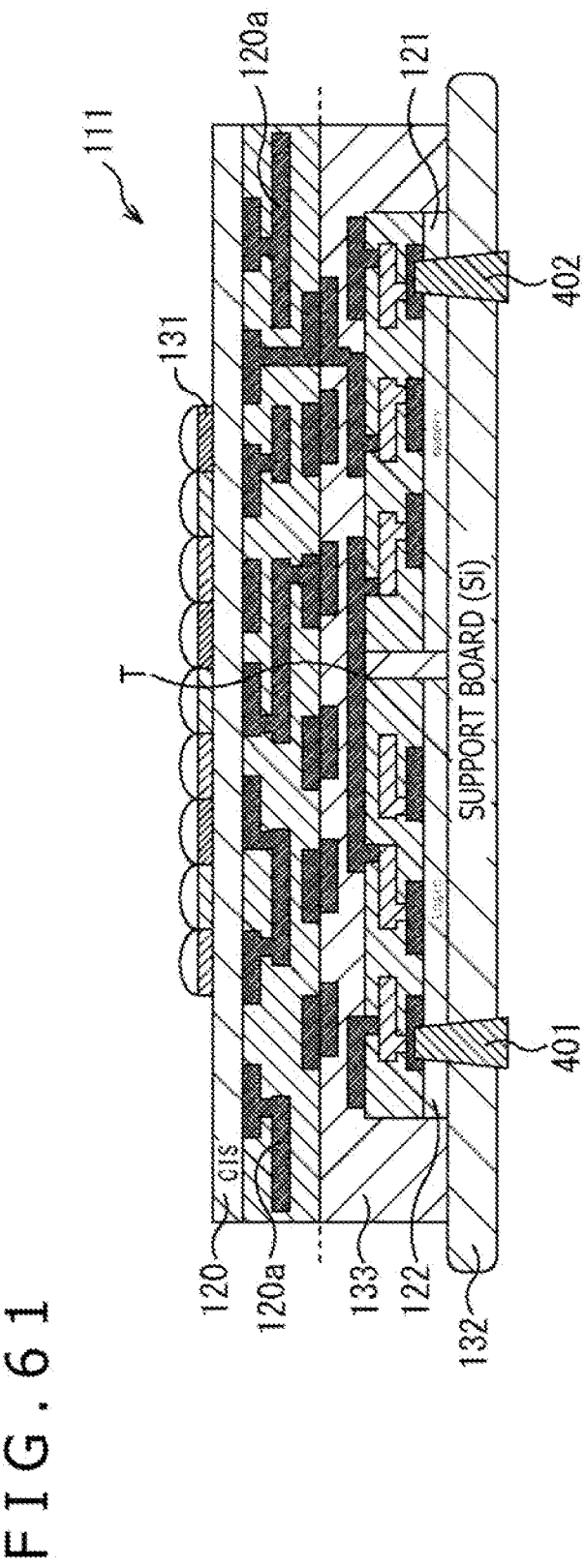
FIG. 61 is a figure for explaining a second application example of the method of manufacturing the solid-state image pickup apparatus according to the tenth embodiment of the present disclosure.

That is, as depicted in FIG. 61, through-electrodes 401 and 402 may be formed from the backside of the support board 132 such that they are connected to the wires 121a and 122a of the memory circuit 121 and the logic circuit 122, respectively, included in the solid-state image pickup apparatus 111.

Note that the method of manufacturing the solid-state image pickup apparatus 111 in FIG. 61 is similar to that in a case where the through-electrodes 301 or the through-electrodes 371, 381, and 391 are formed in the method of manufacturing the solid-state image pickup apparatus 111 in FIG. 55, and so an explanation thereof is omitted.

16. Examples of Application to Electronic Equipment

For example, the image pickup element mentioned above can be applied to various types of electronic equipment like image pickup apparatuses such as a digital still camera or a digital video camera, mobile phones having the image pickup function, or other equipment having the image pickup function.

Figure 62:
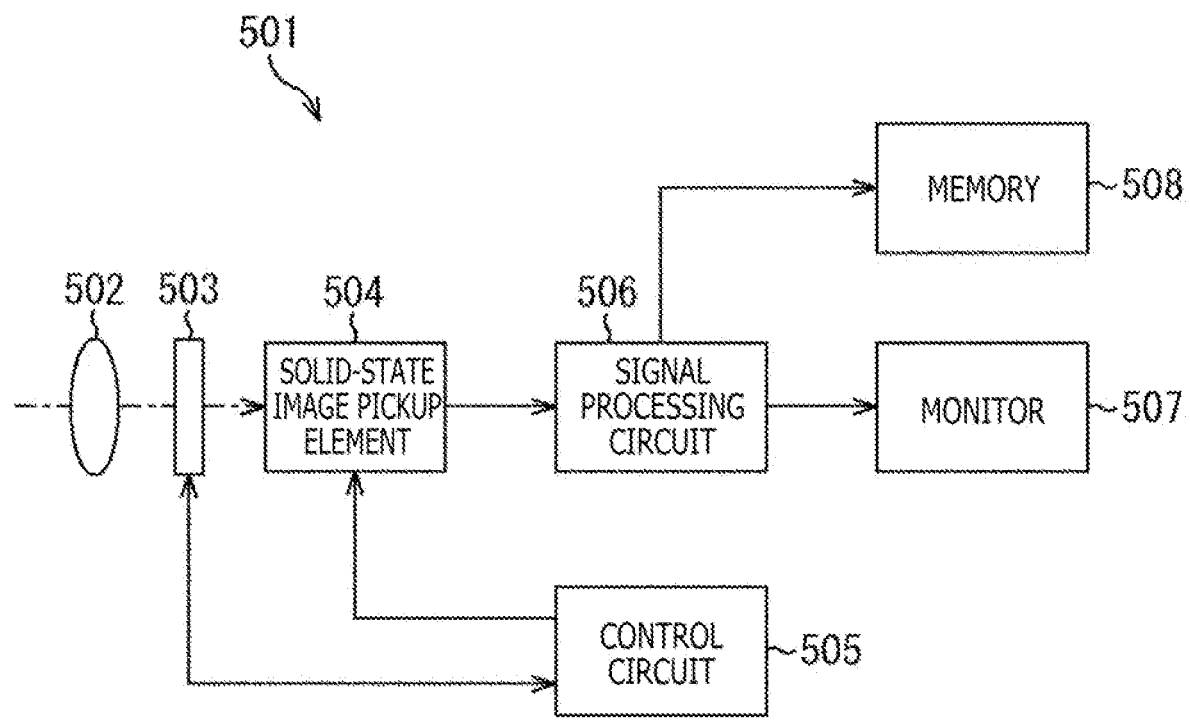
FIG. 62 is a block diagram depicting a configuration example of an image pickup apparatus as electronic equipment to which a configuration of the image pickup apparatus of the present disclosure is applied.

FIG. 62 is a block diagram depicting a configuration example of an image pickup apparatus as electronic equipment to which the present technology is applied.

An image pickup apparatus 501 depicted in FIG. 62 includes an optical system 502, a shutter apparatus 503, a solid-state image pickup element 504, a drive circuit 505, a signal processing circuit 506, a monitor 507, and a memory 508, and can capture still image images and moving images.

The optical system 502 includes one lens or plural lenses, guides light from a subject (incident light) to the solid-state image pickup element 504, and causes an image to be formed on the light-receiving surface of the solid-state image pickup element 504.

The shutter apparatus 503 is arranged between the optical system 502 and the solid-state image pickup element 504, and, under the control of the drive circuit 505, controls the light emission period and light blocking period of light into the solid-state image pickup element 504.

The solid-state image pickup element 504 includes a package including the solid-state image pickup element mentioned above. The solid-state image pickup element 504 accumulates a signal charge for a predetermined period according to light to form an image on the light-receiving surface after going through the optical system 502 and the shutter apparatus 503. The signal charge accumulated in the solid-state image pickup element 504 is transferred according to a drive signal (timing signal) supplied from the drive circuit 505.

The drive circuit 505 outputs drive signals to control the transfer operation of the solid-state image pickup element 504, and the shutter operation of the shutter apparatus 503, and drives the solid-state image pickup element 504 and the shutter apparatus 503.

The signal processing circuit 506 performs various types of signal processing on a signal charge output from the solid-state image pickup element 504. An image (image data) obtained by the signal processing performed by the signal processing circuit 506 is supplied to and displayed on the monitor 507, or is supplied to and stored (recorded) on the memory 508, for example.

In the thus-configured image pickup apparatus 501 also, by applying the solid-state image pickup apparatus 111 mentioned above to the optical system 502 and the solid-state image pickup element 204, it becomes possible to enhance the yield, and reduce the cost related to manufacturing.

17. Use Examples of Solid-State Image Pickup Apparatus

Figure 63:
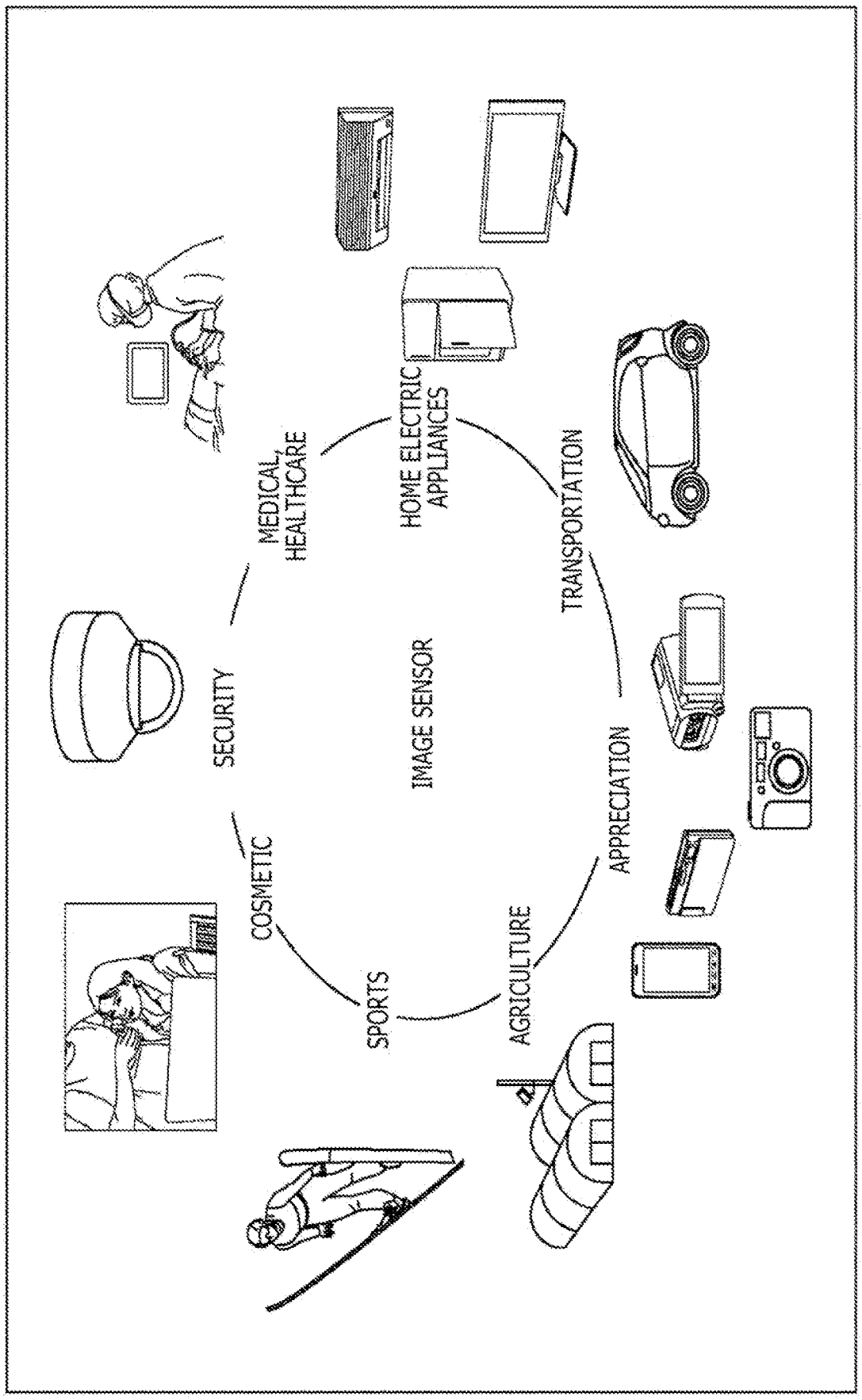
FIG. 63 is a figure for explaining a use example of an image pickup apparatus to which the technology of the present disclosure is applied.

FIG. 63 is a figure depicting use examples in which the solid-state image pickup apparatus 111 mentioned above is used.

The solid-state image pickup apparatus mentioned above can be used in various cases in which light such as visible light, infrared light, ultraviolet light, or X-ray is sensed, like the following ones, for example.

- Apparatuses such as digital cameras or mobile equipment having the camera function that capture images provided for appreciation
- Apparatuses provided for transportation such as vehicle-mounted sensors that capture images of spaces in front of, behind, around, inside and the like of an automobile, monitor cameras that monitor travelling vehicles and roads, or distance measurement sensors that perform measurement of the distances between vehicles and the like, for safe driving by automatic stop and the like, recognition of the state of a driver, and the like
- Apparatuses provided for home electric appliances such as TVs, refrigerators, or air conditioners for capturing images of gestures of a user, and performing equipment operation according to the gestures
- Apparatuses provided for medical care or healthcare such as endoscopes or apparatuses for capturing images of blood vessels by receiving infrared light
- Apparatuses provided for security such as monitor cameras for crime prevention uses, or cameras for human authentication uses
- Apparatuses provided for cosmetic purposes such as skin measurement devices that capture images of skin, or microscopes that capture images of scalps
- Apparatus provided for sports such as action cameras for sports uses and the like, or wearable cameras
- Apparatuses provided for agriculture such as cameras for monitoring the states of fields and crops

18. Examples of Application to Endoscopic Surgery System

The technology according to the present disclosure (the present technology) can be applied to various products. For example, the technology according to the present disclosure may be applied to endoscopic surgery systems.

Figure 64:
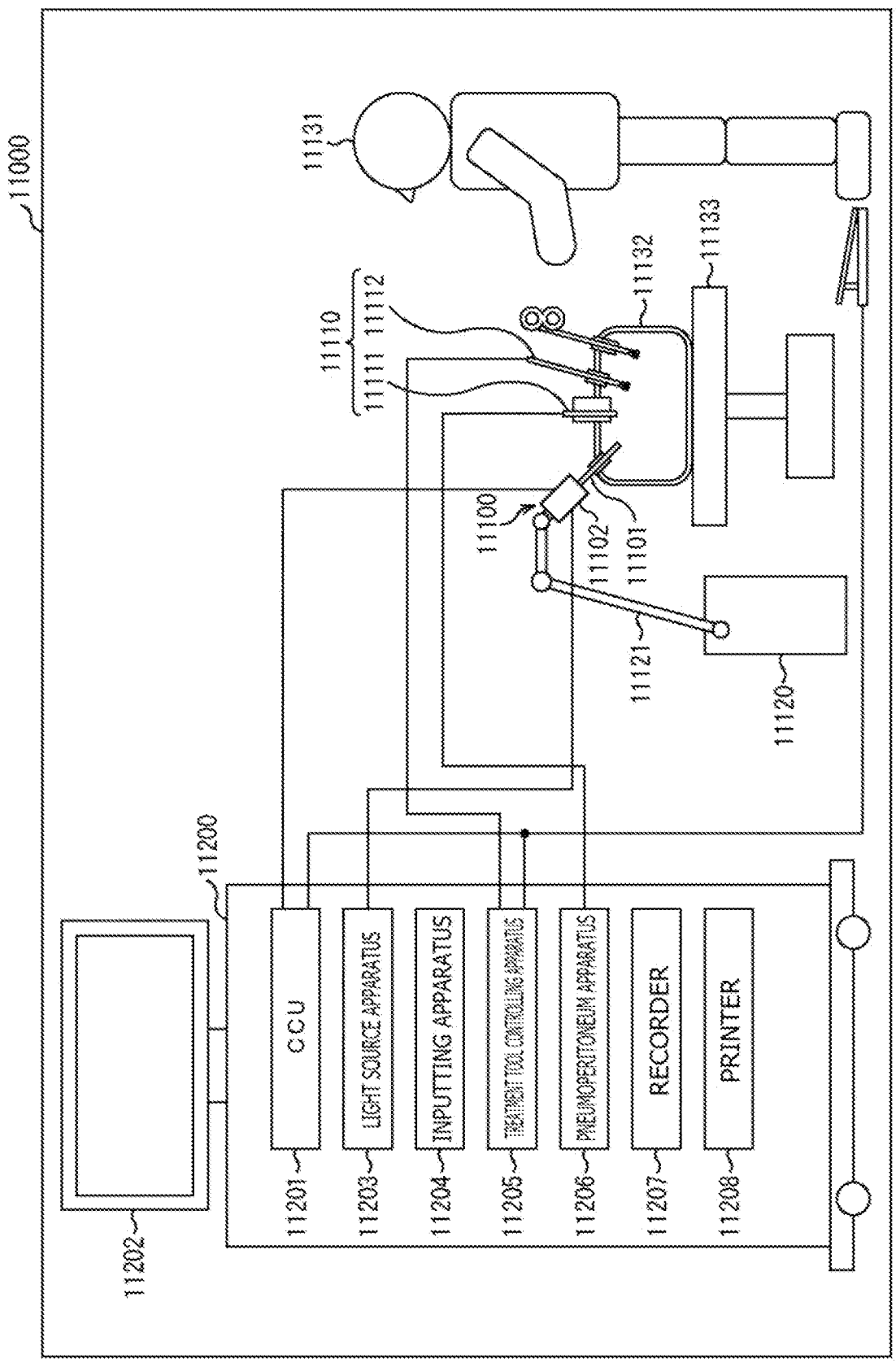
FIG. 64 is a view depicting an example of a schematic configuration of an endoscopic surgery system.

FIG. 64 is a view depicting an example of a schematic configuration of an endoscopic surgery system to which the technology according to an embodiment of the present disclosure (present technology) can be applied.

In FIG. 64, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 65:
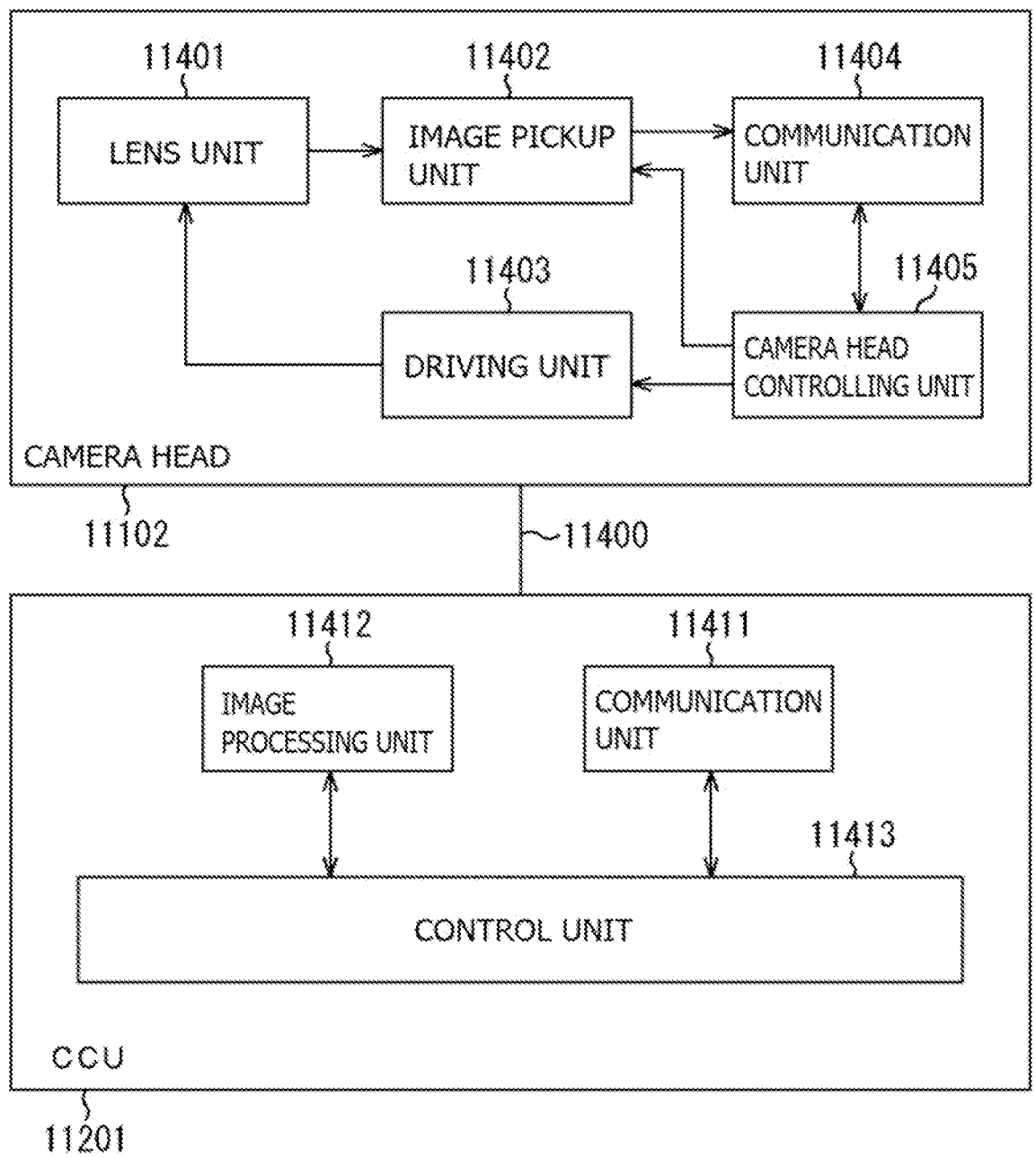
FIG. 65 is a block diagram depicting an example of a functional configuration of a camera head and a camera control unit (CCU).

FIG. 65 is a block diagram depicting an example of a functional configuration of the camera head 11102 and the CCU 11201 depicted in FIG. 64.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure can be applied is explained above. The technology according to the present disclosure can be applied to the endoscope 11100, (the image pickup unit 11402 of) the camera head 11102 and the like in the configurations explained above. Specifically, the solid-state image pickup apparatus 111 of the present disclosure can be applied to the image pickup unit 10402. By applying the technology according to the present disclosure to the endoscope 11100, (the image pickup unit 11402 of) the camera head 11102 and the like, it becomes possible to enhance the yield, and reduce the cost related to manufacturing.

Note that, while the endoscopic surgery system is explained as one example here, the technology according to the present disclosure may be applied to others, for example, microscopic surgery systems and the like.

19. Examples of Application to Mobile Body

The technology according to the present disclosure (the present technology) can be applied to various products. For example, the technology according to the present disclosure may be realized as an apparatus to be mounted on any type of mobile body such as an automobile, an electric automobile, a hybrid electric automobile, a motorcycle, a bicycle, a personal mobility, an airplane, a drone, a ship, or a robot.

Figure 66:
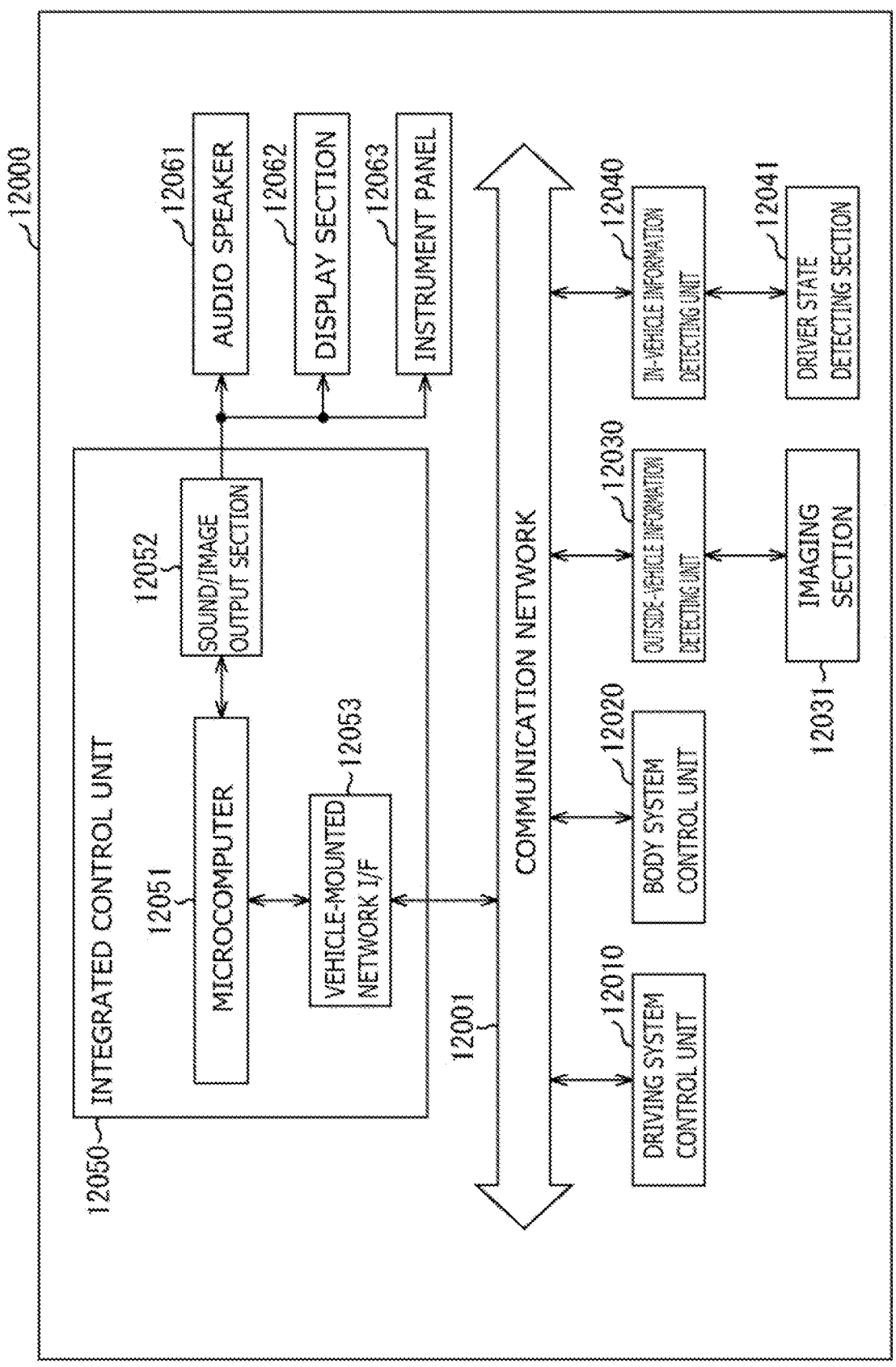
FIG. 66 is a block diagram depicting an example of schematic configuration of a vehicle control system.

FIG. 66 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 66, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 66, an audio speaker 12061, a display section 12062, and an instrument panel 12063 are illustrated as the output device. The display section 12062 may, for example, include at least one of an on-board display and a head-up display.

Figure 67:
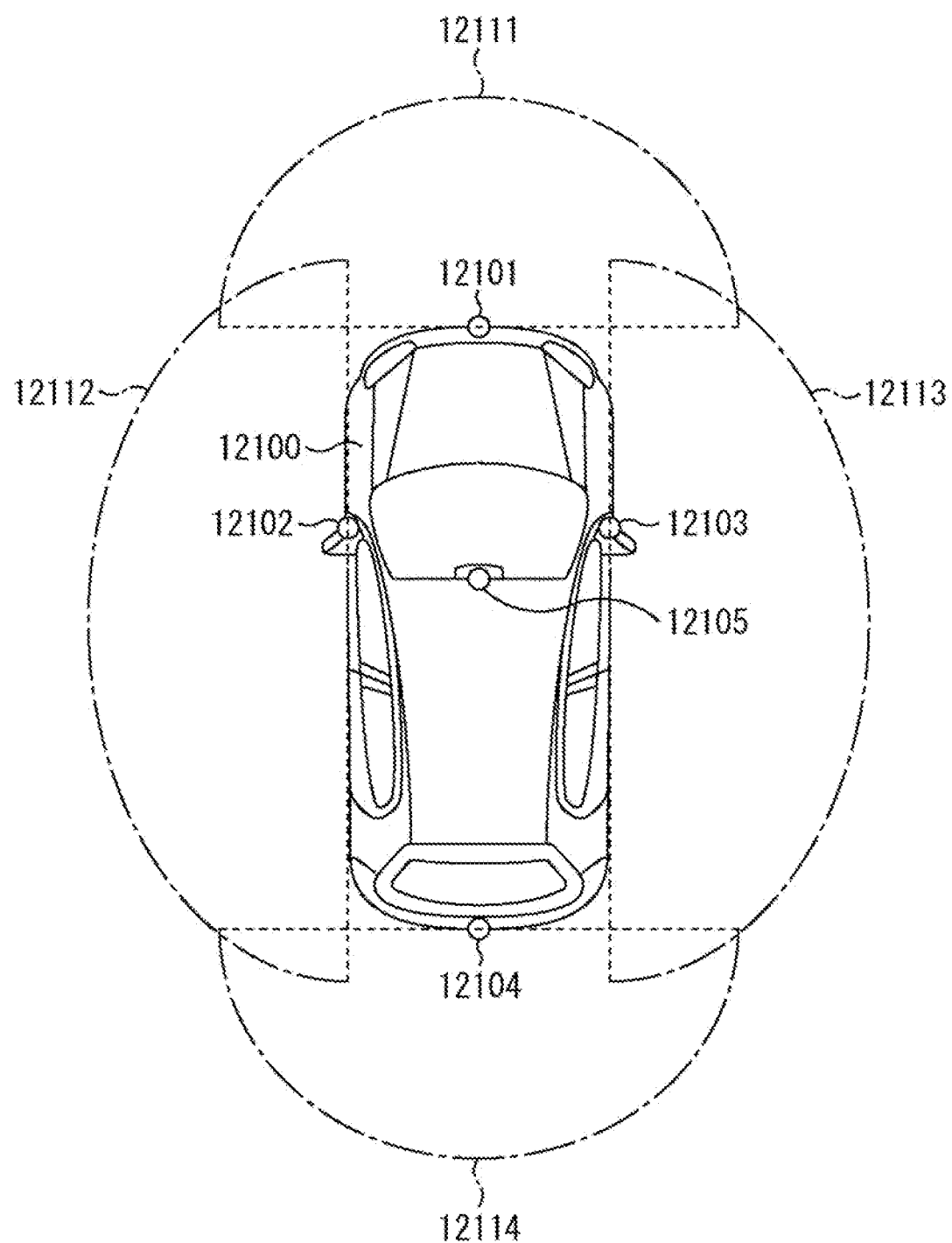
FIG. 67 is a diagram of assistance in explaining an example of installation positions of an outside-vehicle information detecting section and an imaging section.

FIG. 67 is a diagram depicting an example of the installation position of the imaging section 12031.

In FIG. 67, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 67 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure can be applied is explained above. The technology according to the present disclosure can be applied, for example, to the imaging section 12031 and the like in the configuration explained above. Specifically, the solid-state image pickup apparatus 111 of the present disclosure can be applied to the imaging section 12031. By applying the technology according to the present disclosure to the imaging section 12031, it becomes possible to enhance the yield, and reduce the cost related to manufacturing.

The technology according to the present disclosure can be applied to a solid-state image pickup apparatus like the one above.

Note that the present disclosure can have configurations like the ones below.

<1>

A backside-illumination solid-state image pickup apparatus including:

a first semiconductor element having an image pickup element that generates a pixel signal of each pixel;

a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and a communication wire that electrically connects the second semiconductor element and the third semiconductor element.

<2>

The backside-illumination solid-state image pickup apparatus according to <1>, in which the communication wire is formed in a single layer.

<3>

The backside-illumination solid-state image pickup apparatus according to <1> or <2>, in which the second semiconductor element and the third semiconductor element are stacked on a backside of the first semiconductor element in terms of a direction of incidence of incident light, and the communication wire is formed on a side of the first semiconductor element relative to a boundary between the first semiconductor element, and the second semiconductor element and the third semiconductor element.

<4>

The backside-illumination solid-state image pickup apparatus according to <1> or <2>, in which the second semiconductor element and the third semiconductor element are stacked on a backside of the first semiconductor element in terms of a direction of incidence of incident light, and the communication wire is formed on a side of the second semiconductor element and the third semiconductor element relative to a boundary between the first semiconductor element, and the second semiconductor element and the third semiconductor element.

<5>

The backside-illumination solid-state image pickup apparatus according to <4>, in which the communication wire is formed on surfaces of the second semiconductor element and the third semiconductor element that face the direction of incidence of the incident light.

<6>

The backside-illumination solid-state image pickup apparatus according to <5>, in which surfaces of the second semiconductor element and the third semiconductor element on which a wire is formed are formed on surfaces that face the direction of incidence of the incident light.

<7>

The backside-illumination solid-state image pickup apparatus according to <5>, in which surfaces of the second semiconductor element and the third semiconductor element on which a wire is formed are formed on backsides in terms of the direction of incidence of the incident light.

<8>

The backside-illumination solid-state image pickup apparatus according to <7>, in which
the surfaces of the second semiconductor element and the third semiconductor element on which the wire is formed are formed on the backsides in terms of the direction of incidence of the incident light, and the communication wire is formed via a through-electrode formed through each board.

<9>

The backside-illumination solid-state image pickup apparatus according to <5>, in which
a support board is connected on a side of backsides of the second semiconductor element and the third semiconductor element in terms of the incident light, and
the communication wire is formed in the support board.

<10>

The backside-illumination solid-state image pickup apparatus according to <4>, in which
the communication wire is formed on backsides of the second semiconductor element and the third semiconductor element in terms of the direction of incidence of the incident light.

<11>

The backside-illumination solid-state image pickup apparatus according to <10>, in which
the communication wire is formed on a front side of a support board on a side of the backsides of the second semiconductor element and the third semiconductor element in terms of the direction of incidence of the incident light.

<12>

The backside-illumination solid-state image pickup apparatus according to <4>, in which
the second semiconductor element and the third semiconductor element are electrically connected with the first semiconductor element by a through-electrode that penetrates the first semiconductor element.

<13>

The backside-illumination solid-state image pickup apparatus according to <4>, in which
the first semiconductor element, the second semiconductor element, and the third semiconductor element are stacked in an order of the first semiconductor element, the second semiconductor element, and the third semiconductor element when seen in the direction of incidence of the incident light, and pads that are formed on junction surfaces of the second semiconductor element and the third semiconductor element such that the pads face each other are electrically connected to function as the communication wire.

<14>

The backside-illumination solid-state image pickup apparatus according to <1>, in which
the first semiconductor element, the second semiconductor element, and the third semiconductor element are stacked in an order of the first semiconductor element, the second semiconductor element, and the third semiconductor element when seen in a direction of incidence of incident light, and the first semiconductor element and the third semiconductor element are electrically connected by a through-electrode formed penetrating the second semiconductor element.

<15>

The backside-illumination solid-state image pickup apparatus according to <4>, in which a support board is connected on a side of backsides of the second semiconductor element and the third semiconductor element in terms of the incident light, and
a wire of at least any one of the first semiconductor element, the second semiconductor element, and the third semiconductor element is connected by a through-electrode and is led out to a side of a backside of the support board in terms of the direction of incidence of the incident light.

<16>

The backside-illumination solid-state image pickup apparatus according to <4>, in which
the communication wire is placed in a vertical range occupied by the first semiconductor element in terms of the incident light.

<17>

The backside-illumination solid-state image pickup apparatus according to <3>, in which
a support board is connected on a side of backsides of the second semiconductor element and the third semiconductor element in terms of the incident light, and
a wire is formed in the support board, the wire of the support board and the wire of at least any one of the first semiconductor element, the second semiconductor element, and the third semiconductor element are connected by a through-electrode, and a terminal to lead out a signal line is formed on the support board at a portion outside an area where the second semiconductor element and the third semiconductor element are formed.

<18>

An image pickup apparatus including:
a backside-illumination solid-state image pickup apparatus including
a first semiconductor element having an image pickup element that generates a pixel signal of each pixel,
a second semiconductor element and a third semiconductor element that are smaller than the first semiconductor element, the second semiconductor element and the third semiconductor element having signal processing circuits that are embedded therein by using embedment members and that are necessary for signal processing of the pixel signal, and
a communication wire that electrically connects the second semiconductor element and the third semiconductor element.

<19>

Electronic equipment including:
a backside-illumination solid-state image pickup apparatus including
a first semiconductor element having an image pickup element that generates a pixel signal of each pixel,
a second semiconductor element and a third semiconductor element that are smaller than the first semiconductor element, the second semiconductor element and the third semiconductor element having signal processing circuits that are embedded therein by using embedment members and that are necessary for signal processing of the pixel signal, and
a communication wire that electrically connects the second semiconductor element and the third semiconductor element.

<20>

A method of manufacturing a backside-illumination solid-state image pickup apparatus, the backside-illumination solid-state image pickup apparatus including
a first semiconductor element having an image pickup element that generates a pixel signal of each pixel, a second semiconductor element and a third semiconductor element that are smaller than the first semiconductor element, the second semiconductor element and the third semiconductor element having signal processing circuits that are embedded therein by using embedment members and that are necessary for signal processing of the pixel signal, and a communication wire that electrically connects the second semiconductor element and the third semiconductor element, in which the second semiconductor element and the third semiconductor element with the signal processing circuits that are included in the second semiconductor element and the third semiconductor element formed by a semiconductor process, the second semiconductor element and the third semiconductor element being determined as good elements by an electrical inspection, are re-arranged on a wafer having the image pickup element formed by a semiconductor process and embedded by using the embedment members, a communication wire that electrically connects the second semiconductor element and the third semiconductor element is formed, and the first semiconductor element, the second semiconductor element, and the third semiconductor element are stacked by oxide-film joining such that wires are electrically connected between the first semiconductor element, and the second semiconductor element and the third semiconductor element, and then are diced.

<21>
A backside-illumination solid-state image pickup apparatus including:
a first semiconductor element layer having an image pickup element that generates a pixel signal of each pixel;
a second semiconductor element layer having a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and
a support board, in which
the second semiconductor element layer is provided between the first semiconductor element layer and the support board, and
the first semiconductor element layer and the second semiconductor element layer are joined by direct joining.

<22>
The backside-illumination solid-state image pickup apparatus according to <21>, in which
a communication wire that electrically connects the second semiconductor element and the third semiconductor element is provided in the second semiconductor element layer or the support board.

<23>
The backside-illumination solid-state image pickup apparatus according to <22>, in which
the communication wire is provided on a side of the second semiconductor element layer which is closer to the first semiconductor element layer.

<24>
The backside-illumination solid-state image pickup apparatus according to <22>, in which the communication wire is provided on a side of the second semiconductor element layer which is closer to the support board.

<25>
The backside-illumination solid-state image pickup apparatus according to <22> or <23>, in which
the support board further has a wiring layer on a side closer to the second semiconductor element layer, and
the communication wire is provided in the wiring layer of the support board.

<26>
The backside-illumination solid-state image pickup apparatus according to <22>, in which
the second semiconductor element and the third semiconductor element are stacked on a backside of the first semiconductor element in terms of a direction of incidence of incident light, and
the communication wire is formed on a side of the second semiconductor element and the third semiconductor element relative to a boundary between the first semiconductor element, and the second semiconductor element and the third semiconductor element.

<27>
The backside-illumination solid-state image pickup apparatus according to <26>, in which
the communication wire is formed on surfaces of the second semiconductor element and the third semiconductor element that face the direction of incidence of the incident light.

<28>
The backside-illumination solid-state image pickup apparatus according to <27>, in which
surfaces of the second semiconductor element and the third semiconductor element on which a wire is formed are formed on surfaces that face the direction of incidence of the incident light.

<29>
The backside-illumination solid-state image pickup apparatus according to <27>, in which
surfaces of the second semiconductor element and the third semiconductor element on which a wire is formed are formed on backsides in terms of the direction of incidence of the incident light.

<30>
The backside-illumination solid-state image pickup apparatus according to <29>, in which
the surfaces of the second semiconductor element and the third semiconductor element on which the wire is formed are formed on the backsides in terms of the direction of incidence of the incident light, and the communication wire is formed via a through-electrode formed through each board.

<31>
The backside-illumination solid-state image pickup apparatus according to <27>, in which
a support board is connected on a side of backsides of the second semiconductor element and the third semiconductor element in terms of the incident light, and
the communication wire is formed in the support board.

<32>
The backside-illumination solid-state image pickup apparatus according to <26>, in which
the communication wire is formed on backsides of the second semiconductor element and the third semiconductor element in terms of the direction of incidence of the incident light.

<33>
The backside-illumination solid-state image pickup apparatus according to <32>, in which
the communication wire is formed on a front side of a support board on a side of the backsides of the second semiconductor element and the third semiconductor element in terms of the direction of incidence of the incident light.

REFERENCE SIGNS LIST 101 to 104: Wafer
111: Solid-state image pickup apparatus
120: Solid-state image pickup element
120a: Wire
120b: Pad
121: Memory circuit
121a, 121a-1 to 121a-4, 121a-11 to 121a-14: Wire
121b, 121b-1 to 121b-4, 121b-11 to 121b-14, 121b': Pad
121c, 121c-1 to 121c-4, 121c-11 to 121c-14: Wire
122: Logic circuit
122a, 122a-1 to 122a-4, 122a-11 to 122a-14: Wire
122b, 122b-1 to 122b-4, 122b-11 to 122b-14, 122b': Pad
122d: Through-electrode
131: Pixel (e.g., On-chip lens and on-chip color filter)
132: Support board
132a: Wire
132b: Pad
133: Oxide film
134, 134-1, 134-2, 134A to 134H: Wire
135: Oxide film junction layer
151: Re-arrangement board
152: Adhesive
201: Memory device board
201a: Wire
201b: Pad
201c: Wire
201d: Through-electrode
231: Through-electrode
241: Organic photoelectric conversion film
251, 252: Through-electrode
261: Support board
261a: Wire
261b: Terminal
281: Lens
282: Through-hole
301: Through-electrode
311: Backing board
312: Interference section
371, 381, 391: Through-electrode
T, T'', T''', T1 to T6: Communication wire
TCV1, TCV2: Through-electrode

The invention claimed is:

1. A backside-illumination solid-state image pickup apparatus comprising:
a first semiconductor element having an image pickup element that generates a pixel signal of each pixel;
a second semiconductor element and a third semiconductor element that are smaller than the first semiconductor element, the second semiconductor element and the third semiconductor element having signal processing circuits that are embedded therein by using embedment members and that are necessary for signal processing of the pixel signal; and
a communication wire that electrically connects the second semiconductor element and the third semiconductor element.

2. The backside-illumination solid-state image pickup apparatus according to claim 1, wherein
the communication wire is formed in a single layer.

3. The backside-illumination solid-state image pickup apparatus according to claim 1, wherein
the second semiconductor element and the third semiconductor element are stacked on a backside of the first semiconductor element in terms of a direction of incidence of incident light, and
the communication wire is formed on a side of the first semiconductor element relative to a boundary between the first semiconductor element, the second semiconductor element and the third semiconductor element.

4. The backside-illumination solid-state image pickup apparatus according to claim 1, wherein
the second semiconductor element and the third semiconductor element are stacked on a backside of the first semiconductor element in terms of a direction of incidence of incident light, and
the communication wire is formed on a side of the second semiconductor element and the third semiconductor element relative to a boundary between the first semiconductor element, the second semiconductor element and the third semiconductor element.

5. The backside-illumination solid-state image pickup apparatus according to claim 4, wherein
the communication wire is formed on surfaces of the second semiconductor element and the third semiconductor element that face the direction of incidence of the incident light.

6. The backside-illumination solid-state image pickup apparatus according to claim 5, wherein
surfaces of the second semiconductor element and the third semiconductor element on which a wire is formed are formed on surfaces that face the direction of incidence of the incident light.

7. The backside-illumination solid-state image pickup apparatus according to claim 5, wherein
surfaces of the second semiconductor element and the third semiconductor element on which a wire is formed are formed on backsides in terms of the direction of incidence of the incident light.

8. The backside-illumination solid-state image pickup apparatus according to claim 7, wherein
the surfaces of the second semiconductor element and the third semiconductor element on which the wire is formed are formed on the backsides in terms of the direction of incidence of the incident light, and the communication wire is formed via a through-electrode formed through each board.

9. The backside-illumination solid-state image pickup apparatus according to claim 5, wherein
a support board is connected on a side of backsides of the second semiconductor element and the third semiconductor element in terms of the incident light, and
the communication wire is formed in the support board.

10. The backside-illumination solid-state image pickup apparatus according to claim 4, wherein
the communication wire is formed on backsides of the second semiconductor element and the third semiconductor element in terms of the direction of incidence of the incident light.

11. The backside-illumination solid-state image pickup apparatus according to claim 10, wherein
the communication wire is formed on a front side of a support board on a side of the backsides of the second semiconductor element and the third semiconductor element in terms of the direction of incidence of the incident light.

12. The backside-illumination solid-state image pickup apparatus according to claim 4, wherein
the second semiconductor element and the third semiconductor element are electrically connected with the first semiconductor element by a through-electrode that penetrates the first semiconductor element.

13. The backside-illumination solid-state image pickup apparatus according to claim 4, wherein
the first semiconductor element, the second semiconductor element, and the third semiconductor element are stacked in an order of the first semiconductor element, the second semiconductor element, and the third semiconductor element when seen in the direction of incidence of the incident light, and pads that are formed on junction surfaces of the second semiconductor element and the third semiconductor element such that the pads face each other are electrically connected to function as the communication wire.

14. The backside-illumination solid-state image pickup apparatus according to claim 1, wherein
the first semiconductor element, the second semiconductor element, and the third semiconductor element are stacked in an order of the first semiconductor element, the second semiconductor element, and the third semiconductor element when seen in a direction of incidence of incident light, and at least the second semiconductor element and the third semiconductor element are electrically connected by a through-electrode and function as a communication wire.

15. The backside-illumination solid-state image pickup apparatus according to claim 4, wherein
a support board is connected on a side of backsides of the second semiconductor element and the third semiconductor element in terms of the incident light, and
a wire of at least any one of the first semiconductor element, the second semiconductor element, and the third semiconductor element is connected by a through-electrode and is led out to a side of a backside of the support board in terms of the direction of incidence of the incident light.

16. The backside-illumination solid-state image pickup apparatus according to claim 4, wherein
the communication wire is placed in a vertical range occupied by the first semiconductor element in terms of the incident light.

17. The backside-illumination solid-state image pickup apparatus according to claim 3, wherein
a support board is connected on a side of backsides of the second semiconductor element and the third semiconductor element in terms of the incident light, and
a wire is formed in the support board, the wire of the support board and the wire of at least any one of the first semiconductor element, the second semiconductor element, and the third semiconductor element are connected by a through-electrode, and a terminal to lead out a signal line is formed on the support board at a portion outside an area where the second semiconductor element and the third semiconductor element are formed.

18. An image pickup apparatus comprising:
a backside-illumination solid-state image pickup apparatus including
a first semiconductor element having an image pickup element that generates a pixel signal of each pixel,
a second semiconductor element and a third semiconductor element that are smaller than the first semiconductor element, the second semiconductor element and the third semiconductor element having signal processing circuits that are embedded therein by using embedment members and that are necessary for signal processing of the pixel signal, and
a communication wire that electrically connects the second semiconductor element and the third semiconductor element.

19. Electronic equipment comprising:
a backside-illumination solid-state image pickup apparatus including
a first semiconductor element having an image pickup element that generates a pixel signal of each pixel,
a second semiconductor element and a third semiconductor element that are smaller than the first semiconductor element, the second semiconductor element and the third semiconductor element having signal processing circuits that are embedded therein by using embedment members and that are necessary for signal processing of the pixel signal, and
a communication wire that electrically connects the second semiconductor element and the third semiconductor element.

20. A backside-illumination solid-state image pickup apparatus comprising:
a first semiconductor element layer having an image pickup element that generates a pixel signal of each pixel;
a second semiconductor element layer having a second semiconductor element and a third semiconductor element that are smaller than a first semiconductor element, the second semiconductor element and the third semiconductor element having signal processing circuits that are embedded therein by using embedment members and that are necessary for signal processing of the pixel signal; and
a support board, wherein
the second semiconductor element layer is provided between the first semiconductor element layer and the support board, and
the first semiconductor element layer and the second semiconductor element layer are joined by direct joining.

21. The backside-illumination solid-state image pickup apparatus according to claim 20, wherein
a communication wire that electrically connects the second semiconductor element and the third semiconductor element is provided in the second semiconductor element layer or the support board.

22. The backside-illumination solid-state image pickup apparatus according to claim 21, wherein
the communication wire is provided on a side of the second semiconductor element layer which is closer to the first semiconductor element layer.

23. The backside-illumination solid-state image pickup apparatus according to claim 21, wherein
the communication wire is provided on a side of the second semiconductor element layer which is closer to the support board.

24. The backside-illumination solid-state image pickup apparatus according to claim 21, wherein
the support board further has a wiring layer on a side closer to the second semiconductor element layer, and
the communication wire is provided in the wiring layer of the support board.

25. The backside-illumination solid-state image pickup apparatus according to claim 21, wherein
the second semiconductor element and the third semiconductor element are stacked on a backside of the first semiconductor element in terms of a direction of incidence of incident light, and
the communication wire is formed on a side of the second semiconductor element and the third semiconductor element relative to a boundary between the first semiconductor element, and the second semiconductor element and the third semiconductor element.

26. The backside-illumination solid-state image pickup apparatus according to claim 25, wherein
the communication wire is formed on surfaces of the second semiconductor element and the third semiconductor element that face the direction of incidence of the incident light.

27. The backside-illumination solid-state image pickup apparatus according to claim 26, wherein
surfaces of the second semiconductor element and the third semiconductor element on which a wire is formed are formed on surfaces that face the direction of incidence of the incident light.

28. The backside-illumination solid-state image pickup apparatus according to claim 26, wherein
surfaces of the second semiconductor element and the third semiconductor element on which a wire is formed are formed on backsides in terms of the direction of incidence of the incident light.

29. The backside-illumination solid-state image pickup apparatus according to claim 28, wherein
the surfaces of the second semiconductor element and the third semiconductor element on which the wire is formed are formed on the backsides in terms of the direction of incidence of the incident light, and the communication wire is formed via a through-electrode formed through each board.

30. The backside-illumination solid-state image pickup apparatus according to claim 26, wherein
a support board is connected on a side of backsides of the second semiconductor element and the third semiconductor element in terms of the incident light, and
the communication wire is formed in the support board.

31. The backside-illumination solid-state image pickup apparatus according to claim 25, wherein
the communication wire is formed on backsides of the second semiconductor element and the third semiconductor element in terms of the direction of incidence of the incident light.

32. The backside-illumination solid-state image pickup apparatus according to claim 31, wherein
the communication wire is formed on a front side of a support board on a side of the backsides of the second semiconductor element and the third semiconductor element in terms of the direction of incidence of the incident light.

* * * * *